US 9,905,768 B2
Feb. 27, 2018

(12) United States Patent
Nagata et al.

(10) Patent No.: US 9,905,768 B2
(45) Date of Patent: Feb. 27, 2018

(54) SEMICONDUCTOR DEVICE AND INSULATING LAYER-FORMING COMPOSITION

(71) Applicant: FUJIFILM Corporation, Tokyo (JP)

(72) Inventors: Yuzo Nagata, Kanagawa (JP); Hiroo Takizawa, Kanagawa (JP); Satoru Yamada, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/340,831

(22) Filed: Nov. 1, 2016

(65) Prior Publication Data
US 2017/0054076 A1 Feb. 23, 2017

Related U.S. Application Data

(63) Continuation of application No. PCT/JP2015/062066, filed on Apr. 21, 2015.

(30) Foreign Application Priority Data

May 8, 2014 (JP) .................................. 2014-097186

(51) Int. Cl.
*H01L 51/00* (2006.01)
*H01L 51/05* (2006.01)
(Continued)

(52) U.S. Cl.
CPC .......... *H01L 51/004* (2013.01); *C08F 220/06* (2013.01); *C08F 220/18* (2013.01);
(Continued)

(58) Field of Classification Search
CPC ............... H01L 51/004; H01L 51/0071; H01L 51/0094; H01L 51/052; H01L 51/0545; H01L 51/0566
See application file for complete search history.

(56) References Cited

U.S. PATENT DOCUMENTS

| 2012/0056183 A1* | 3/2012 | Mueller | ................ | C08F 232/00 |
| | | | | 257/57 |
| 2014/0070205 A1* | 3/2014 | Yahagi | .................... | C08F 12/22 |
| | | | | 257/40 |
| 2015/0118623 A1* | 4/2015 | Tsuruta | ..................... | C08F 8/02 |
| | | | | 430/286.1 |

FOREIGN PATENT DOCUMENTS

JP 2012-195580 A 10/2012
JP 2013-102116 A 5/2013
(Continued)

OTHER PUBLICATIONS

International Search Report issued in PCT/JP2015/062066; dated Jul. 7, 2015.
(Continued)

*Primary Examiner* — Christine Enad
(74) *Attorney, Agent, or Firm* — Studebaker & Brackett PC

(57) ABSTRACT

Provided is a semiconductor device which includes a semiconductor layer and an insulating layer adjacent to the semiconductor layer, in which the insulating layer is formed of a crosslinked product of a polymer compound that has a repeating unit (IA) represented by the following Formula (IA) and a repeating unit (IB) represented by the following Formula (IB); and an insulating layer-forming composition which is used for forming an insulating layer of a semiconductor device and contains a polymer compound that has the following repeating units (IA) and (IB).

Formula (IA)

$$*\!\!-\!\!\underset{\underset{(L^{2a}-(X)_{m2a})_{m1a}}{\overset{|}{L^{1a}}}}{\overset{R^{1a}}{\underset{|}{C}}}\!\!-\!\!*$$

(Continued)

-continued

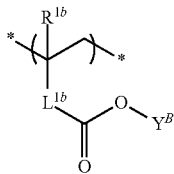

Formula (IB)

In Formulae, $R^{1a}$ and $R^{1b}$ each independently represent a hydrogen atom, a halogen atom, or an alkyl group. $L^{1a}$, $L^{2a}$, and $L^{1b}$ each independently represent a single bond or a linking group. X represents a crosslinkable group and $Y^B$ represents a decomposable group or a hydrogen atom. m1a and m2a each independently represent an integer of 1 to 5. The symbol "*" represents a bonding position of the repeating units.

9 Claims, 1 Drawing Sheet

(51) Int. Cl.
*C08F 220/06* (2006.01)
*C08F 220/18* (2006.01)
*C08F 220/28* (2006.01)
*C08F 220/32* (2006.01)

(52) U.S. Cl.
CPC .......... *C08F 220/28* (2013.01); *C08F 220/32* (2013.01); *H01L 51/0043* (2013.01); *C08F 2220/285* (2013.01); *H01L 51/052* (2013.01); *H01L 51/0545* (2013.01)

(56) References Cited

FOREIGN PATENT DOCUMENTS

| | | | |
|---|---|---|---|
| JP | 2013-210616 A | 10/2013 | |
| JP | 2014-039010 A | 2/2014 | |
| WO | WO 2014017268 A1 * | 1/2014 | ............ C08F 212/14 |

OTHER PUBLICATIONS

The extended European search report issued by the European Patent Office dated Apr. 24, 2017, which corresponds to European Patent Application No. 15788651.6-1377 and is related to U.S. Appl. No. 15/340,831; Including Information on Search Strategy.

Okada, Yoshihiro; "Manufacture of electromagnetic wave detection element with TFT", Database CA; Chemical Abstracts Service, Columbus, Ohio, US; AN 2009:974239; XP-002766475; 2pp.

* cited by examiner

SEMICONDUCTOR DEVICE AND INSULATING LAYER-FORMING COMPOSITION

CROSS-REFERENCE TO RELATED APPLICATIONS

This application is a Continuation of PCT International Application No. PCT/JP2015/062066 filed on Apr. 21, 2015, which claims priority under 35 U.S.C. § 119 (a) to Japanese Patent Application No. JP2014-097186 filed in Japan on May 8, 2014. Each of the above applications is hereby expressly incorporated by reference, in its entirety, into the present application.

BACKGROUND OF THE INVENTION

1. Field of the Invention

The present invention relates to a semiconductor device and an insulating layer-forming composition.

2. Description of the Related Art

Display devices such as a liquid crystal display, an organic EL display, and an electrophoretic display include a semiconductor device such as a thin-film transistor (hereinafter, referred to as a "TFT").

A TFT includes a gate electrode, a gate insulating layer, a source electrode, and a drain electrode and has a structure in which the source electrode and the drain electrode are connected to each other through a semiconductor layer. In the TFT, if a voltage is applied to the gate electrode, a channel of a current is formed on the interface between the semiconductor layer between the source electrode and the drain electrode and the gate insulating layer adjacent to the semiconductor layer. That is, the current flowing between the source electrode and the drain electrode is controlled in response to an input voltage applied to the gate electrode.

The gate insulating layer provided adjacent to the semiconductor layer as described above has a function of forming a channel of the current together with the semiconductor layer. Therefore, in order to improve the performance of the TFT, a gate insulating layer (simply referred to as an insulating layer) and a material that forms the gate insulating layer are important.

For example, JP2013-102116A discloses an organic thin film transistor insulating layer material that includes a polymer compound containing a repeating unit having a cyclic ether structure and a repeating unit substituted with an organic group in which a hydroxyl group of vinyl phenol is released by an acid.

An insulating layer and a material that forms the insulating layer being important for improving performance of a TFT as described above is the same in cases other than the TFT without being limited to the TFT as long as a semiconductor device has an insulating layer provided adjacent to a semiconductor layer.

SUMMARY OF THE INVENTION

However, even when a gate insulating layer is formed of the organic thin film transistor insulating layer material described in JP2013-102116A, the characteristics of the organic thin film transistor are still not sufficient and there is room for improvement for carrier mobility and the on/off ratio.

An object of the present invention is to provide a semiconductor device which has high carrier mobility and exhibits an excellent on/off ratio.

Further, another object thereof is to provide an insulating layer-forming composition which has excellent solvent resistance and surface smoothness and is capable of forming an insulating layer having excellent insulating properties.

In regard to a polymer compound including a specific repeating unit that has a carboxy group or is capable of forming a carboxy group and a specific repeating unit that has a crosslinkable group causing a crosslinking reaction with the repeating unit, the present inventors have found that an insulating layer having a smooth surface and exhibiting excellent solvent resistance and insulating properties can be formed by causing a crosslinking reaction between these repeating units to obtain a crosslinked product. Further, the present inventors have found that a composition containing the polymer compound is excellent as a composition which forms an insulating layer of a TFT having excellent solvent resistance, surface smoothness, and insulating properties. Moreover, the present inventors have found that a TFT having a gate insulating layer formed of the crosslinked product of the polymer compound exhibits high carrier mobility and an excellent on/off ratio. The present invention was completed based on these findings.

The above-described objects are achieved by the following means.

[1] A semiconductor device comprising: a semiconductor layer; and an insulating layer which is adjacent to the semiconductor layer, in which the insulating layer is formed of a crosslinked product of a polymer compound that has a repeating unit (IA) represented by the following Formula (IA) and a repeating unit (IB) represented by the following Formula (IB).

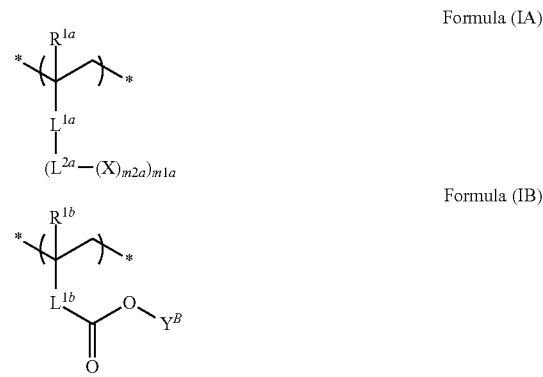

In Formula (IA), $R^{1a}$ represents a hydrogen atom, a halogen atom, or an alkyl group. $L^{1a}$ and $L^{2a}$ each independently represent a single bond or a linking group. X represents a crosslinkable group. m2a represents an integer of 1 to 5 and m2a X's may be the same as or different from each other in a case where m2a represents 2 or greater. m1a represents an integer of 1 to 5 and m1a (-$L^{2a}$-(X)m2a)'s may be the same as or different from each other in a case where m1a represents 2 or greater.

In Formula (IB), $R^{1b}$ represents a hydrogen atom, a halogen atom, or an alkyl group. $L^{1b}$ represents a single bond or a linking group. $Y^B$ represents a decomposable group or a hydrogen atom.

The symbol "*" represents a bonding position of the repeating units.

[2] The semiconductor device according to [1], in which the repeating unit (IA) is a repeating unit (IA-1) represented by the following Formula (IA-1).

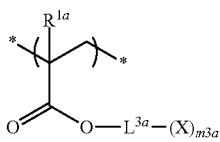

Formula (IA-1)

In Formula (IA-1), $R^{1a}$ represents a hydrogen atom, a halogen atom, or an alkyl group. $L^{3a}$ represents a single bond or a linking group. X represents a crosslinkable group. m3a represents an integer of 1 to 5 and m3a X's may be the same as or different from each other in a case where m3a represents 2 or greater. The symbol "*" represents a bonding position of the repeating units.

[3] The semiconductor device according to [1], in which the repeating unit (IA) is a repeating unit (IA-2) represented by the following Formula (IA-2).

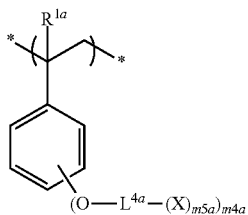

Formula (IA-2)

In Formula (IA-2), $R^{1a}$ represents a hydrogen atom, a halogen atom, or an alkyl group. $L^{4a}$ represents a single bond or a linking group. X represents a crosslinkable group. m5a represents an integer of 1 to 5 and m5a X's may be the same as or different from each other in a case where m5a represents 2 or greater. m4a represents an integer of 1 to 5 and m4a (—O-$L^{4a}$-(X)m5a)'s may be the same as or different from each other in a case where m4a represents 2 or greater. The symbol "*" represents a bonding position of the repeating units.

[4] The semiconductor device according to any one of [1] to [3], in which X represents an epoxy group, an oxetanyl group, a hydroxymethyl group, an alkoxymethyl group, a (meth)acryloyl group, a styryl group, or a vinyl group.

[5] The semiconductor device according to any one of [1] to [4], in which X represents an epoxy group or an oxetanyl group.

[6] The semiconductor device according to any one of [1] to [5], in which $Y^B$ represents a decomposable group.

[7] The semiconductor device according to any one of [1] to [6], in which the repeating unit (IB) is a repeating unit (IB-1) represented by the following Formula (IB-1).

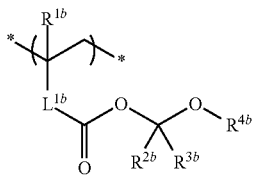

Formula (IB-1)

In Formula (IB-1), $R^{1b}$ represents a hydrogen atom, a halogen atom, or an alkyl group. $L^{1b}$ represents a single bond or a linking group. $R^{2b}$ and $R^{4b}$ each independently represent a monovalent organic group and $R^{3b}$ represents a hydrogen atom or a monovalent organic group. The symbol "*" represents a bonding position of the repeating units.

[8] The semiconductor device according to any one of [1] to [7], in which the repeating unit (IB) is a repeating unit (IB-2) represented by the following Formula (IB-2).

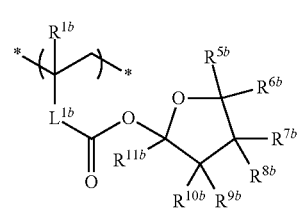

Formula (IB-2)

In Formula (IB-2), $R^{1b}$ represents a hydrogen atom, a halogen atom, or an alkyl group. $L^{1b}$ represents a single bond or a linking group. $R^{5b}$ to $R^{11b}$ each independently represent a hydrogen atom or a monovalent organic group. The symbol "*" represents a bonding position of the repeating units.

[9] The semiconductor device according to any one of [1] to [8], in which $L^{1b}$ represents a single bond.

[10] The semiconductor device according to any one of [1] to [9], in which the semiconductor layer contains an organic semiconductor.

[11] An insulating layer-forming composition which is used for forming an insulating layer of a semiconductor device, the composition comprising: a polymer compound that has a repeating unit (IA) represented by the following Formula (IA) and a repeating unit (IB) represented by the following Formula (IB).

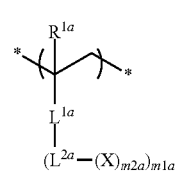

Formula (IA)

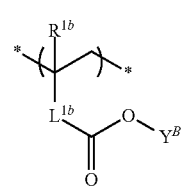

Formula (IB)

In Formula (IA), $R^{1a}$ represents a hydrogen atom, a halogen atom, or an alkyl group. $L^{1a}$ and $L^{2a}$ each independently represent a single bond or a linking group. X represents a crosslinkable group. m2a represents an integer of 1 to 5 and m2a X's may be the same as or different from each other in a case where m2a represents 2 or greater. m1a represents an integer of 1 to 5 and m1a (-$L^{2a}$-(X)m2a)'s may be the same as or different from each other in a case where m1a represents 2 or greater.

In Formula (IB), $R^{1b}$ represents a hydrogen atom, a halogen atom, or an alkyl group and $L^{1b}$ represents a single bond or a linking group. $Y^B$ represents a decomposable group or a hydrogen atom.

The symbol "*" represents a bonding position of the repeating units.

In the present specification, when a plurality of substituents or linking groups (hereinafter, referred to as substituents or the like) shown by specific symbols are present or a plurality of substituents are defined simultaneously, this means that the respective substituents may be the same as or different from each other. The same applies to the definition of the number of substituents or the like. Moreover, in a case where there is a repetition of a plurality of partial structures which are shown in the same manner in the formula, the respective partial structures or repeating units may be the same as or different from each other. In addition, even in a case where not specifically stated, when a plurality of substituents or the like are close (particularly, adjacent) to each other, they may be condensed or linked to each other and form a ring.

In regard to compounds described in the present specification, the description includes salts thereof and ions thereof in addition to the compounds. Further, the description includes partially changed structures within the range in which desired effects are obtained.

In the present specification, groups (the same applies to linking groups) in which substitution or non-substitution is not specified may include optional substituents on the group within the range in which desired effects are exhibited. The same applies to compounds in which substitution or non-substitution is not specified.

In the present specification, the numerical ranges shown using "to" indicate ranges including the numerical values described before and after "to" as the lower limits and the upper limits.

The organic element of the present invention has high carrier mobility and an excellent on/off ratio.

Further, the insulating layer-forming composition of the present invention is capable of forming an insulating layer having excellent solvent resistance, surface smoothness, and insulating properties. Particularly, the insulating layer-forming composition is suitable for forming an insulating layer of an organic thin film transistor.

The above-described and other features and advantages of the present invention will become apparent from the description below with reference to the accompanying drawings.

DESCRIPTION OF THE PREFERRED EMBODIMENTS

Semiconductor Device

Figure 1A:
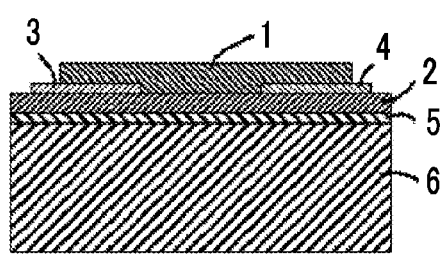
FIGS. 1A to 1D are views schematically illustrating an embodiment of an organic thin film transistor which is an example of a semiconductor device of the present invention.

A semiconductor device of the present invention is not particularly limited as long as the element has a semiconductor layer and an insulating layer adjacent to the semiconductor layer, but a TFT is preferable from the viewpoint of an effect of improving carrier mobility and the on/off ratio and an organic thin film transistor (referred to as an OTFT) formed of an organic material is particularly preferable.

Hereinafter, a TFT will be described as a preferred semiconductor device of the present invention, but the semiconductor device of the present invention is not limited thereto.

The TFT of the present invention includes, on a substrate, a gate electrode; a semiconductor layer; a gate insulating layer provided between the gate electrode and the semiconductor layer; and a source electrode and a drain electrode which are provided in contact with the semiconductor layer and connected to each other through the semiconductor layer. In the TFT, the semiconductor layer and the gate insulating layer are typically provided adjacent to each other. In such a TFT, the current flowing between the source electrode and the drain electrode is controlled as described above.

Preferred embodiments of the TFT according to the present invention will be described with reference to the accompanying drawings. The respective drawings illustrating the TFT are schematic views for facilitating understanding the present invention, and the size or the relative magnitude relation of each member is occasionally changed for the sake of convenience. Each member is not illustrated in actual scale. Moreover, the present invention is not limited to the outer shapes or shapes illustrated in the figures except definitions described in the present invention. For example, in FIGS. 1A and 1B, a gate electrode 5 does not necessarily cover the entire substrate 6 and an embodiment in which the gate electrode 5 is provided in the central portion of the substrate 6 is also preferable as an embodiment of the TFT of the present invention.

FIGS. 1A to 1D are respectively longitudinal sectional views schematically illustrating the TFT according to preferred exemplary embodiments of the present invention. In FIGS. 1A to 1D, the reference numeral 1 indicates a semiconductor layer, the reference numeral 2 indicates a gate insulating layer, the reference numeral 3 indicates a source electrode, the reference numeral 4 indicates a drain electrode, the reference numeral 5 indicates a gate electrode, and the reference numeral 6 indicates a substrate.

Figure 1B:
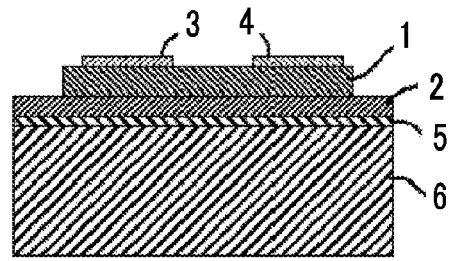
Figure 1C:
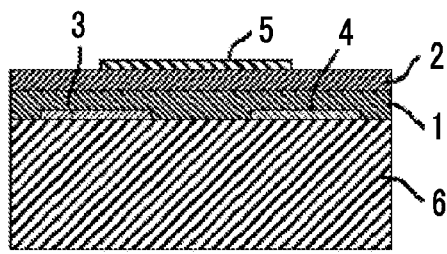
Figure 1D:
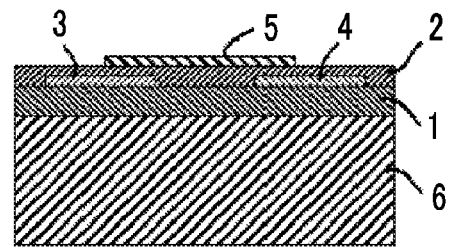

Further, FIG. 1A illustrates a bottom-gate bottom-contact type TFT, FIG. 1B illustrates a bottom-gate top-contact type TFT, FIG. 1C illustrates a top-gate bottom-contact type TFT, and FIG. 1D illustrates a top-gate top-contact type TFT.

The TFT of the present invention has all of the above-described four types. Although not illustrated, an overcoat layer is formed on the uppermost portion (the uppermost portion on a side opposite to the substrate 6) of each TFT in the figures in some cases.

A bottom-gate type TFT is a TFT in which the gate electrode 5, the gate insulating layer 2, and the semiconductor layer 1 are disposed on the substrate 6 in this order. Meanwhile, a top-gate type TFT is a TFT in which the semiconductor layer 1, the gate insulating layer 2, and the gate electrode 5 are disposed on the substrate 6 in this order.

Moreover, a bottom-contact type TFT is a TFT in which the source electrode 3 and the drain electrode 4 are disposed on the substrate 6 side (that is, in the lower portion of FIGS. 1A to 1D) with respect to the semiconductor layer 1. Meanwhile, a top-contact type TFT is a TFT in which the source electrode 3 and the drain electrode 4 are disposed on the side opposite to the substrate 6 with respect to the semiconductor layer 1.

Particularly, in a case where the semiconductor layer 1, the gate insulating layer 2, and the like are formed of an organic material, the TFT is referred to as an OTFT. In this case, a semiconductor layer formed of an organic material is also referred to as an organic semiconductor layer.

[Substrate]

A substrate which is capable of supporting the TFT and a display panel or the like prepared on the TFT may be used. The substrate is not particularly limited as long as the substrate has a sheet shape and the surface thereof is insulating and flat.

An inorganic material may be used as the material of the substrate. Examples of the substrate formed of an inorganic material include various glass substrates such as soda-lime glass and quartz glass, various glass substrates having an insulating film formed on the surface thereof, a silicon substrate having an insulating film formed on the surface thereof, a sapphire substrate, metal substrates made of various alloys or various metals such as stainless steel, aluminum, and nickel, metal foil, and paper.

In a case where the substrate is formed of a semiconductive material or a conductive material such as a stainless sheet, aluminum foil, copper foil, or a silicon wafer, the surface thereof is typically coated with or laminated with an insulating polymer material or a metal oxide for use.

Moreover, an organic material may also be used as the material of the substrate. Examples thereof include a plastic substrate (also referred to as a plastic film or a plastic sheet) which has flexibility and is formed of an organic polymer such as polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN), polyethyl ether ketone, polyolefin, or polycycloolefin. Further, a material formed from mica can be also exemplified.

When such a plastic substrate or the like having flexibility is used, incorporation or integration of the TFT into/with a display device or an electronic device having a curved shape becomes possible.

Since an organic material that forms the substrate is unlikely to be softened at the time of lamination on another layer or being heated, it is preferable that the glass transition point thereof is high, for example, 40° C. or higher. Moreover, in terms that dimensional change resulting from a heat treatment at the time of production is unlikely to occur and stability of transistor performance is excellent, it is preferable that the linear expansion coefficient is small. For example, a material having a linear expansion coefficiency of $25 \times 10^{-5}$ cm/cm·° C. or less is preferable and a material having a linear expansion coefficiency of $10 \times 10^{-5}$ cm/cm·° C. or less is more preferable.

Further, as the organic material constituting the substrate, a material having resistance to a solvent used when the TFT is manufactured is preferable and a material having excellent adhesiveness to a gate insulating layer and an electrode is preferable.

Moreover, it is preferable to use a plastic substrate formed of an organic polymer having excellent gas barrier properties.

It is also preferable that a dense silicon oxide film or the like is provided on at least one surface of the substrate or an inorganic material is deposited or laminated on at least one surface of the substrate.

Other examples of the substrate include conductive substrates (for example, a substrate formed of a metal such gold or aluminum, a substrate formed of highly oriented graphite, or stainless steel substrate).

A buffer layer used to improve the adhesiveness or flatness, a functional film such as a barrier film used to improve gas barrier properties, or a surface treatment layer such as an easily adhesive layer may be formed on the surface of the substrate or the substrate may be subjected to a surface treatment such as a corona treatment, a plasma treatment, or UV/ozone treatment.

The thickness of the substrate is preferably 10 mm or less, more preferably 2 mm or less, and particularly preferably 1 mm or less. Further, the thickness thereof is preferably 0.01 mm or greater and more preferably 0.05 mm or greater. Particularly, in a case of a plastic substrate, the thickness thereof is preferably in a range of 0.05 mm to 0.1 mm.

Moreover, in a case of a substrate formed of an inorganic material, the thickness thereof is preferably in a range of 0.1 mm to 10 mm.

[Gate Electrode]

A known electrode of the related art being used as a gate electrode of a TFT can be used as the gate electrode. A conductive material (also referred to as an electrode material) constituting the gate electrode is not particularly limited. Examples thereof include metals such as platinum, gold, silver, aluminum, chromium, nickel, copper, molybdenum, titanium, magnesium, calcium, barium, sodium, palladium, iron, and manganese; conductive metal oxides such as $InO_2$, $SnO_2$, indium-tin oxide (ITO), fluorine-doped tin oxide (FTO), aluminum-doped zinc oxide (AZO), and gallium-doped zinc oxide (GZO); conductive polymers such as polyaniline, polypyrrole, polythiophene, polyacetylene, and poly(3,4-ethylenedioxythiophene)/polystyrene sulfonic acid (PEDOT/PSS); and conductive composite materials obtained by dispersing the above-described conductive polymer to which a dopant, for example, an acid such as hydrochloric acid, sulfuric acid, or sulfonic acid, Lewis acid such as $PF_6$, $AsF_5$, or $FeCl_3$, a halogen atom such as iodine, or a metal atom such as sodium or potassium is added, carbon black, graphite powder, or metal fine particles therein. These materials may be used alone or in combination of optional two or more kinds thereof at an optional ratio.

In addition, the gate electrode may be configured of a single layer or two or more layers being laminated, formed of the above-described conductive materials.

A method of forming the gate electrode is not limited. Examples thereof include a method of patterning a film, formed using a physical vapor deposition (PVD) method such as a vacuum vapor deposition method, a chemical vapor deposition method (CVD method), a sputtering method, a printing method (coating method), a transfer method, a sol-gel method, or a plating method, in a desired shape as needed.

According to the coating method, a film is formed or an electrode is directly formed by preparing, applying, drying, baking, photocuring, or aging a solution, paste, or a dispersion liquid of the above-described material.

Moreover, from the viewpoints of capability of desired patterning, simplifying the processes, cost reduction, and speeding up, it is preferable to use ink jet printing, screen printing, (inversion) offset printing, relief printing, intaglio printing, planographic printing, thermal transfer printing, or a microcontact printing method.

In a case where a spin coating method, a die-coating method, a micro gravure coating method, or a dip coating method is employed, patterning can be carried out by combining any of these method and the following photolithographic method.

As the photolithographic method, a method of combining patterning of a photoresist, etching, for example, wet etching using an etching solution or dry etching using a reactive plasma, and a lift-off method may be exemplified.

As another patterning method, a method of irradiating the above-described materials with energy rays such as laser or electron beams and polishing the materials so that the conductivity of the material is changed may be exemplified.

In addition, a method of transferring a composition for a gate electrode which is printed on a support other than a substrate onto an underlayer such as the substrate may be exemplified.

The thickness of the gate electrode is optional, but is preferably 1 nm or greater and particularly preferably 10 nm or greater. Further, the thickness thereof is preferably 500 nm or less and particularly preferably 200 nm or less.

[Gate Insulating Layer]

The gate insulating layer is not particularly limited as long as the layer has insulating properties and the gate insulating layer may be formed of a single layer or multiple layers.

<Crosslinked Product of Polymer Compound>

The gate insulating layer is formed of a crosslinked product of a polymer compound that has a repeating unit (IA) represented by the following Formula (IA) and a repeating unit (IB) represented by the following Formula (IB).

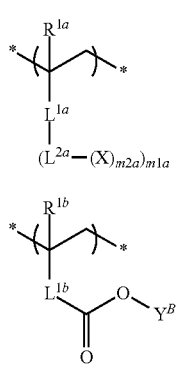

Formula (IA)

Formula (IB)

In Formula (IA), $R^{1a}$ represents a hydrogen atom, a halogen atom, or an alkyl group. $L^{1a}$ and $L^{2a}$ each independently represent a single bond or a linking group. X represents a crosslinkable group. m2a represents an integer of 1 to 5 and m2a X's may be the same as or different from each other in a case where m2a represents 2 or greater. m1a represents an integer of 1 to 5 and m1a (-$L^{2a}$-(X)m2a)'s may be the same as or different from each other in a case where m1a represents 2 or greater.

In Formula (IB), $R^{1b}$ represents a hydrogen atom, a halogen atom, or an alkyl group. $L^{1b}$ represents a single bond or a linking group. $Y^B$ represents a decomposable group or a hydrogen atom.

The symbol "*" represents a bonding position of the repeating units.

A crosslinking reaction of the polymer compound is not particularly limited. For example, a crosslinking reaction may occur between repeating units of the polymer compound or a crosslinking reaction may occur between a repeating unit and a crosslinking agent which may coexist. In the present invention, a crosslinking reaction occurring between the repeating unit (IA) and the repeating unit (IB) is preferable from the viewpoint of the characteristics of the TFT. Therefore, a crosslinked product of a polymer compound, which is formed by crosslinking the repeating unit (IA) and the repeating unit (IB) is preferable.

A crosslinked portion in a crosslinked product is not uniquely determined by repeating units or the crosslinkable group X. As the crosslinked portion, a crosslinked portion formed by reacting the crosslinkable group X of the repeating unit (IA) with the carboxy group of the repeating unit (IB) is preferable.

As the crosslinking reaction between repeating units, a crosslinking reaction between molecules is preferable, but a part of the crosslinking reaction may occur in molecules.

When the gate insulating layer is formed using a crosslinked product of the polymer compound, the surface thereof becomes smooth. The reason why the surface becomes smooth is not clear, but it is considered that hydrophobicity of the polymer compound becomes high due to the repeating unit (IA) and the repeating unit (IB) so that the cohesive energy decreases. Particularly, the cohesive energy is considered to decrease when the repeating unit (IB) has a decomposable group $Y^B$ in a carboxy group. Even when the decomposable group $Y^B$ is a hydrogen atom, the cohesive energy is considered to decrease due to hydrophobicity of the repeating unit (IA) represented by the above-described Formula (IA). Further, in regard to protection of the carboxy group of the repeating unit (IB), the temporal stability of the polymer compound is occasionally degraded due to a combination with a crosslinkable group X, but the crosslinking reaction over time is suppressed when the carboxy group has the decomposable group $Y^B$ and thus the stability at the time of application is improved, and it is considered that this leads to the smoothness of the surface. When the surface of the gate insulating film becomes smooth, semiconductors provided adjacent thereto are easily and uniformly aligned and a carrier path is efficiently formed. Consequently, the carrier mobility of the TFT is considered to be higher.

Moreover, the TFT which includes a gate insulating layer formed of a crosslinked product of the polymer compound has excellent characteristics because the on/off ratio thereof becomes high. The details thereof are not clear, but considered as follows. When the crosslinkable group X causing a crosslinking reaction and a —C(=O)—O— group are respectively supported by and introduced into the repeating unit (IA) and the repeating unit (IB), the efficiency of the crosslinking reaction between the repeating units is improved. In this manner, the quality of the gate insulating layer is improved and inter-layer mixing between the gate insulating layer and the semiconductor layer is suppressed. Further, the insulating performance is improved. As a result, it is considered that the on/off ratio of the TFT is increased.

It is preferable that the crosslinking reaction of the polymer compound is made by reacting the repeating unit (IA) with the repeating unit (IB) using an acid, heat, or an acid and heat. At this time, in a case where the repeating unit (IB) has the decomposable group $Y^B$, it is preferable that the decomposable group $Y^B$ is decomposed or dissociated (deprotected).

In order to promote the crosslinking reaction of the polymer compound and the decomposition of the decomposable group $Y^B$, for example, a thermal acid generator described below may be used.

The content of the crosslinked product of the polymer compound in the insulating layer is not particularly limited as long as the insulating layer can be formed. From the viewpoints of the carrier mobility and the on/off ratio, the content thereof is preferably in a range of 60 to 100% by mass, more preferably in a range of 80 to 100% by mass, and particularly preferably in a range of 80 to 95% by mass with respect to the solid content of the insulating layer.

The gate insulating layer contains one or two or more kinds of crosslinked products of the polymer compound.

The gate insulating layer may contain one or two or more kinds of the above-described polymer compounds which are not crosslinked, in addition to the crosslinked products of the polymer compound.

<Repeating Unit (IA)>

The repeating unit (IA) that forms a polymer compound will be described.

The alkyl group of $R^{1a}$ is not particularly limited, but an alkyl group having 1 to 6 carbon atoms is preferable, an alkyl group having 1 to 4 carbon atoms is more preferable, a methyl group or an ethyl group is still more preferable, and a methyl group is particularly preferable. Examples of a substituent which may be included in the alkyl group include the following substituents T.

Examples of the halogen atom include a fluorine atom, a chlorine atom, and a bromine atom. Among these, a fluorine atom or a chlorine atom is preferable.

It is particularly preferable that $R^{1a}$ represents a hydrogen atom or a methyl group.

$L^{1a}$ represents a single bond or a linking group. Among these, a linking group is preferable and a divalent linking group is more preferable.

The linking group is not particularly limited, and preferred examples thereof include a carbonyl group, a thiocarbonyl group, an alkylene group (the number of carbon atoms is preferably in a range of 1 to 10 and more preferably in a range of 1 to 5), an aromatic ring group, an aliphatic ring group, a —O— group, a sulfonyl group, a —NH— group, and a group obtained by combining these (the total number of carbon atoms is preferably in a range of 1 to 20 and more preferably in a range of 1 to 10).

The aromatic ring group may be an aromatic hydrocarbon ring group or an aromatic heterocyclic group. Further, the aromatic ring group may be monocyclic or polycyclic and a fused ring may be used in a case where the aromatic ring group is polycyclic. An aromatic hydrocarbon ring group and an aromatic ring heterocyclic group are preferable, and an aromatic hydrocarbon ring group is more preferable.

As the aromatic hydrocarbon ring group, a benzene ring group, a naphthalene ring group, or an anthracene ring group is preferable and a benzene ring group is particularly preferable. Examples of the aromatic ring heterocyclic group include a thiophene ring group, a furan ring group, a pyrrole ring group, a triazine ring group, an imidazole ring group, a triazole ring group, a thiadiazole ring group, and a thiazole ring group.

The aliphatic ring group may be an aliphatic hydrocarbon ring group or an aliphatic heterocyclic group. Further, the aliphatic ring group may be monocyclic or polycyclic and a fused ring may be used in a case where the aliphatic ring group is polycyclic. Examples of the aliphatic hydrocarbon ring group include a cyclohexane group. Examples of the aliphatic heterocyclic group include aliphatic ring groups among heterocycles shown to have a "structure in which a hydroxymethyl group or an alkoxymethyl group is bonded to an aromatic ring or an aliphatic ring" described below.

In a case where a linking group $L^{1a}$ is a "combination group", a group including —C(=O)—O—, a group including an aromatic ring group, a group including —C(=O)—NH—, and the like are preferable.

In the present invention, the expression "group including XXX" also includes a case where a group consisting of only XXX.

Among the examples described above, —C(=O)—O— or a benzene ring is particularly preferable as the linking group $L^{1a}$.

In Formula (IA), $L^{2a}$ represents a single bond or a linking group. In a case where $L^{2a}$ represents a linking group, a divalent linking group is preferable. Here, it is preferable that at least one of $L^{1a}$ and $L^{2a}$ represents a linking group.

The linking group $L^{2a}$ is not particularly limited and has the same definition as that for the linking group $L^{1a}$. As the liking group $L^{2a}$, the following groups or combination groups are preferable. That is, preferred examples thereof include an alkylene group, an aliphatic ring group, and an aromatic ring group. Here, the number of carbon atoms of the alkylene group is preferably 1 to 4 and a methylene group is particularly preferable.

In addition, preferred examples of the combination groups include a —O-alkylene group, an alkylene group-O—, a —O—C(=O)-group, a —O—C(=O)—NH-alkylene group, a —O-alkylene group-C(=O)—O-aromatic ring group, an alkylene group-O—, an -alkylene group-O-aromatic ring group, an -alkylene group-C(=O)—O-alkylene group, and an -alkylene group-O—C(=O)-alkylene group-C(=O)—O-alkylene group, and a group including a —O— group bonded to L is more preferable. Here, the number of carbon atoms of the alkylene group in a combination group is preferably in a range of 1 to 4 and a methylene group or an ethylene group is particularly preferable.

Among these, it is preferable that $L^{2a}$ represents an alkylene group or a —O-alkylene group.

Particularly, it is preferable that $L^{2a}$ represents an alkylene group in a case where $L^{1a}$ represents a —C(=O)—O-group and it is preferable that $L^{2a}$ represents a —O-alkylene group in a case where $L^{1a}$ represents an aromatic ring group.

The crosslinkable group X is not particularly limited as long as the group reacts with the repeating unit (IB) due to at least one of preferably heat or an acid, and examples thereof include a group having a ring structure, a hydroxymethyl group, an alkoxymethyl group, a (meth)acryloyloxy group, a styryl group, a vinyl group (including a vinyl ether group), and —NH—CH$_2$—O—R$^X$ (R$^X$ represents a hydrogen atom or an alkyl group having 1 to 20 carbon atoms).

Examples of the group having a ring structure include an epoxy group (oxiranyl group), an oxetanyl group, a thioxiranyl group, and a thioxetanyl group.

The "ring structure" in a group having a ring structure may be an aromatic ring or an aliphatic ring. Further, the ring structure may be monocyclic or polycyclic. In a case where the ring structure is polycyclic, the ring structure may be a fused ring, a bridged ring, or a spiro ring. Among these, a fused ring or a bridged ring is preferable.

It is preferable that the polycyclic structures includes a cyclohexane ring structure and has a cyclohexene oxide structure (structure in which a cyclohexane ring and an oxirane ring are fused) and a structure in which cyclohexane and oxetane are fused particularly from the viewpoint of reactivity.

The above-described "ring structure" may have a substituent, and examples of the substituent include substituents T.

Examples of such a polycyclic ring structure and such a group (crosslinkable group X) having the ring structure include the followings, but the present invention is not limited thereto. Further, the bonding position of $L^{2a}$ with respect to the ring structure described below and the group having the ring structure is not particularly limited.

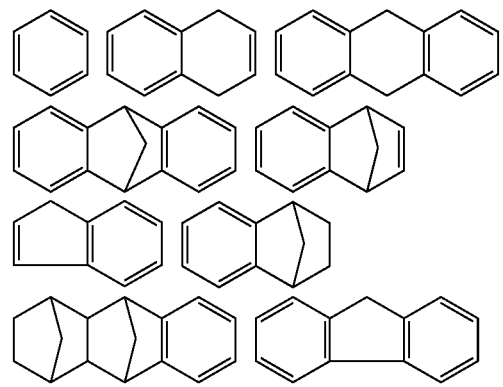

-continued

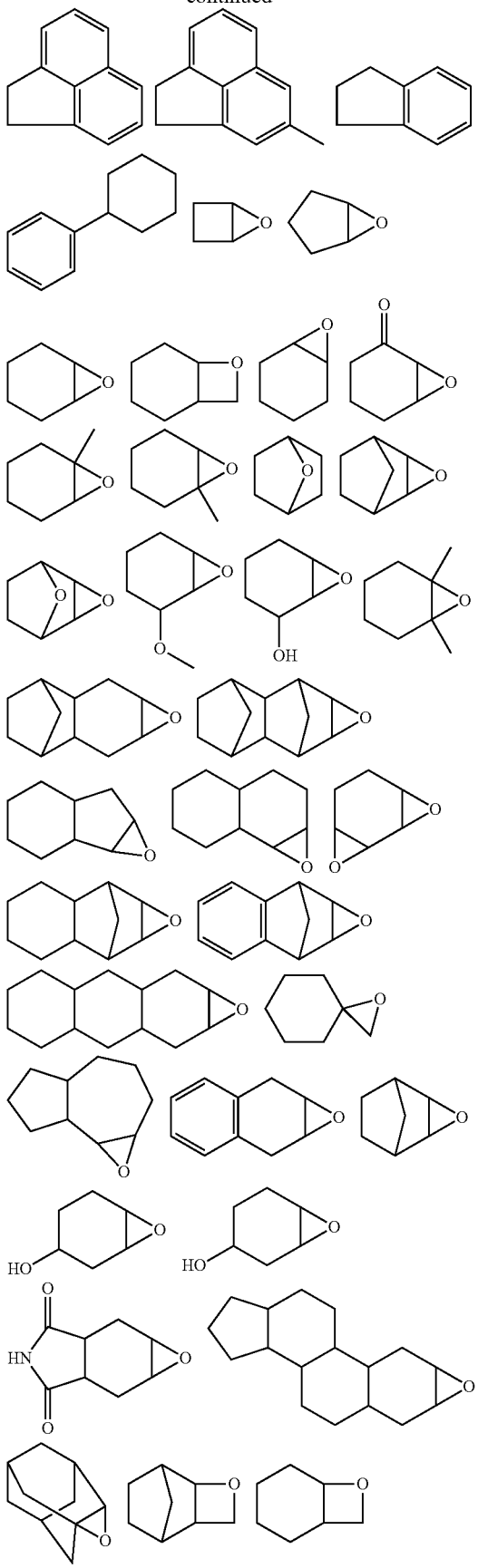

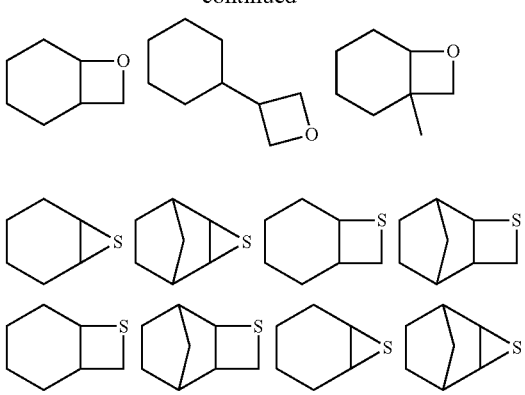

Examples of an alkoxy group of an alkoxymethyl group include an alkoxy group having 1 to 10 carbon atoms (such as a methoxy group, an ethoxy group, a propoxy group, a butoxy group, a hexyl group, or a cyclohexyl group).

As the crosslinkable group X, an epoxy group, an oxetanyl group, a hydroxymethyl group, an alkoxymethyl group, a (meth)acryloyloxy group, a styryl group, or a vinyl group is preferable and an epoxy group or an oxetanyl group is further preferable.

m2a represents an integer of 1 to 5, and an integer of 1 to 3 is preferable and 1 or 2 is more preferable. Particularly, it is preferable that m2a represents 1 in a case where the crosslinkable group X is a group having a ring structure and it is preferable that m2a represents 2 or 3 in a case where the crosslinkable group X is a group other than the groups having a ring structure.

In Formula (IA), a group represented by $(-L^{2a}-(X)m2a)$ is formed by optionally combining $L^{2a}$ with X, but a group formed by combining a group preferable as $L^{2a}$ with a group preferable as X is preferable.

In addition, in a case where the crosslinkable group X is a hydroxymethyl group or an alkoxymethyl group, it is preferable that $L^{2a}$ includes an aromatic ring or an aliphatic ring and these rings are bonded to a hydroxymethyl group or an alkoxymethyl group. Examples of the structure in which a hydroxymethyl group or an alkoxymethyl group is bonded to an aromatic ring or an aliphatic ring include the followings, but the present invention is not limited thereto. In the following structure, the bonding position of the aromatic ring or the aliphatic ring may be any of ring constituting atoms of the aromatic ring or the aliphatic ring. Further, the following structure may include a substituent T. In the following structure, "O—" indicates "O—CH₃".

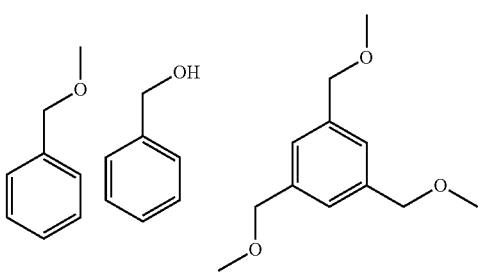

15
-continued
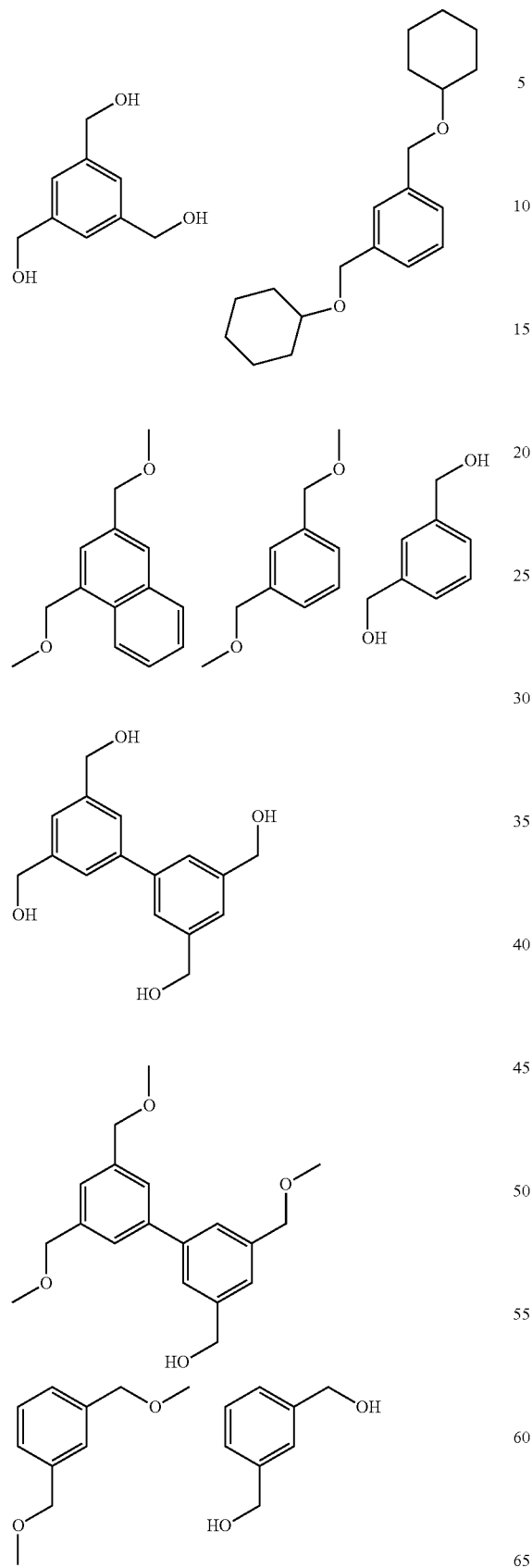
16
-continued
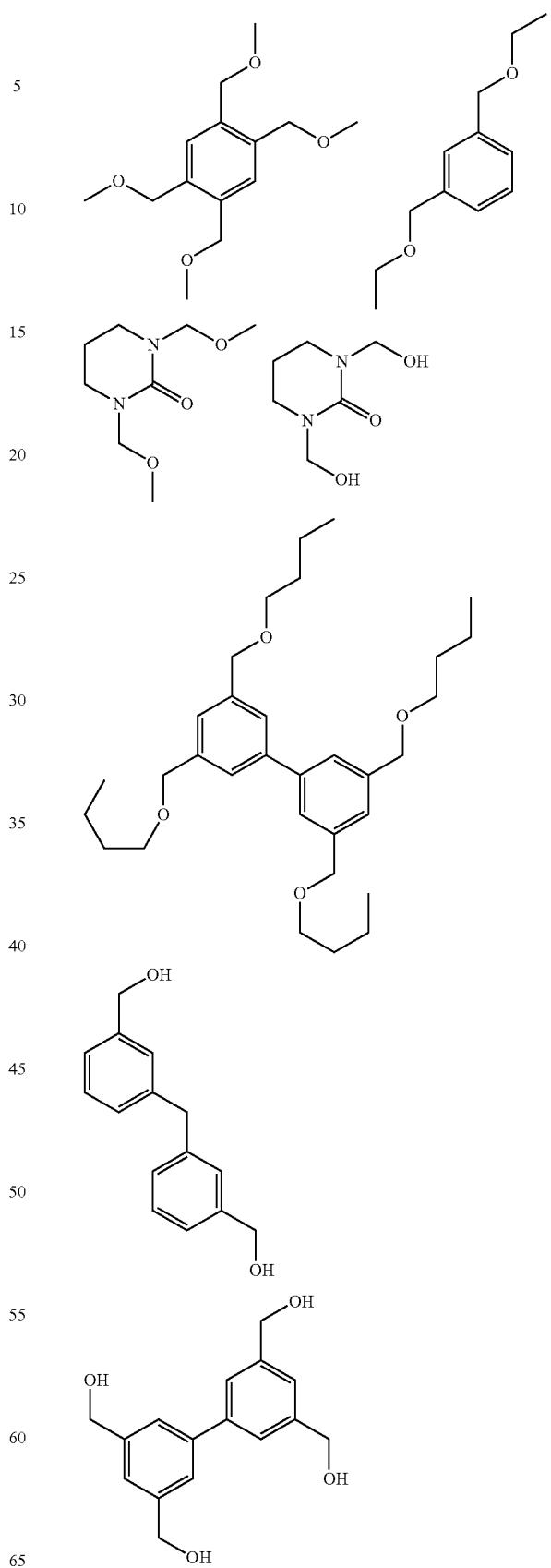

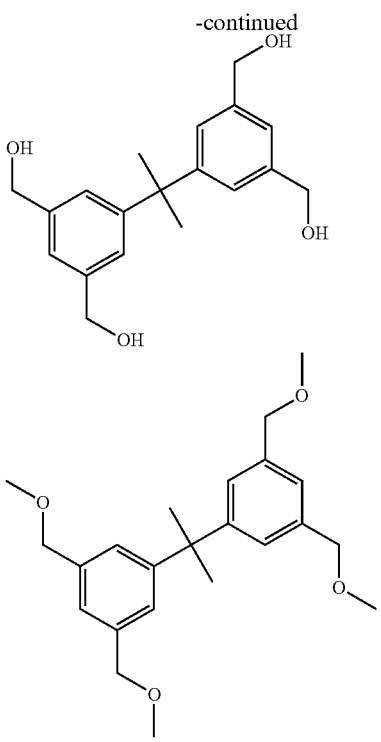

m1a represents an integer of 1 to 5, and an integer of 1 to 4 is preferable and 1 or 2 is more preferable.

It is preferable that the repeating unit (IA) is a repeating unit (IA-1) represented by the following Formula (IA-1). The symbol "*" represents a bonding position of the repeating unit (IA-1).

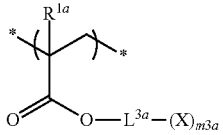

Formula (IA-1)

In Formula (IA-1), $R^{1a}$ represents a hydrogen atom, a halogen atom, or an alkyl group and has the same definition as that for $R^{1a}$ of Formula (IA). Further, preferable ranges thereof are the same as those of $R^{1a}$ represented by Formula (IA).

$L^{3a}$ represents a single bond or a linking group. As $L^{3a}$, a linking group is preferable, an alkylene group, a -alkylene group-O-aromatic ring group, a -alkylene group-C(=O)—O-alkylene group, or a -alkylene group-O—C(=O)-alkylene group-C(=O)—O-alkylene group is more preferable, and an alkylene group is still more preferable. Here, the number of carbon atoms of the alkylene group in the combination group is preferably in a range of 1 to 4, and a methylene group or an ethylene group is particularly preferable.

X represents a crosslinkable group and has the same definition as that for X of Formula (IA). Further, preferable ranges thereof are the same as those of X represented by Formula (IA).

m3a represents an integer of 1 to 5 and has the same definition as that for m2a of Formula (IA). Further, preferable ranges thereof are the same as those of m2a represented by Formula (IA).

The repeating units (IA) and (IA-1) in which the crosslinkable group X is an epoxy group or an oxetanyl group will be described in detail.

As a constituent component as the repeating unit (IA) having an epoxy group, a (meth)acrylic acid ester constituent component is exemplified. Examples of such constituent components include glycidyl acrylate, glycidyl methacrylate, glycidyl α-ethyl acrylate, glycidyl α-n-propyl acrylate, glycidyl α-n-butyl acrylate, 3,4-epoxy butyl acrylate, 3,4-epoxy butyl methacrylate, 3,4-epoxycyclohexyl methyl acrylate, 3,4-epoxycyclohexylmethyl methacrylate, 3,4-epoxycyclohexylmethyl α-ethyl acrylate, o-vinylbenzyl glycidyl ether, m-vinylbenzyl glycidyl ether, p-vinylbenzyl glycidyl ether, and compounds which contain an alicyclic epoxy skeleton described in paragraphs [0031] to [0035] of JP4168443B, and the contents of which are incorporated in the present specification.

Further, examples of the constituent component which becomes the repeating unit (IA) having an oxetanyl group include (meth)acrylic acid ester having an oxetanyl group described in paragraphs [0011] to [0016] of JP2001-330953A and compounds described in the paragraph [0027] of JP2012-088459A, and the contents of which are incorporated in the present specification.

Moreover, as the constituent component which becomes the repeating unit (IA) having an epoxy group and an oxetanyl group, a monomer having a methacrylic acid ester structure and a monomer having an acrylic acid ester structure are preferable.

Among these, from the viewpoints of improving reactivity and characteristics of a hardened film, glycidyl methacrylate, 3,4-epoxycyclohexyl methyl acrylate, 3,4-epoxycyclohexyl methyl methacrylate, o-vinylbenzyl glycidyl ether, m-vinylbenzyl glycidyl ether, p-vinylbenzyl glycidyl ether, (3-ethyloxetan-3-yl)methyl acrylate, and (3-ethyloxetan-3-yl)methyl methacrylate are preferable. These constituent units may be used alone or in combination of two or more kinds thereof.

Preferred examples of the repeating unit (IA) include repeating units represented by the following formulae. In the following formulae, $R^{1a}$ has the same definition as that for $R^{1a}$ of Formula (IA) and preferable ranges thereof are the same as those of $R^{1a}$ of Formula (IA). Further, in the following repeating units, the symbol "*" represents a bonding position of the repeating unit (IA) or the like. Each of the following repeating units may include a substituent T.

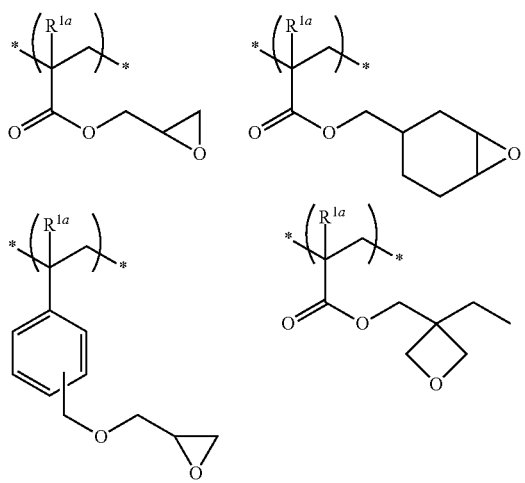

As the repeating unit (IA-1) in which the crosslinkable group X is a vinyl group or a (meth)acryloyloxy group, a constituent unit which has an ethylenically unsaturated group in the side chain is preferable and a constituent unit which has an ethylenically unsaturated group in the terminal and has a side chain having 3 to 16 carbon atoms is more preferable. In addition, compounds described in paragraphs [0072] to [0090] of JP2011-215580A and paragraphs [0013] to [0031] of JP2008-256974A are preferable, and the contents of which are incorporated in the present specification.

It is also preferable that the above-described repeating unit (IA) is a repeating unit (IA-2) represented by the following Formula (IA-2). The symbol "*" represents a bonding position of the repeating unit (IA-2).

Formula (IA-2)

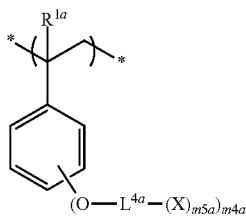

In Formula (IA-2), $R^{1a}$ represents a hydrogen atom, a halogen atom, or an alkyl group and has the same definition as that for $R^{1a}$ of Formula (IA). Further, preferable ranges thereof are the same as those of $R^{1a}$ represented by Formula (IA).

$L^{4a}$ represents a single bond or a linking group. As $L^{4a}$, a linking group is preferable, an alkylene group, a —C(=O)— group, —C(=O)—NH-alkylene group, or an alkylene group-C(O=O)—O-aromatic ring is more preferable, and an alkylene group is still more preferable. Here, the number of carbon atoms of the alkylene group is preferably in a range of 1 to 4, and a methylene group or an ethylene group is particularly preferable.

X represents a crosslinkable group and has the same definition as that for X of Formula (IA). Further, preferable ranges thereof are the same as those of X represented by Formula (IA).

m5a represents an integer of 1 to 5 and has the same definition as that for m2a. Further, preferable ranges thereof are the same as those of m2a.

m4a represents an integer of 1 to 5 and has the same definition as that for m1a. Further, preferable ranges thereof are the same as those of m1a.

In the repeating units (IA), (IA-1), and (IA-2), $R^{1a}$, $L^{1a}$, $L^{2a}$, $L^{3a}$, $L^{4a}$, and X each may include a substituent. Examples of such a substituent T include an alkyl group (the number of carbon atoms is preferably in a range of 1 to 6), a cycloalkyl group (the number of carbon atoms is preferably in a range of 3 to 10), an aryl group (the number of carbon atoms is preferably in a range of 6 to 15), a halogen atom, a hydroxyl group, an alkoxy group (the number of carbon atoms is preferably in a range of 1 to 6), a carboxyl group, a carbonyl group, a thiocarbonyl group, an alkoxycarbonyl group (the number of carbon atoms is preferably in a range of 2 to 7), an oxo group (=O), and a group obtained by combining these groups (the total number of carbon atoms is preferably in a range of 1 to 30 and more preferably in a range of 1 to 15).

Specific examples of the repeating unit (IA) represented by Formula (IA) are described below, but the present invention is not limited thereto. Further, in the specific examples described below, the symbol "*" represents a bonding position of the repeating unit (IA).

The specific examples described below may include substituents T.

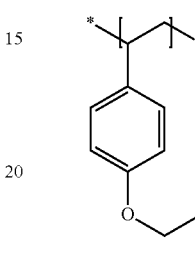

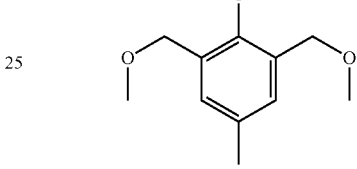

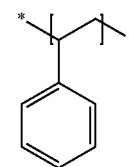

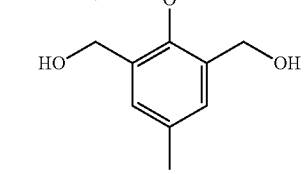

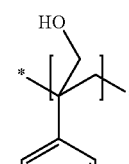

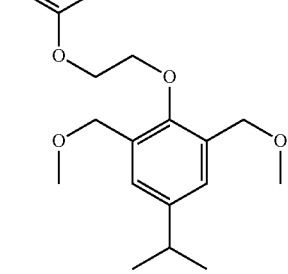

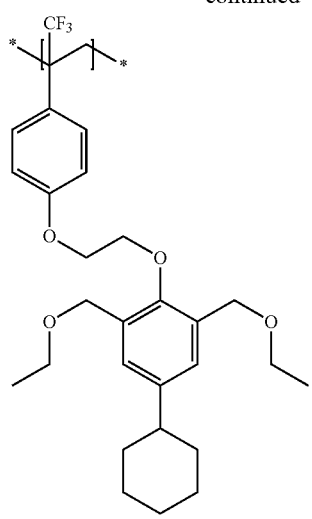
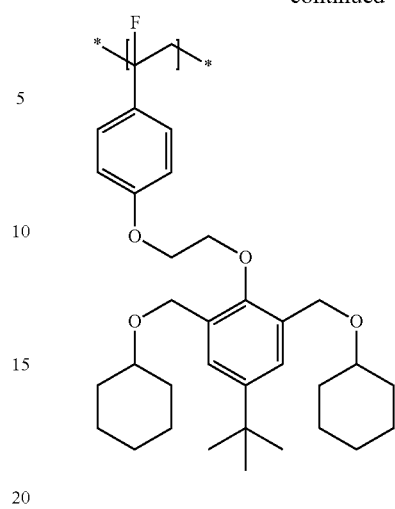
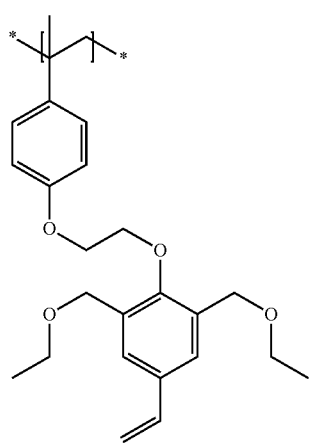
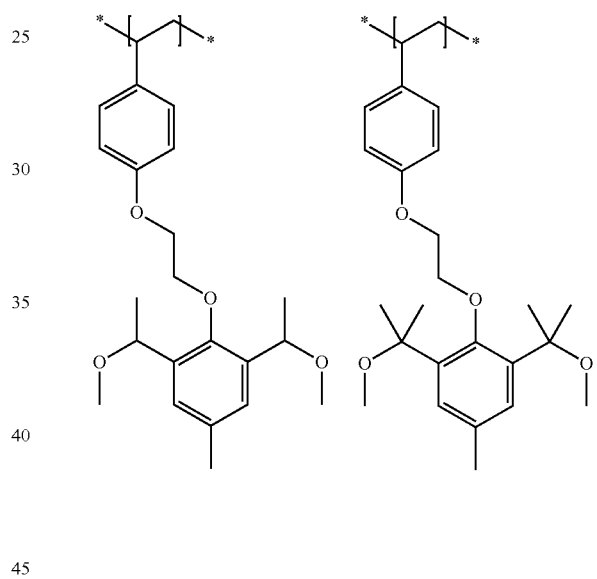
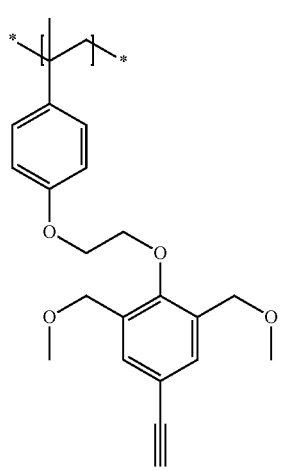
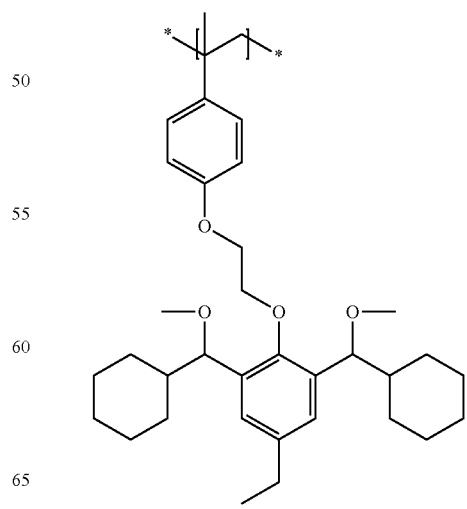

23
-continued
24
-continued
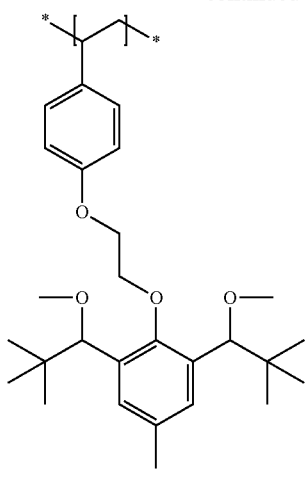
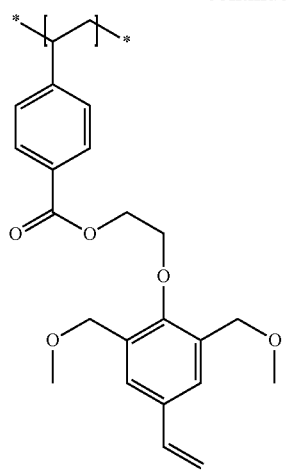
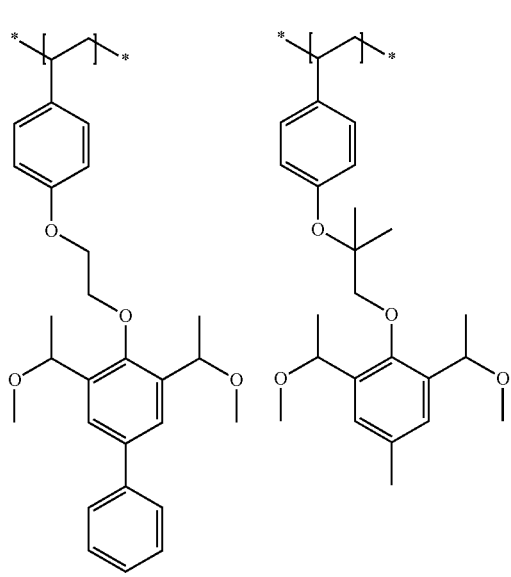
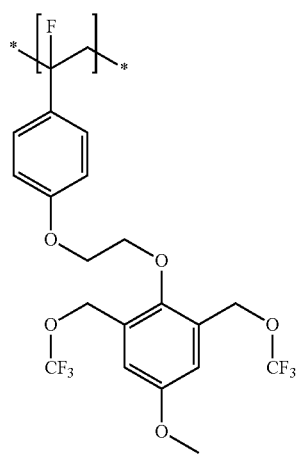

-continued
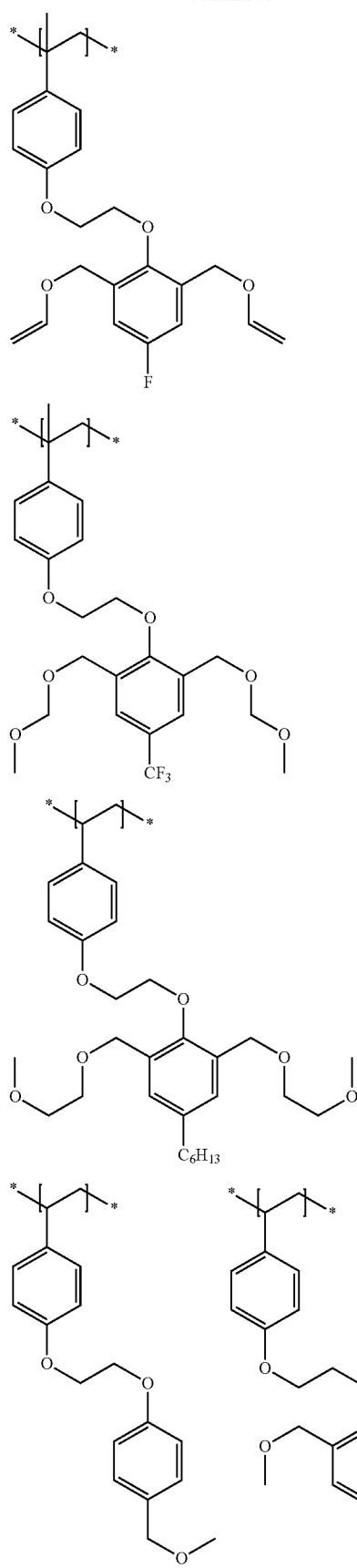
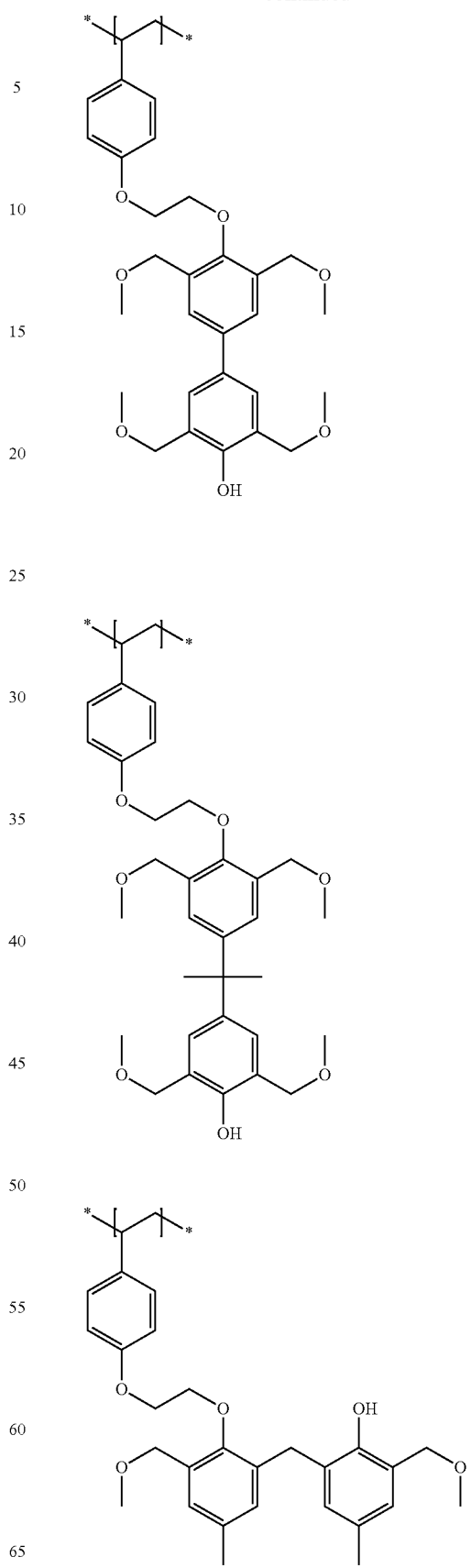

27
-continued
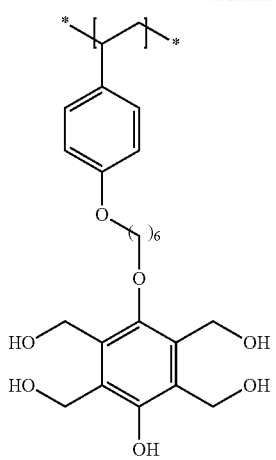
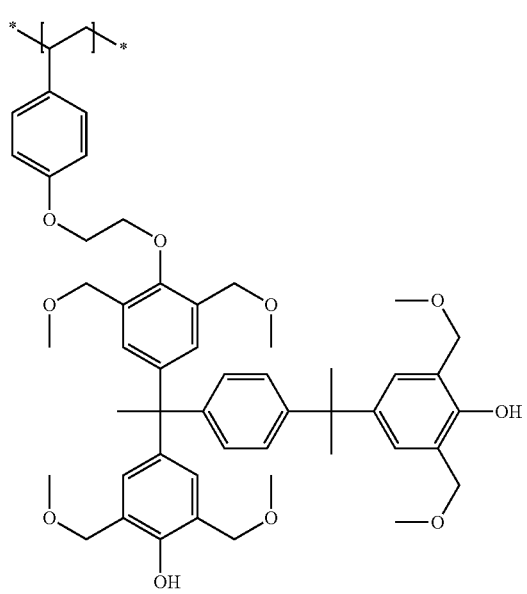
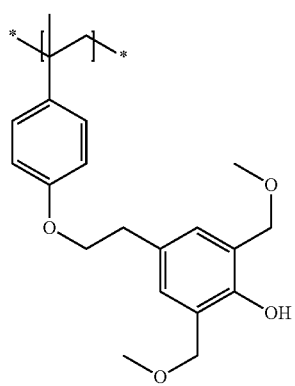
28
-continued
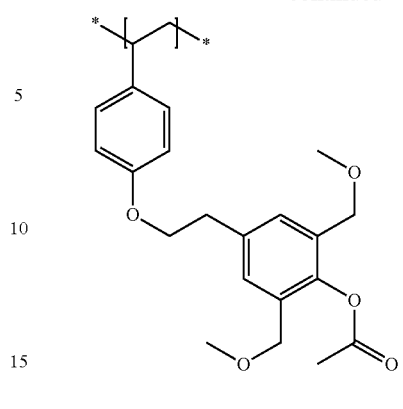
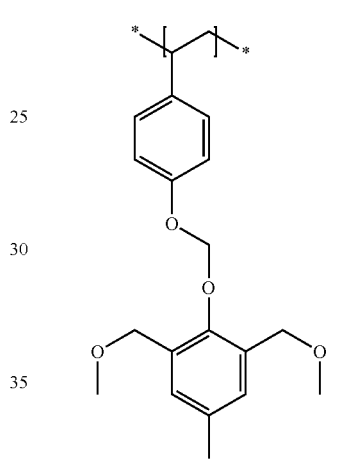
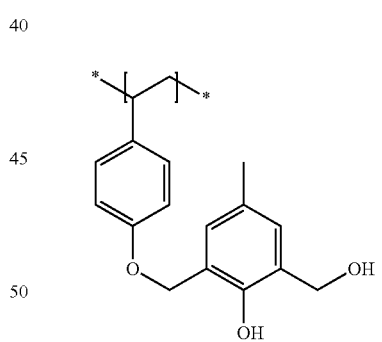
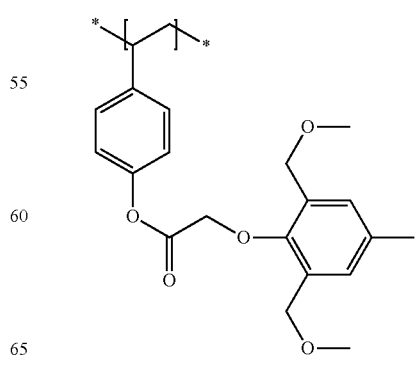

29
-continued
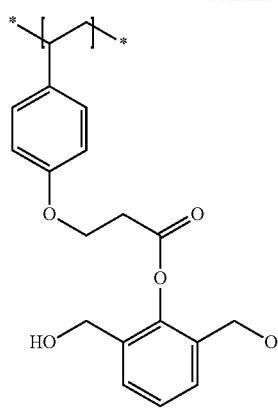
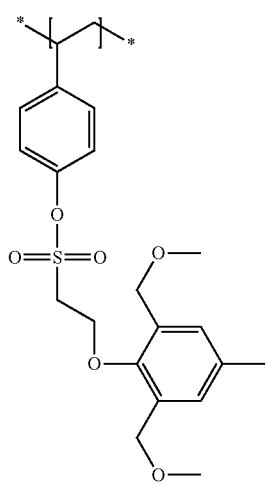
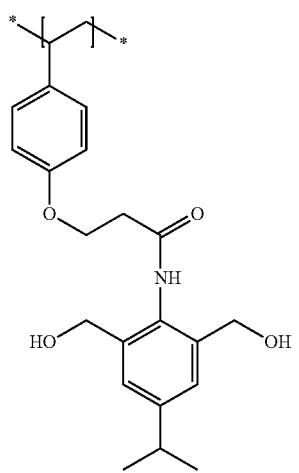
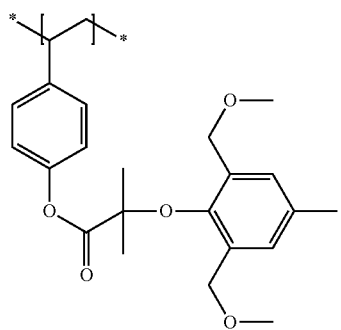
30
-continued
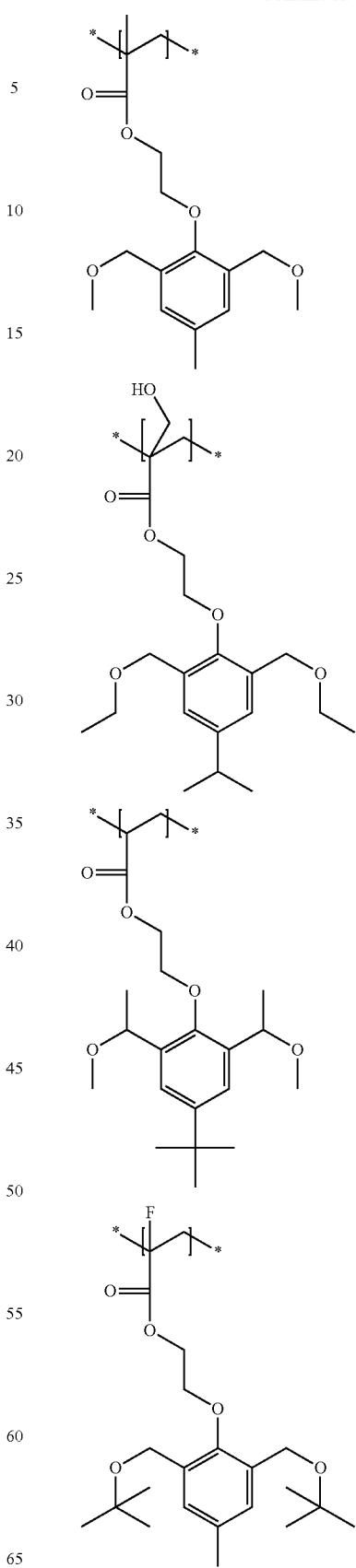

31
-continued
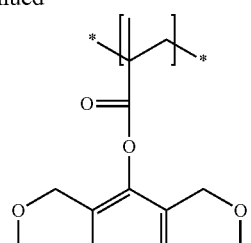
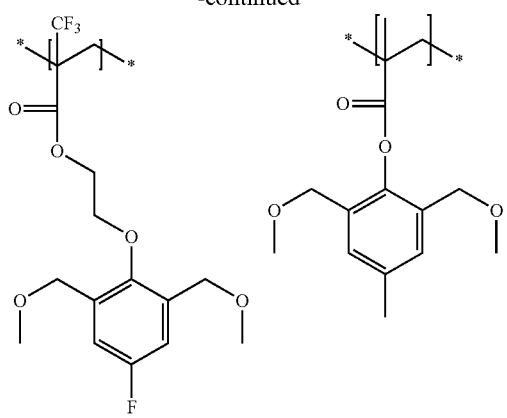
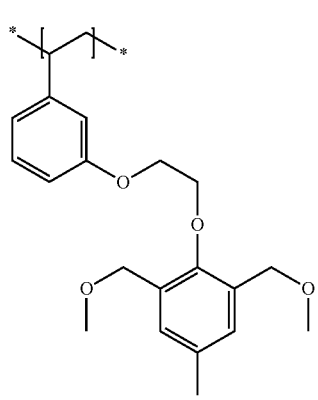
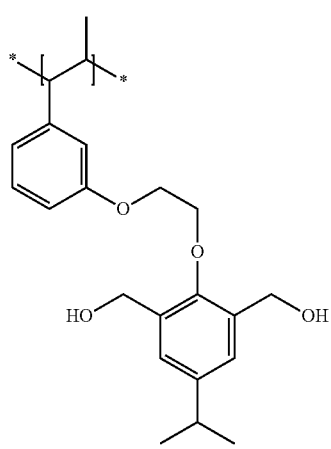
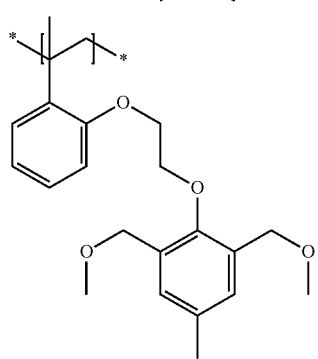
32
-continued
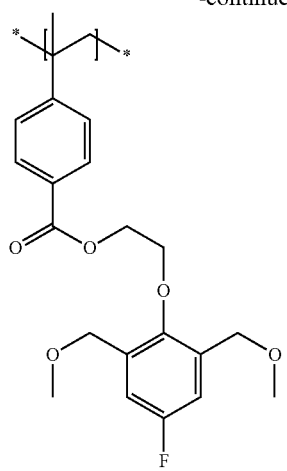
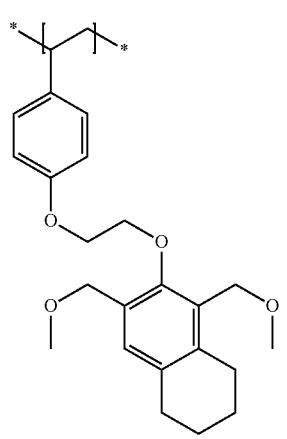
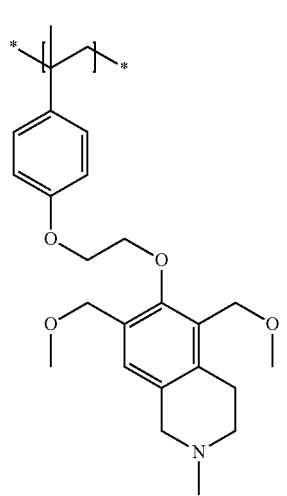

33
-continued
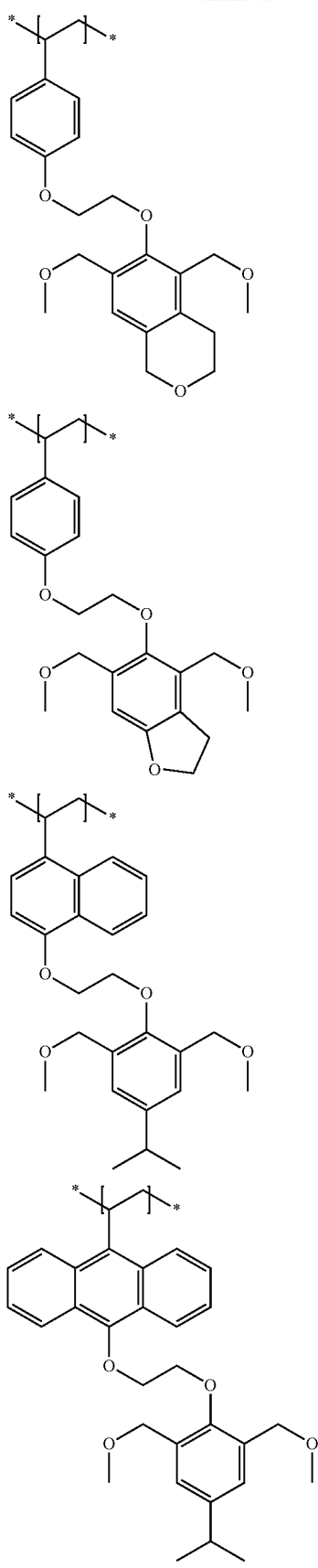
34
-continued
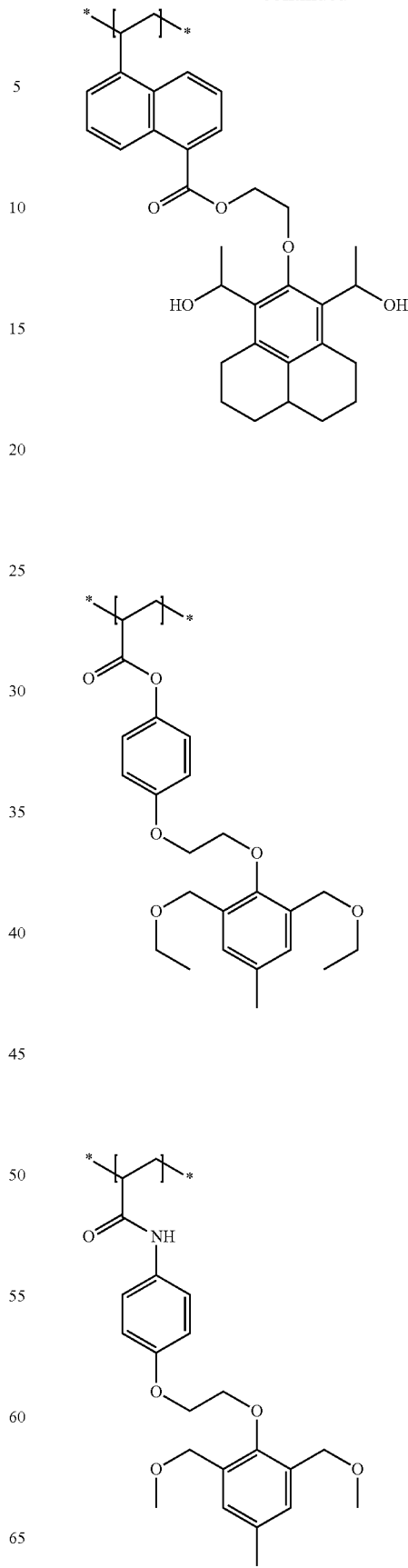

35
-continued
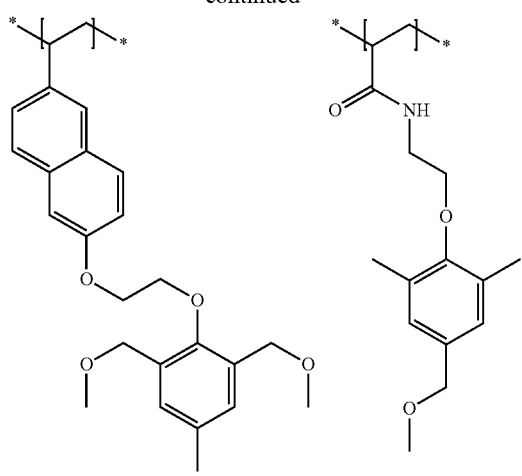
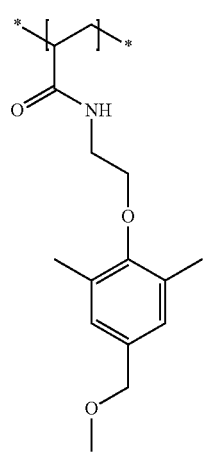
36
-continued
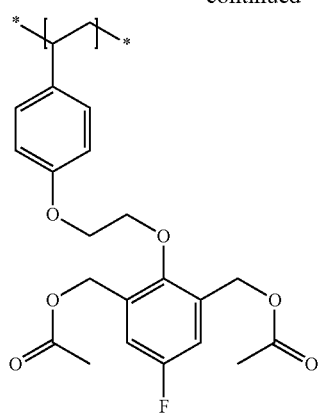
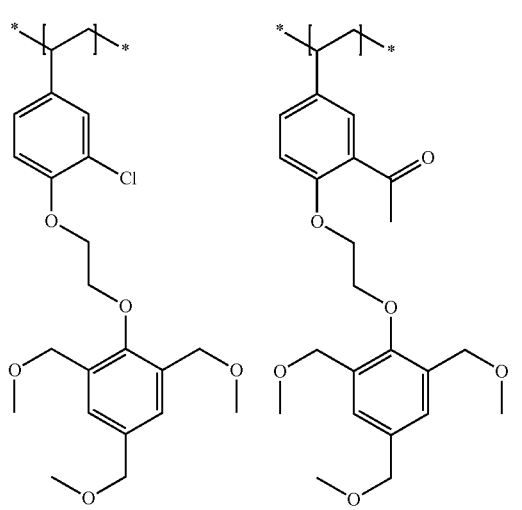
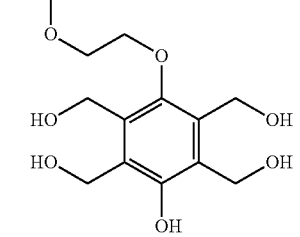
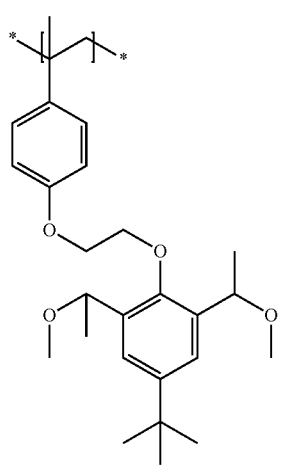
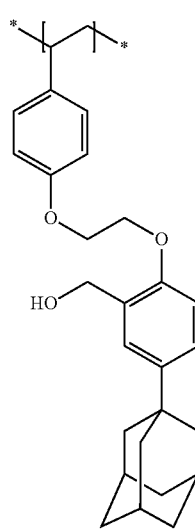

37
-continued
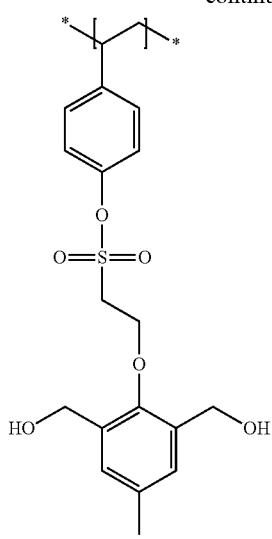
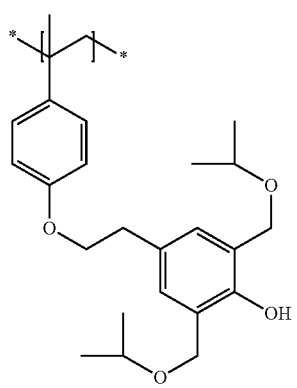
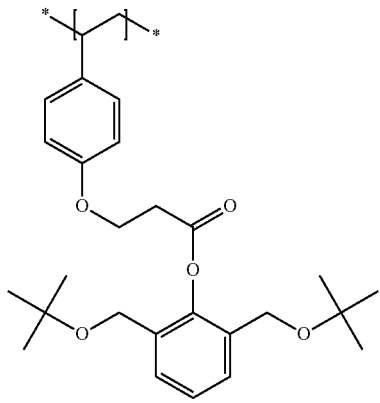
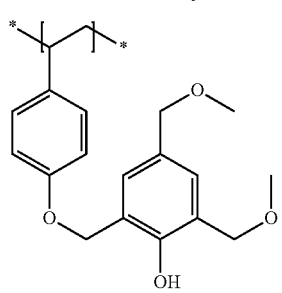
38
-continued
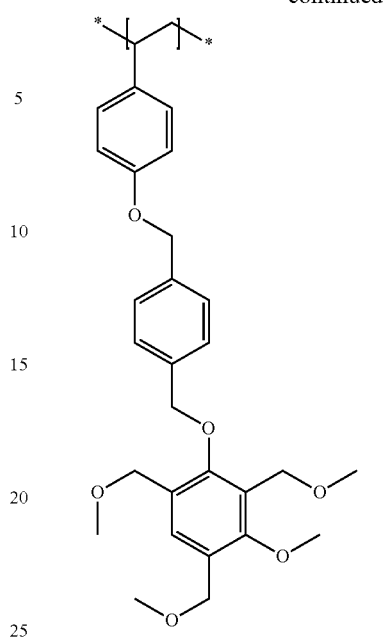
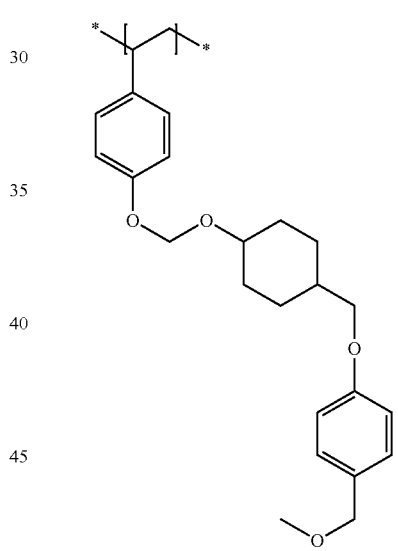
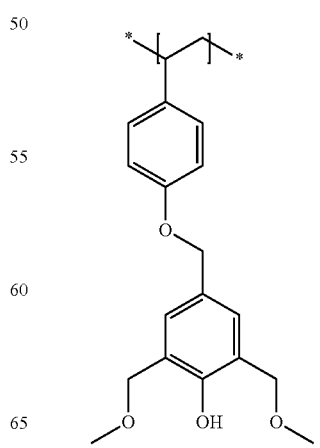

-continued
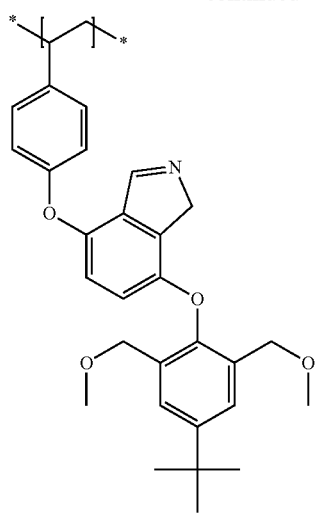
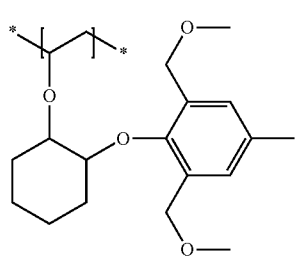
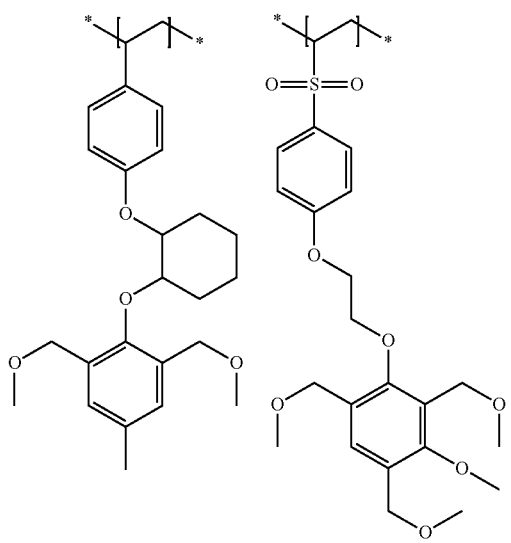
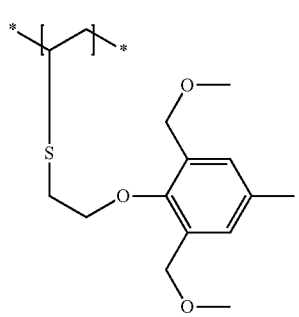
-continued
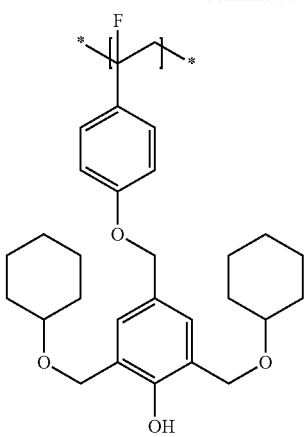
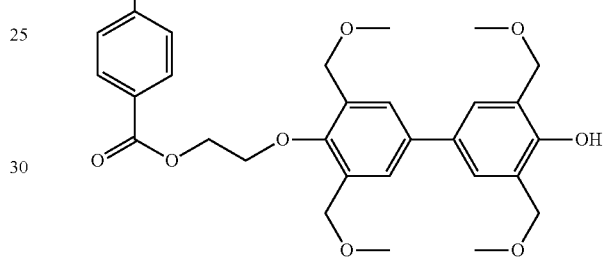
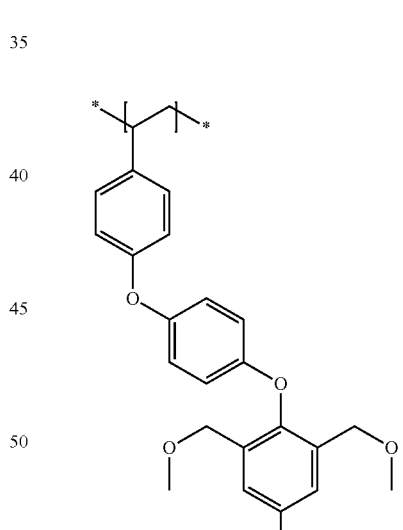
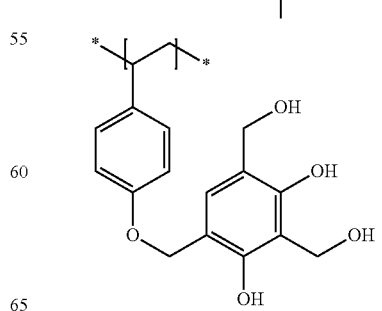

41
-continued
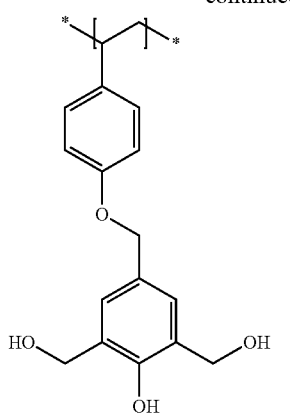
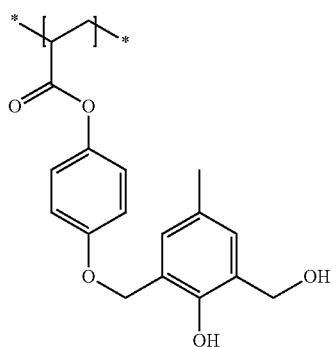
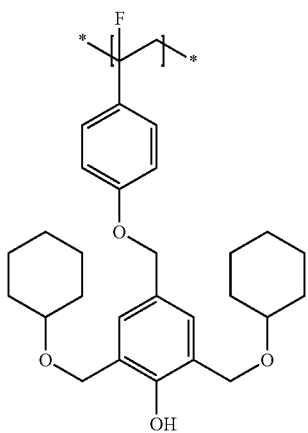
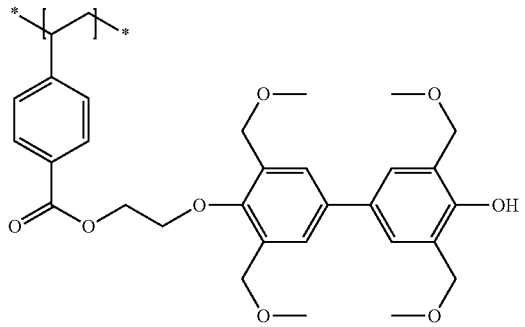
42
-continued
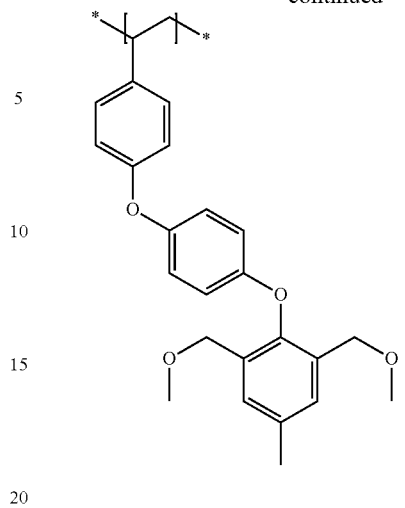
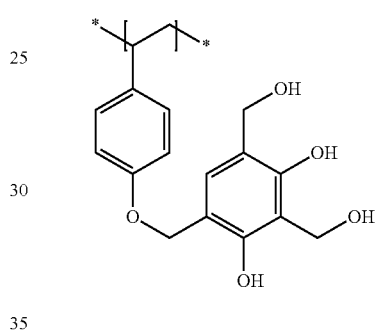
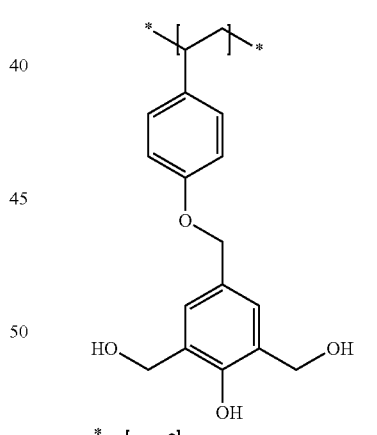
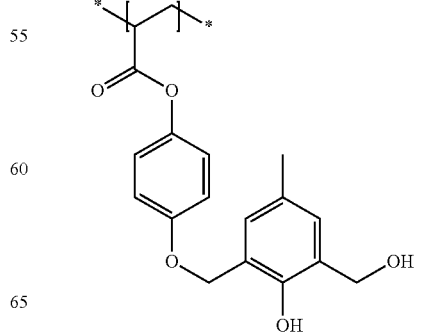

43
-continued
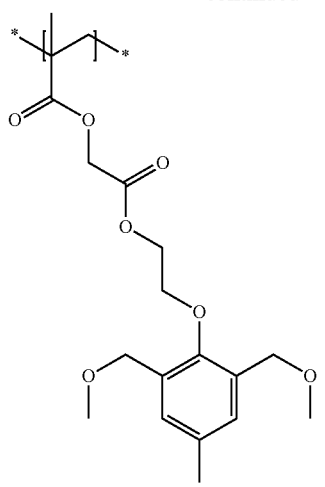
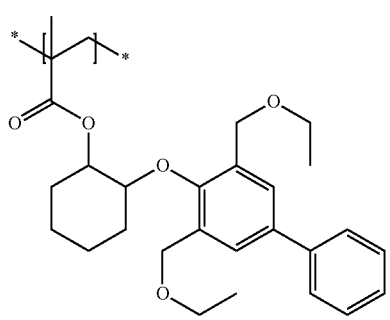
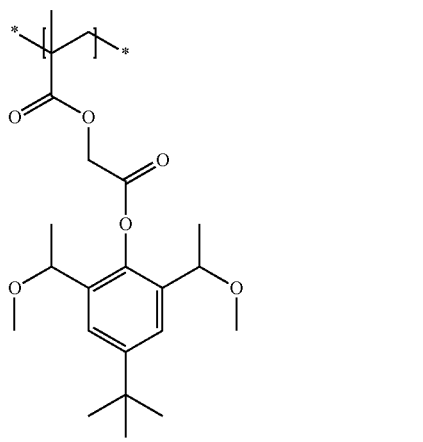
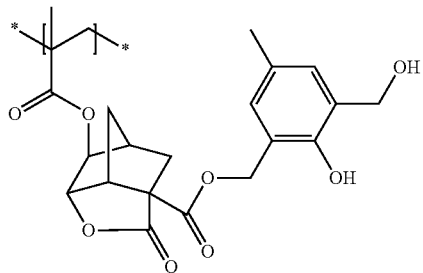
44
-continued
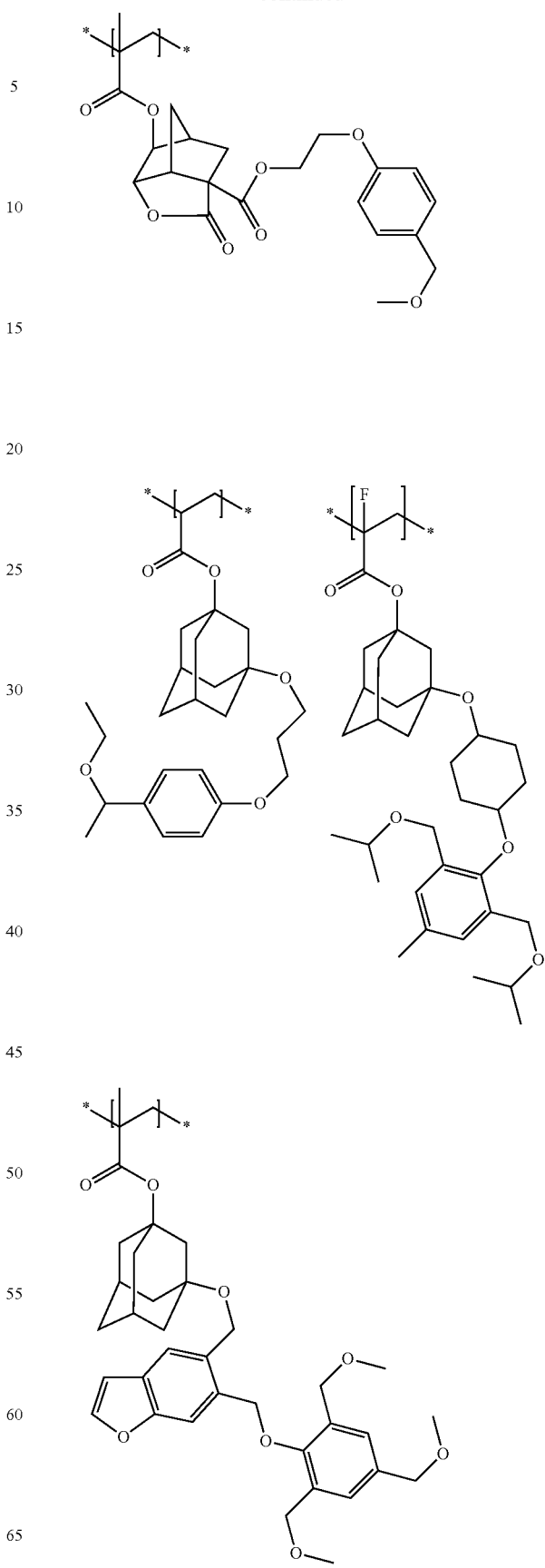

45
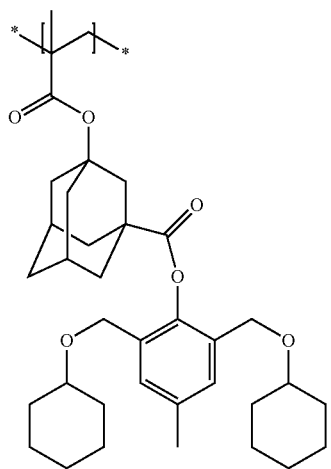
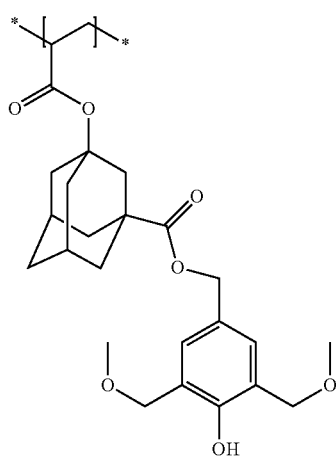
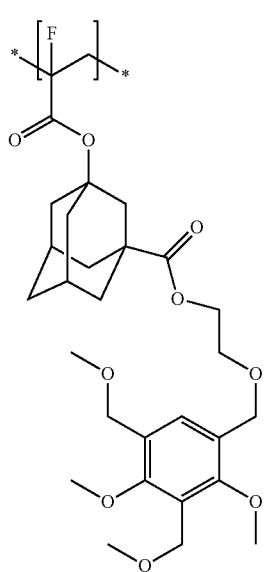
46
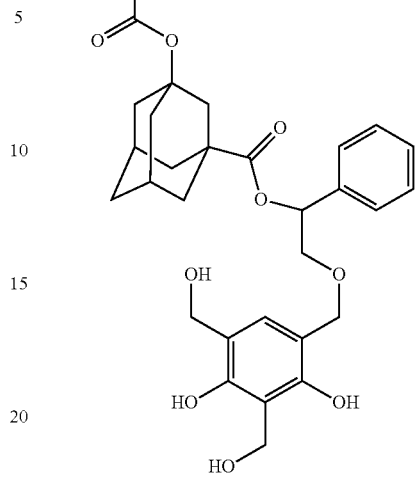
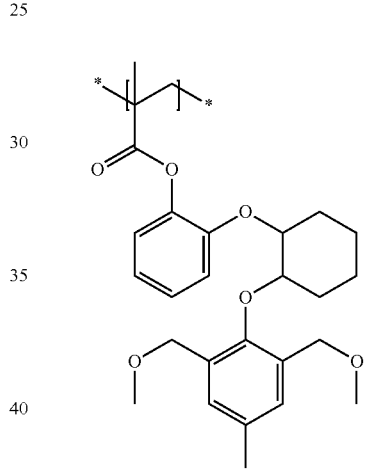
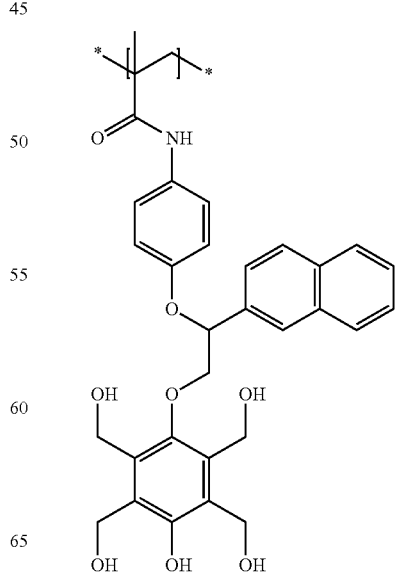

47
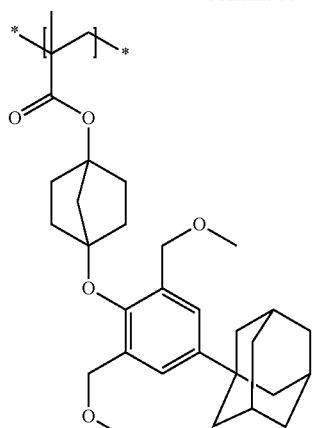 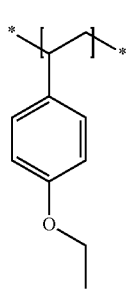
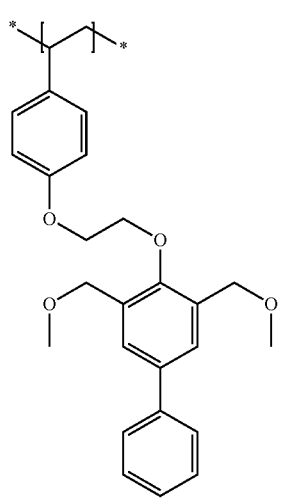
48
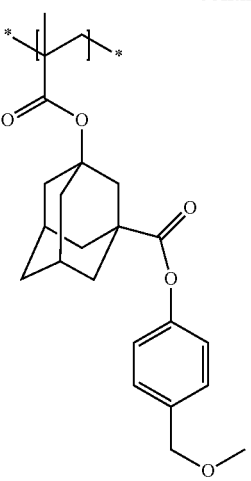
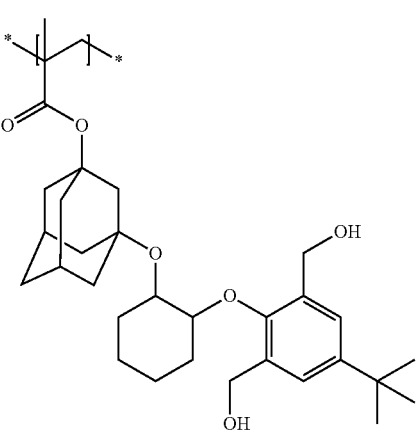
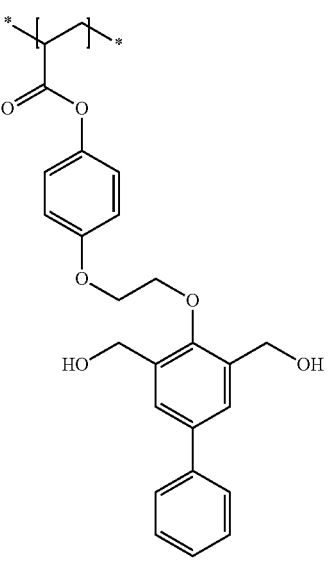

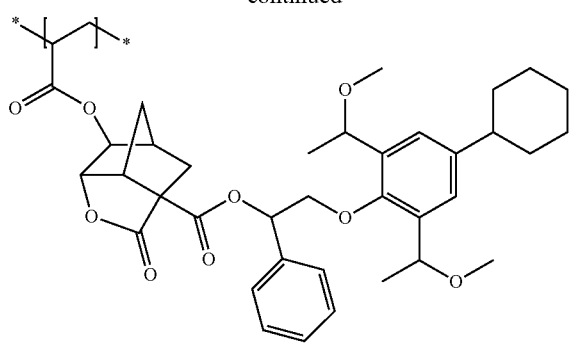
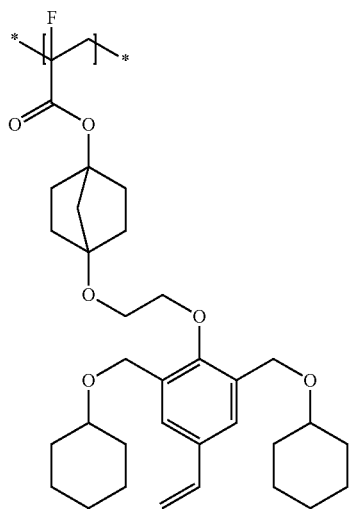
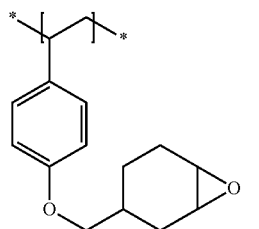
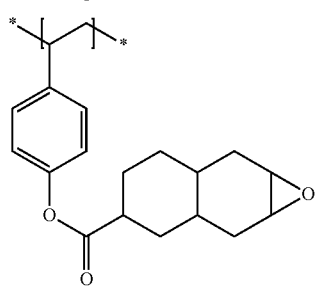
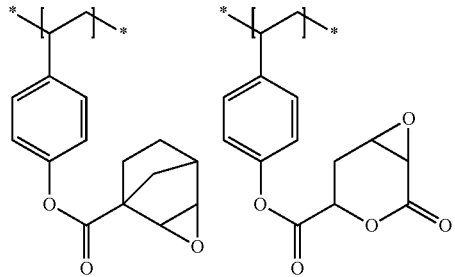
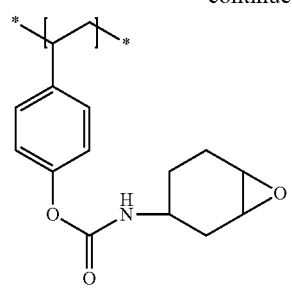
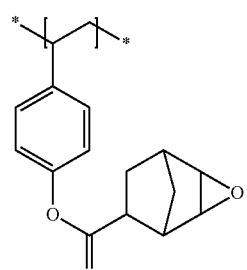
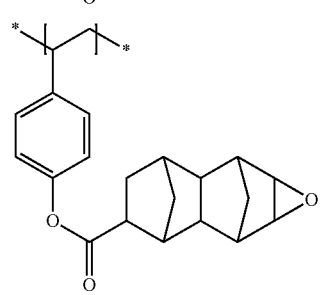
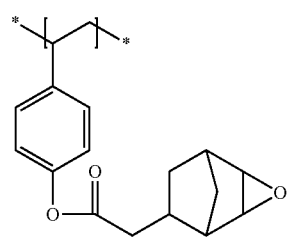
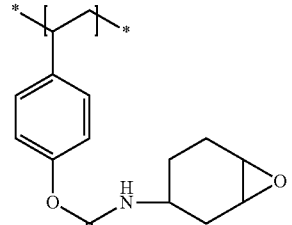
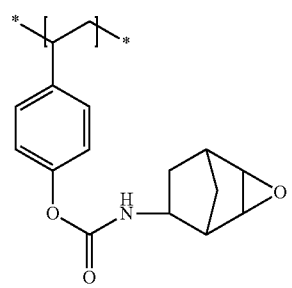

-continued
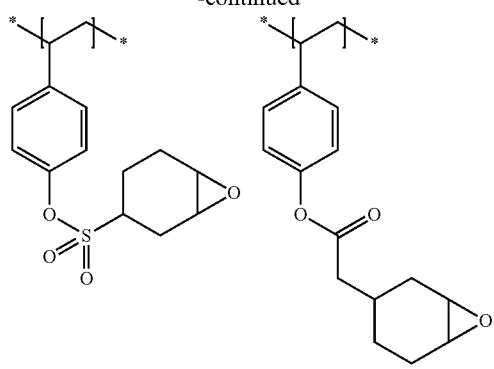
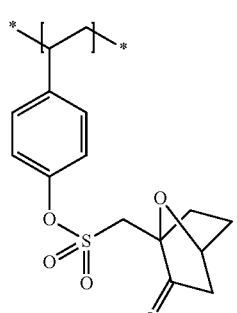
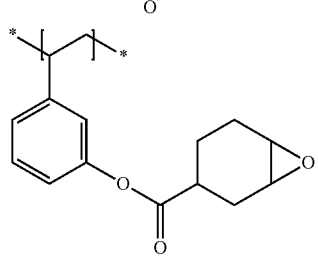
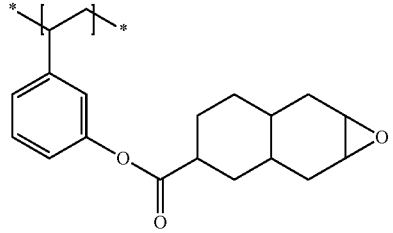
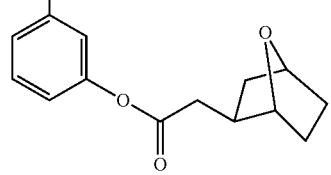
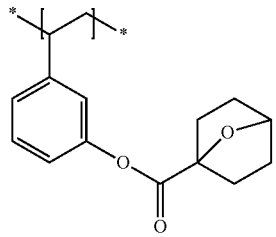
-continued
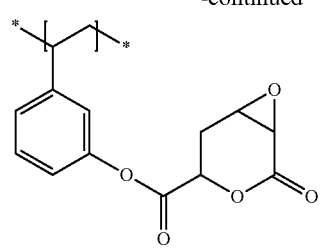
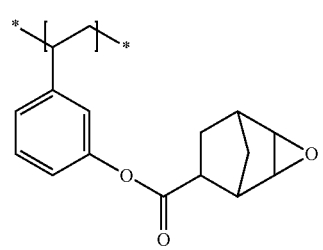
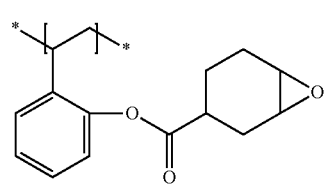
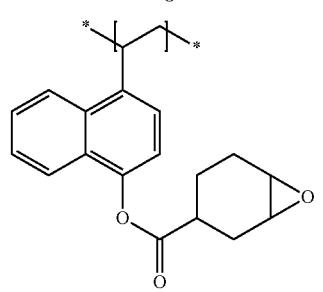
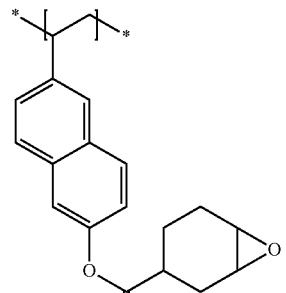
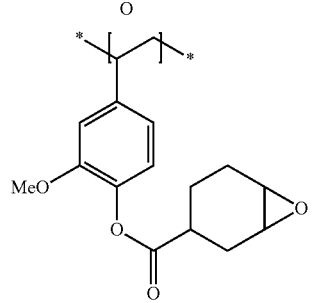

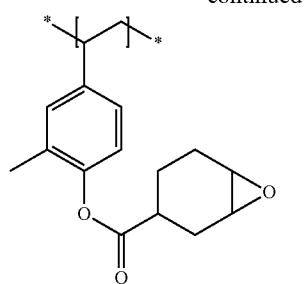
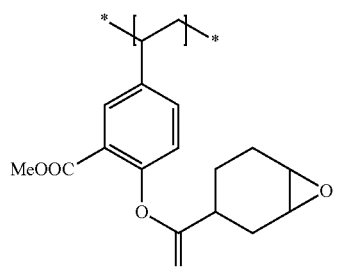
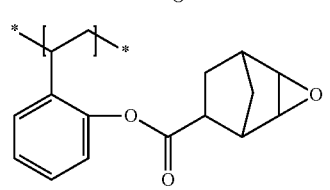
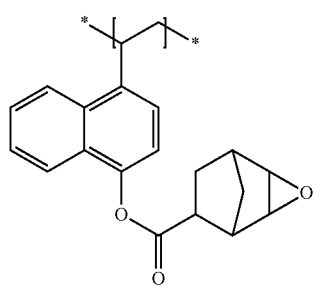
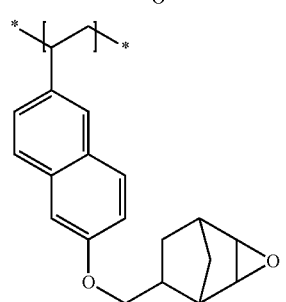
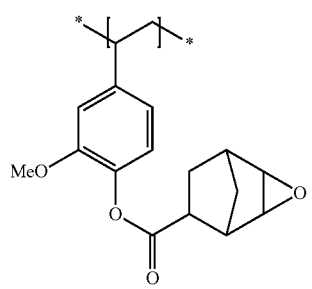
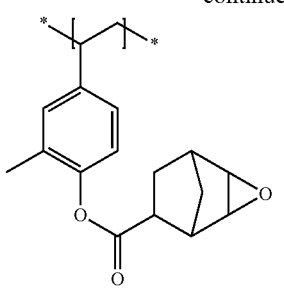
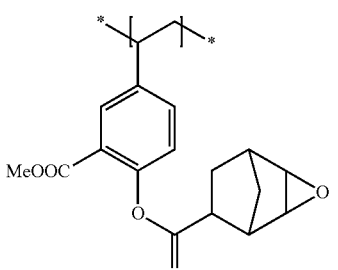
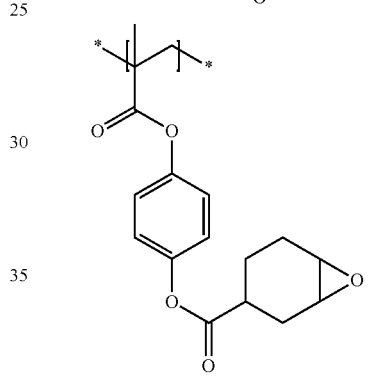
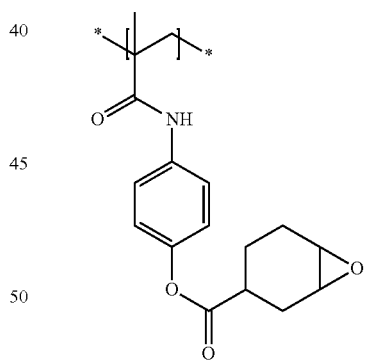
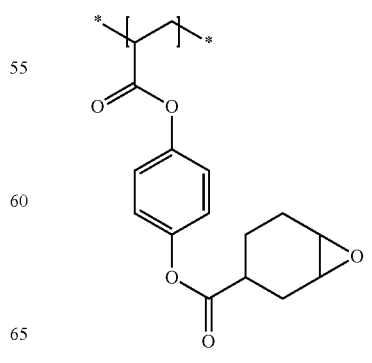

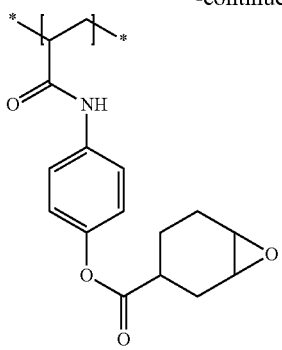
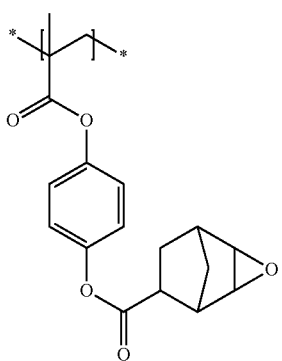
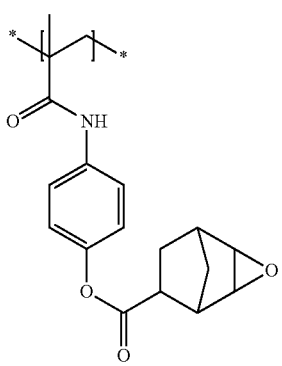
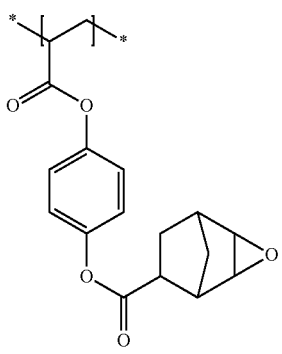
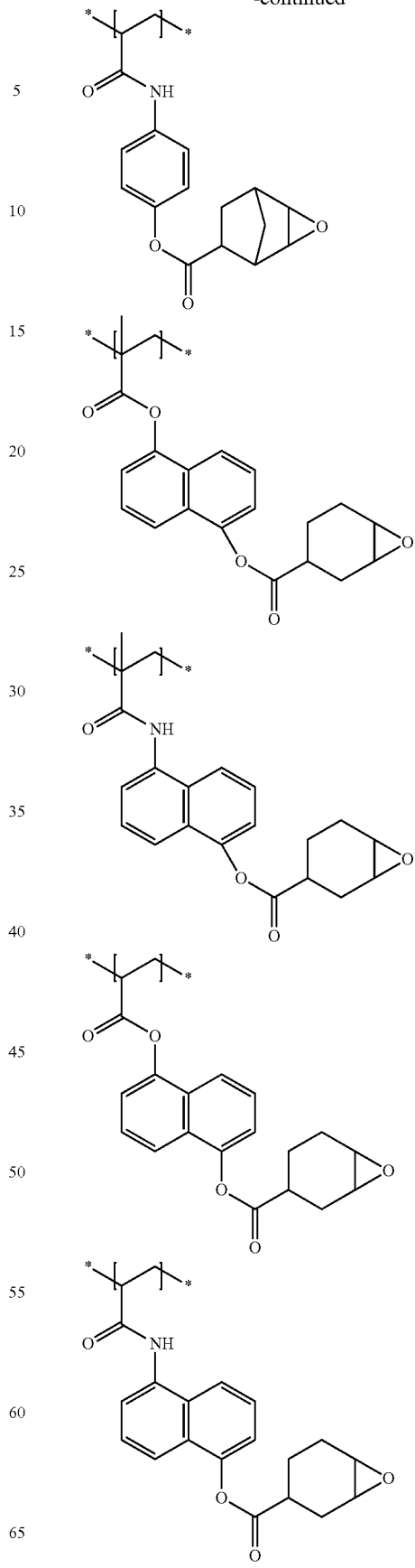

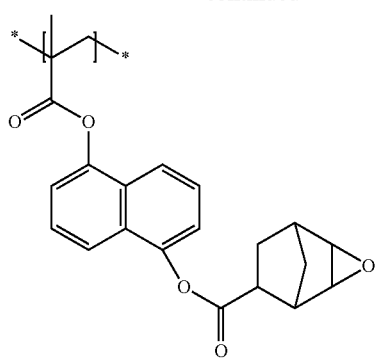
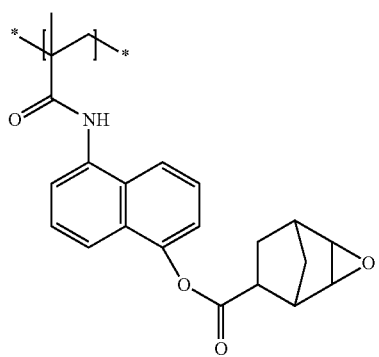
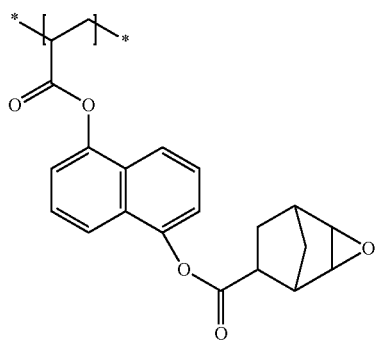
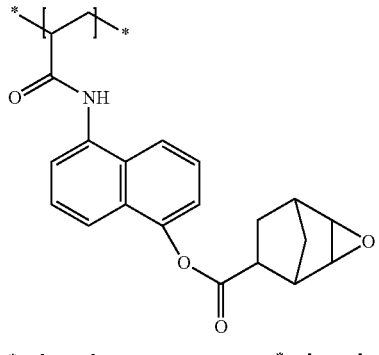
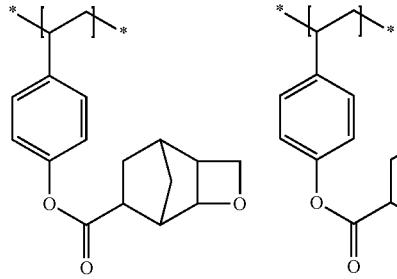
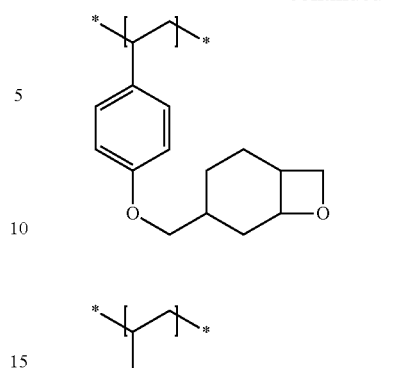
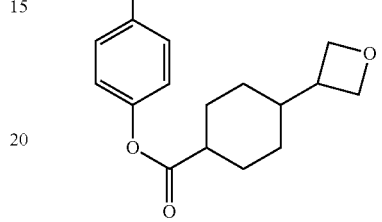
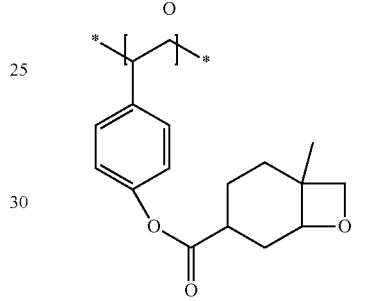
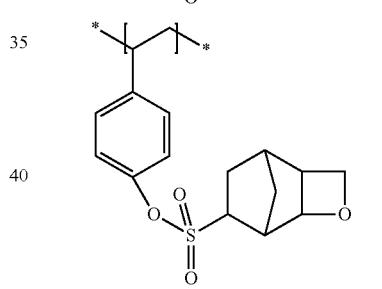
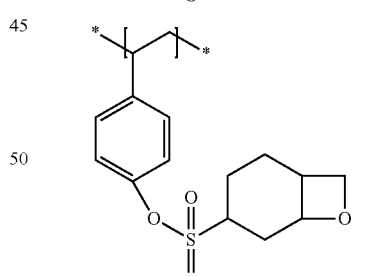
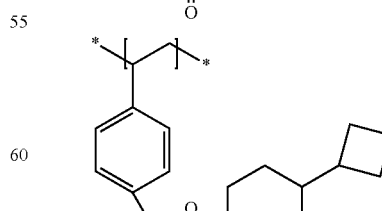
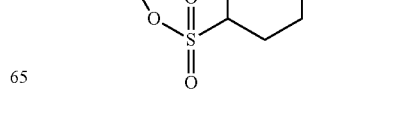

59
-continued
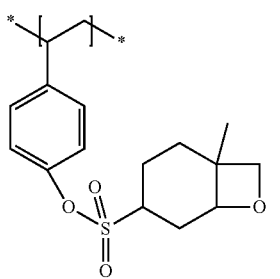
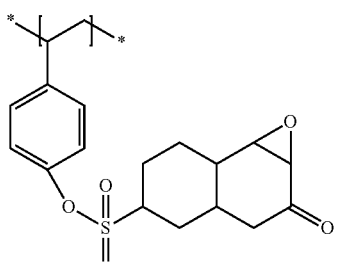
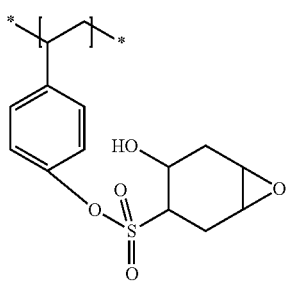
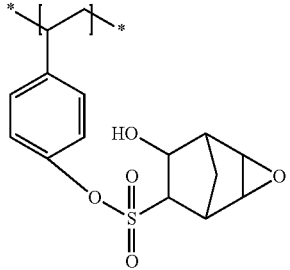
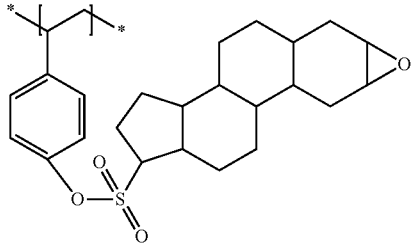
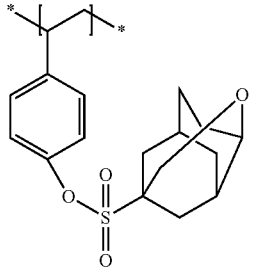
60
-continued
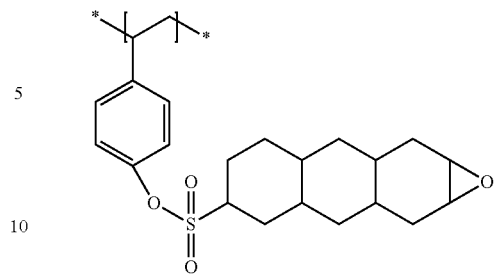
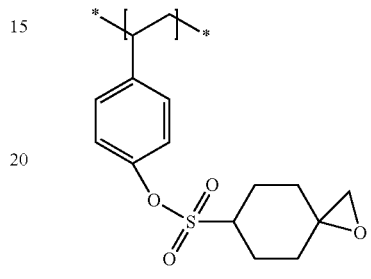
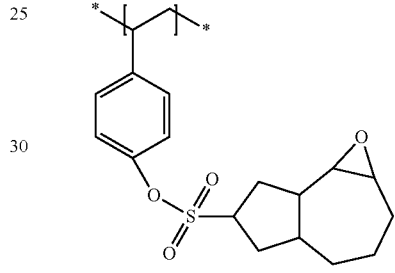
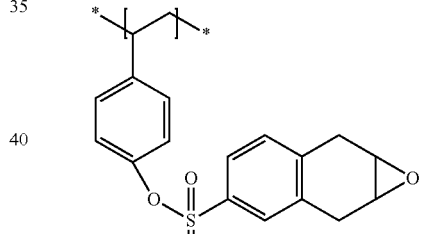
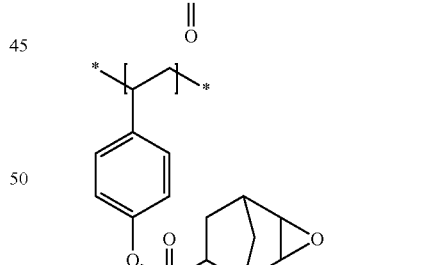
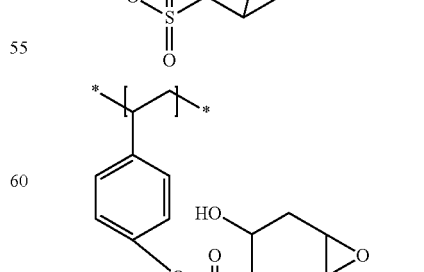

61
-continued
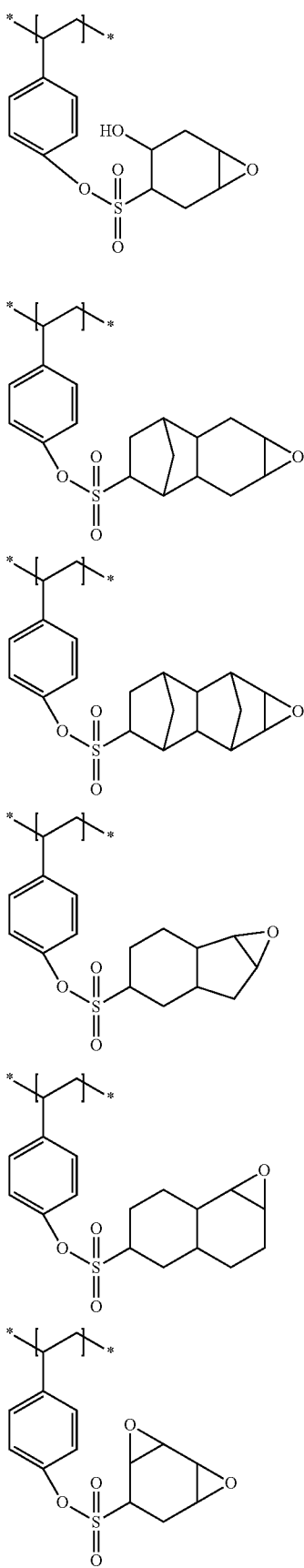
62
-continued
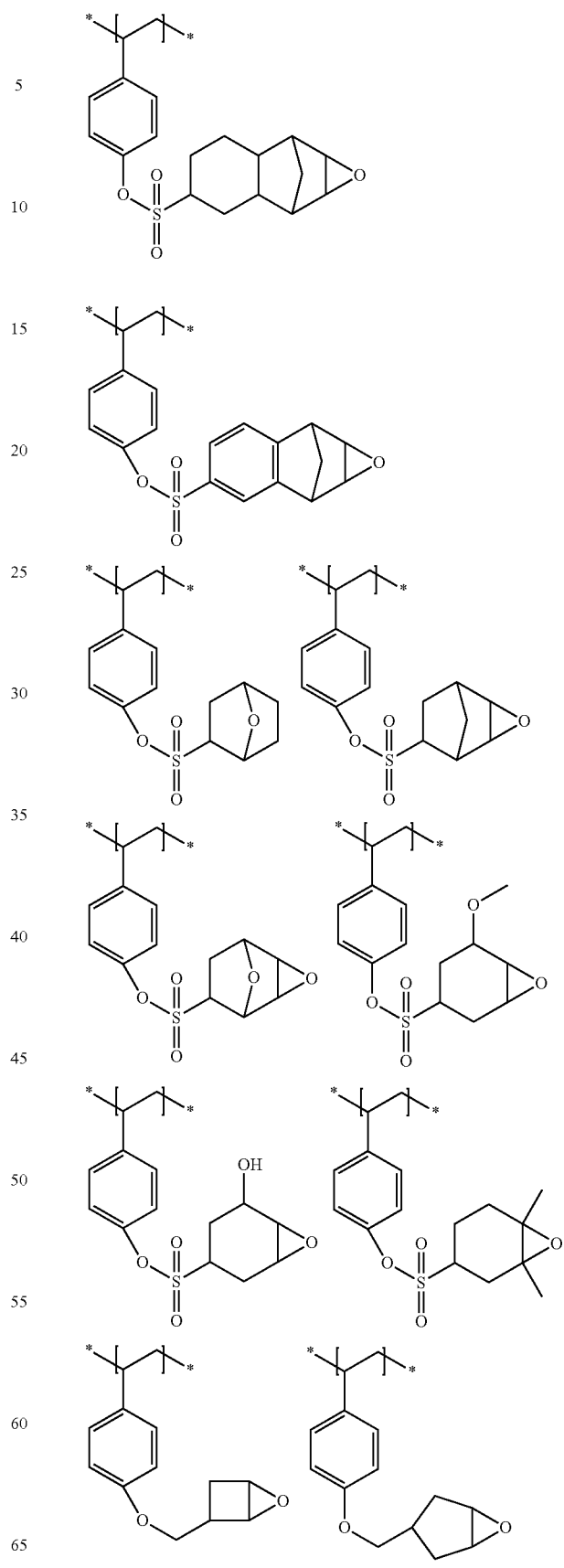

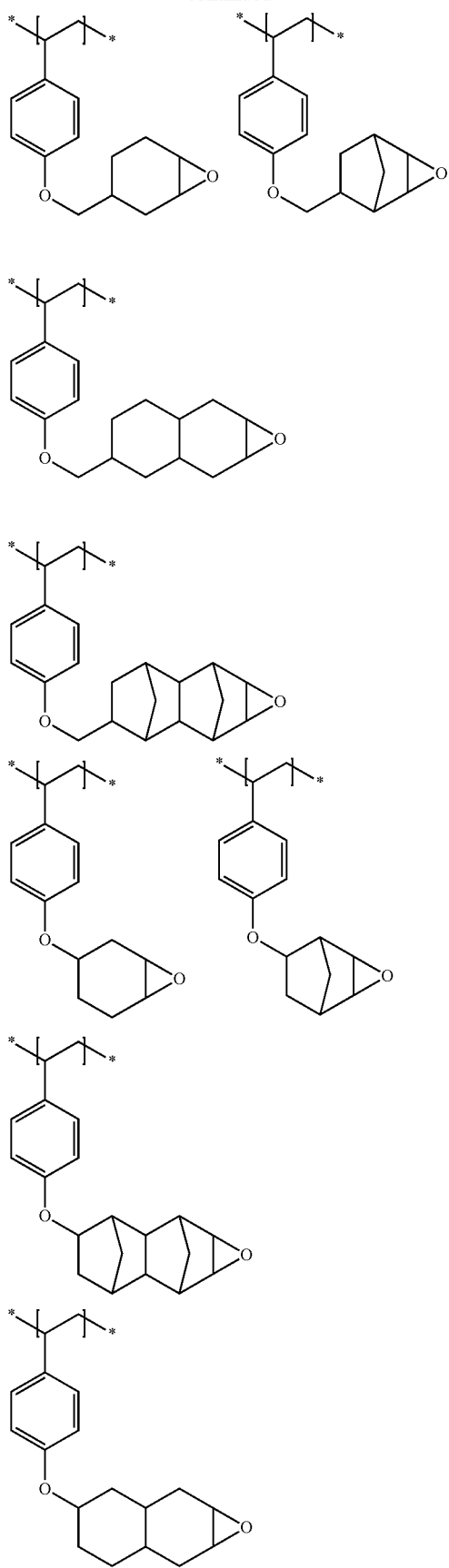
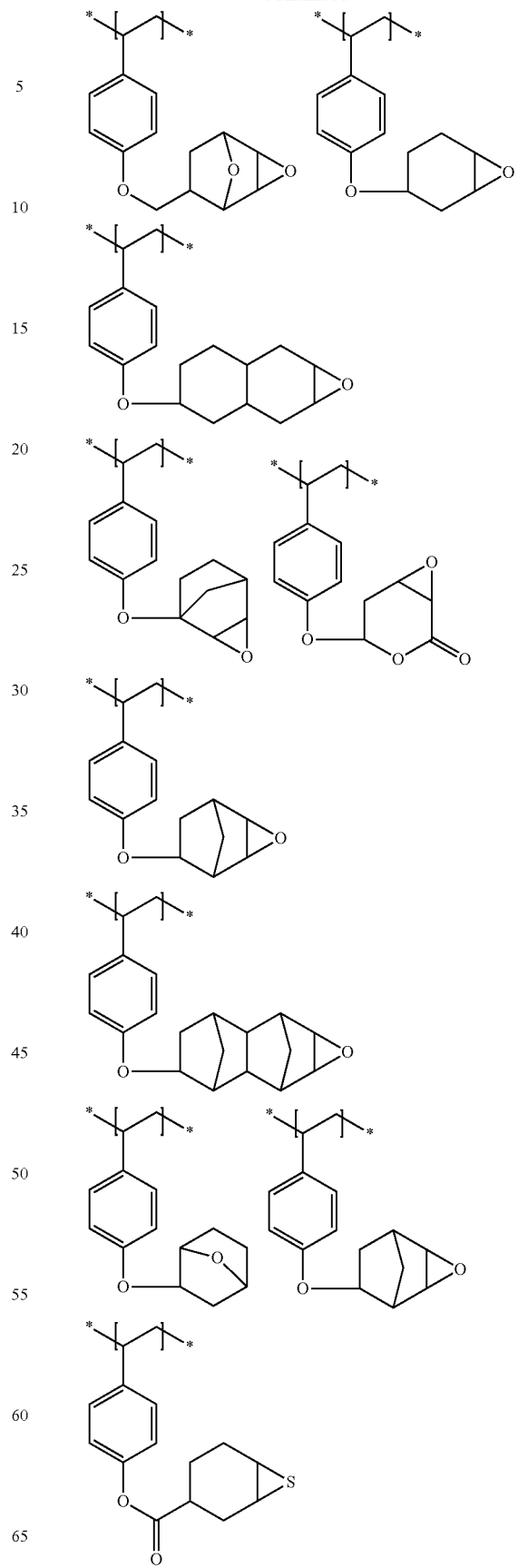

65
-continued
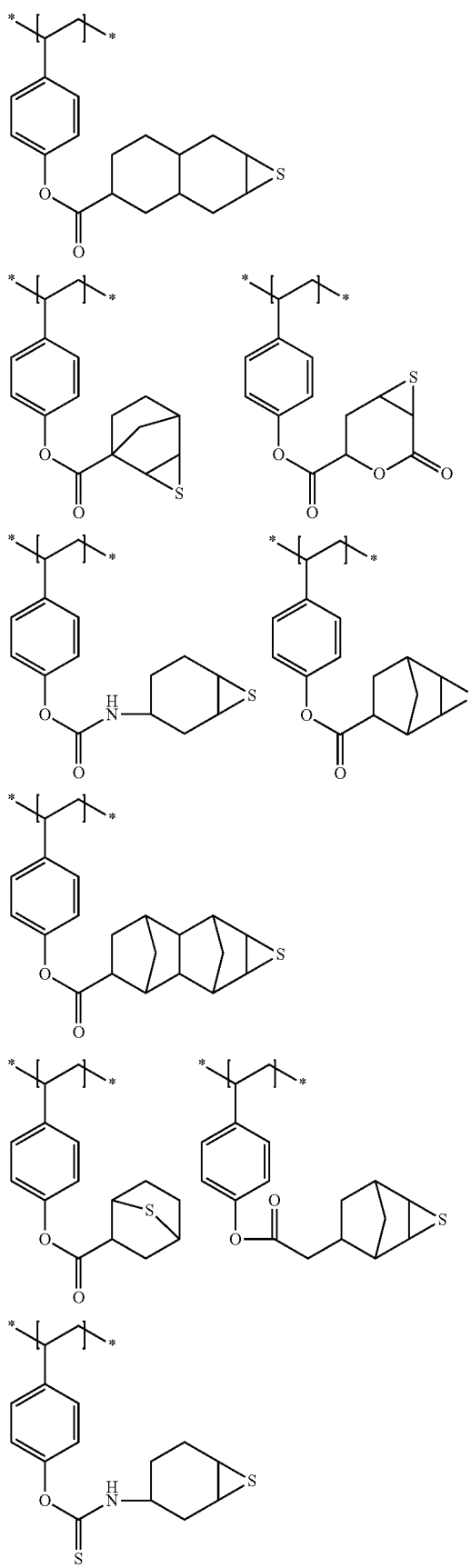
66
-continued
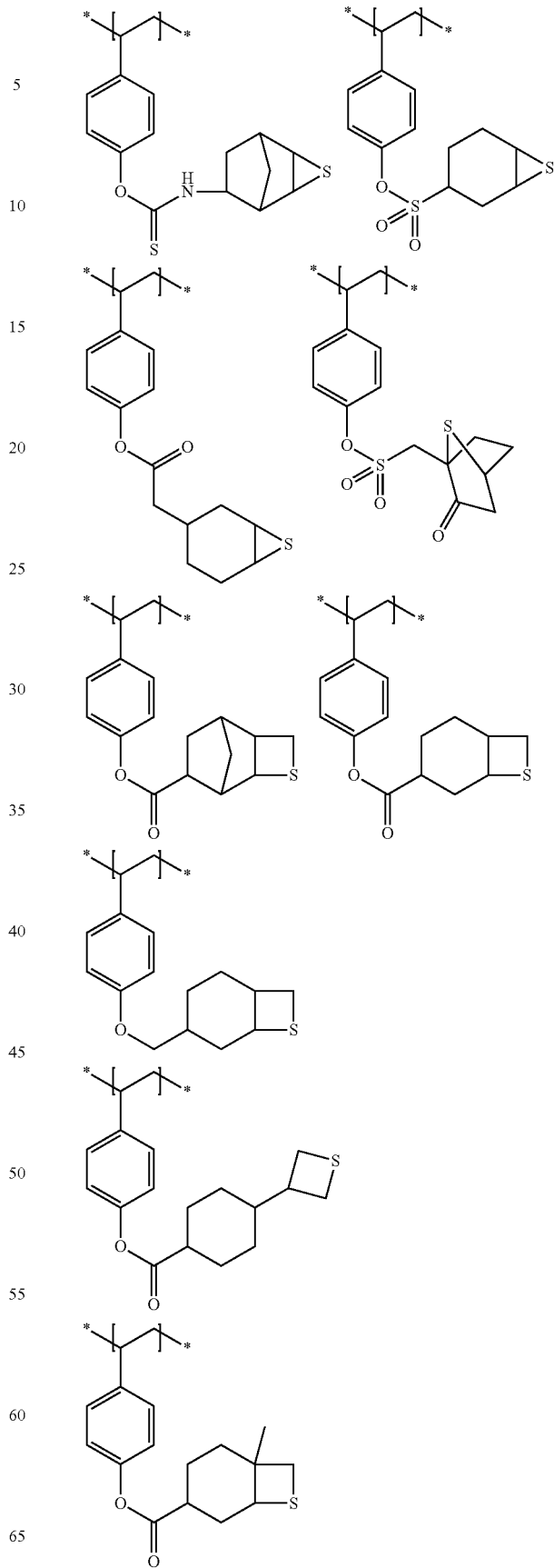

67
-continued
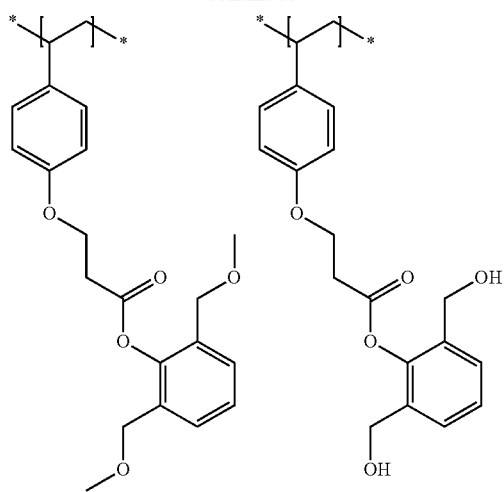
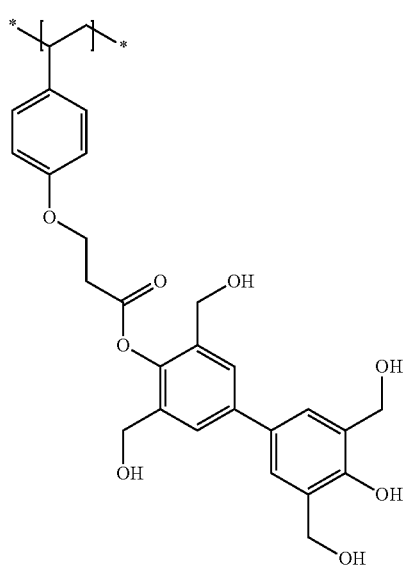
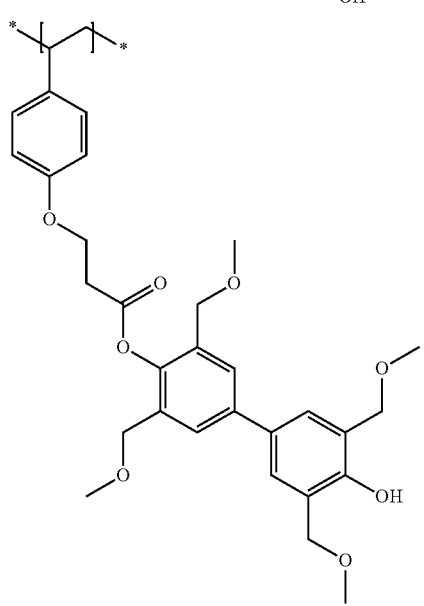
68
-continued
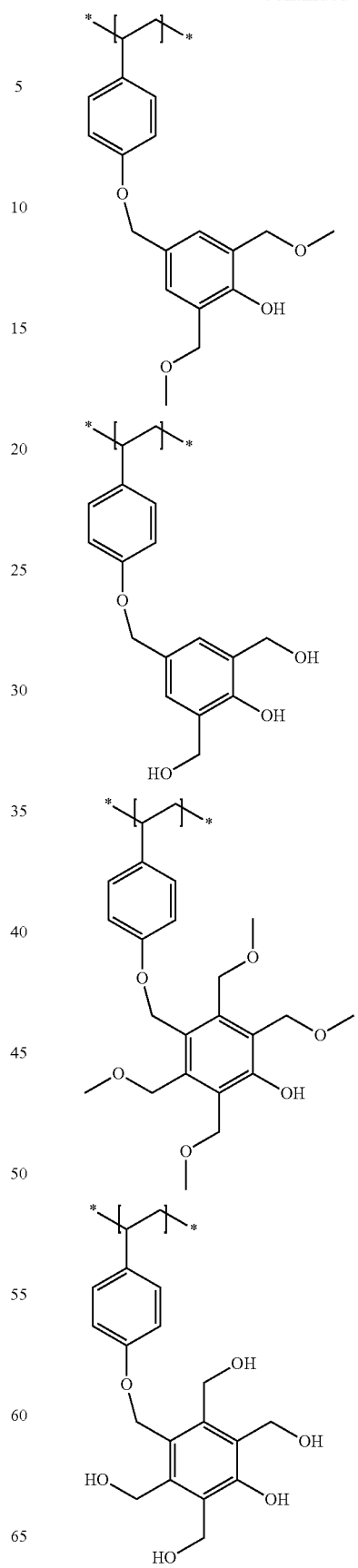

69
-continued
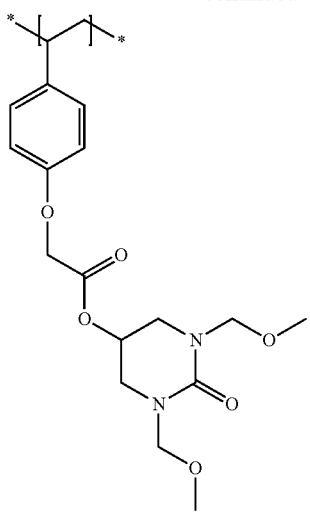
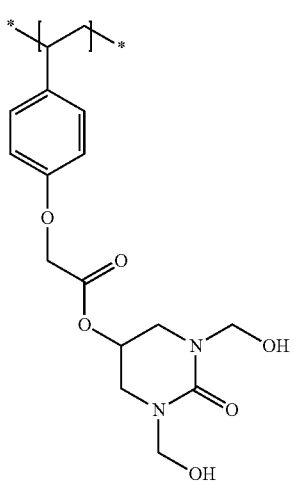
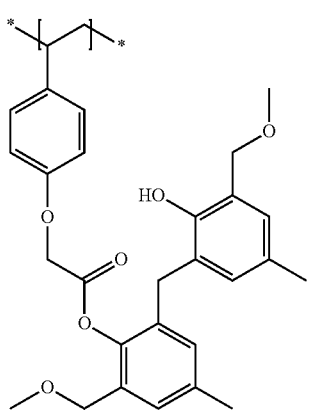
70
-continued
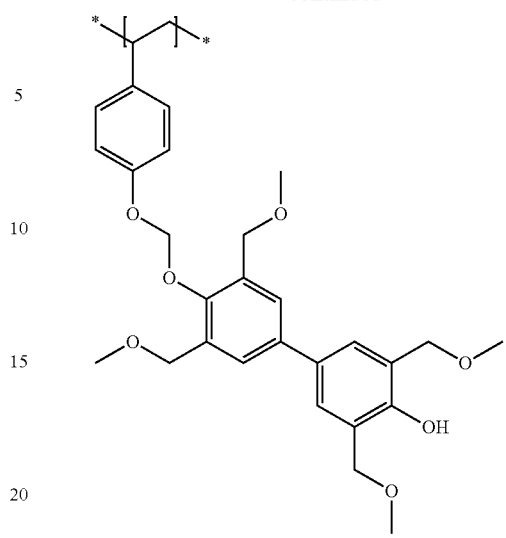
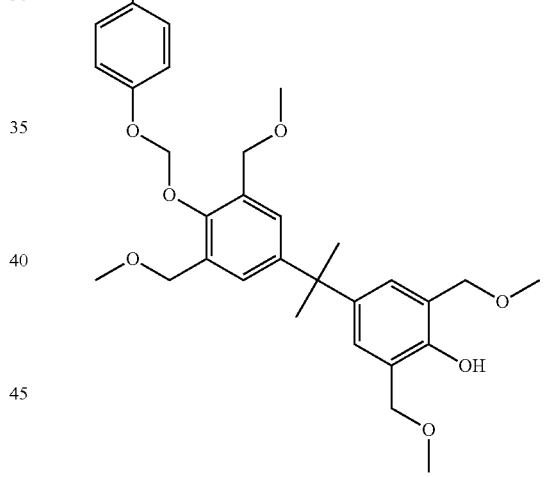
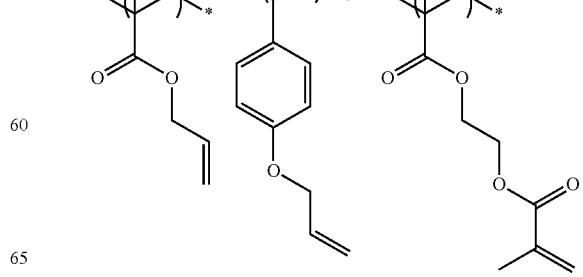

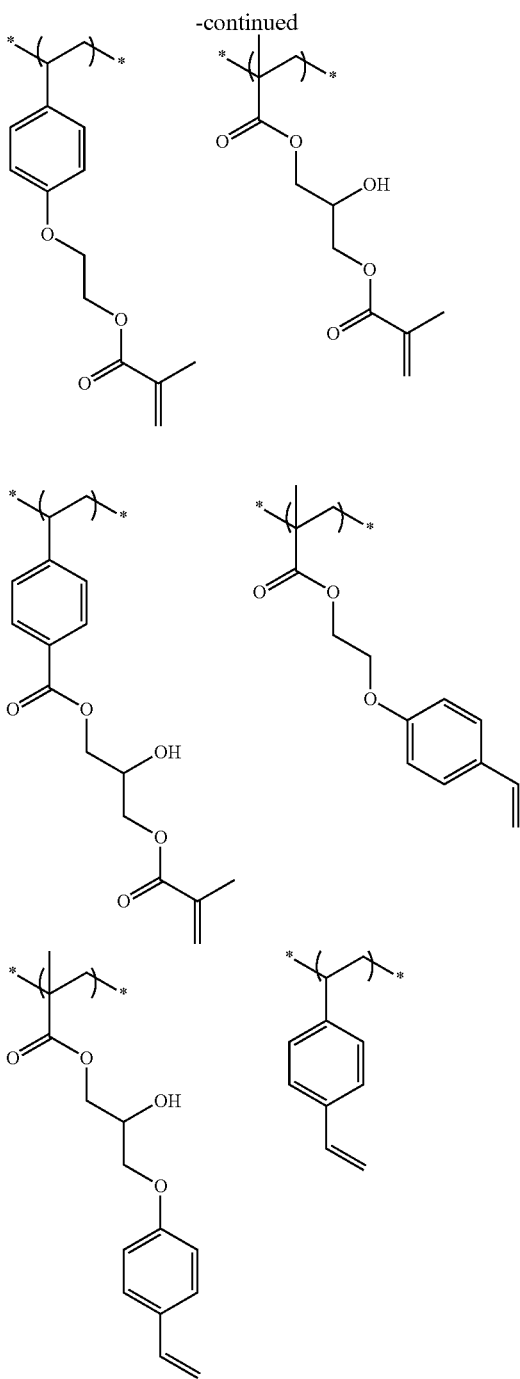

In the repeating unit (IB) represented by the above-described Formula (IB), $R^{1b}$ represents a hydrogen atom, a halogen atom, or an alkyl group. The halogen atom or the alkyl group has the same definition as that for the halogen atom or the alkyl group of $R^{1a}$ and preferable ranges thereof are the same as those of the halogen atom or the alkyl group of $R^{1a}$.

$L^{1b}$ represents a single bond or a linking group. Among these, a single bond is preferable.

The linking group is not particularly limited and has the same definition as that for the linking group of $L^{1a}$. Further, preferred examples thereof include a group obtained by combining groups described below. That is, a group which has $R^{1b}$ and includes a carbonyl group bonded to a carbon atom constituting the main chain is preferable and a group that includes a —C(=O)—O-group (carbonyloxy group) is more preferable. As the group including a —C(=O)—O-group, a —C(=O)—O-$L^{2b}$-group is exemplified. Here, as $L^{2b}$, a -alkylene group- and a -alkylene group-O—C(=O)-alkylene group are exemplified, and the number of carbon atoms of the alkylene group is preferably in a range of 1 to 4 and a methylene group or an ethylene group is particularly preferable.

$Y^B$ represents a decomposable group or a hydrogen atom, and a decomposable group is preferable from the viewpoint of heat stability.

A decomposable group can be used without being particularly limited as long as the group can be decomposed or dissociated (deprotected) from a carboxy group by an acid, heat, or an acid and heat. Examples of a group which is easily and relatively decomposed by an acid or the like include groups which are capable of forming a carboxylic acid acetal group together with a carboxy group such as an ester structure, a cyclic ether group (for example, a tetrahydropyranyl group or a tetrahydrofuranyl group), and al alkoxymethyl group. Further, groups which are relatively and unlikely to be decomposed by an acid or the like can be used and examples thereof include a group (for example, a tertiary alkyl group such as a tert-butyl group or a tertiary cycloalkyl group such as a 1-alkyl (preferably methyl, ethyl, or butyl)-1-cyclohexyl group) which is capable of forming tertiary alkyl ester together with a carboxy group and a group which is capable of forming a tertiary alkyl carbonate group (such as a tert-butyl carbonate group) together with a carboxy group.

Among these, as $Y^B$, a group which is capable of forming a carboxylic acid acetal group together with a carboxy group is preferable and a group represented by the following Formula (Y-1) is preferable.

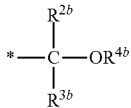

Formula (Y-1)

In Formula (Y-1), $R^{2b}$ and $R^{4b}$ each independently represent a monovalent organic group and $R^{3b}$ represents a hydrogen atom or a monovalent organic group.

The monovalent organic group is not particularly limited, and examples thereof include an alkyl group, a cycloalkyl group, an aryl group, and a heteroaryl group.

The alkyl group may be linear or branched and the number of carbon atoms is preferably in a range of 1 to 12, more preferably in a range of 1 to 6, and still more preferably The content of the repeating unit (IA) is preferably in a range of 2 to 50% by mole, more preferably in a range of 3 to 50% by mole, still more preferably in a range of 5 to 30% by mole, and particularly preferably in a range of 10 to 20% by mole with respect to all repeating units of the polymer compound. In this manner, a gate insulating layer which has a smooth surface and exhibits excellent solvent resistance can be formed.

<Repeating Unit (IB)>

The repeating unit (IB) that forms a polymer compound will be described.

The repeating unit (IB) is a repeating unit having a protected carboxy group protected by a carboxy group or a decomposable group in the side chain thereof.

in a range of 1 to 4. Specific examples thereof include methyl, ethyl, n-propyl, i-propyl, n-butyl, i-butyl, sec-butyl, tert-butyl, n-pentyl, neopentyl, n-hexyl, thexyl (2,3-dimethyl-2-butyl), n-heptyl, n-octyl, 2-ethylhexyl, n-nonyl, and n-decyl.

The number of carbon atoms of the cycloalkyl group is preferably in a range of 3 to 12, more preferably in a range of 4 to 8, and still more preferably in a range of 4 to 6. Specific examples thereof include cyclopropyl, cyclobutyl, cyclopentyl, cyclohexyl, cycloheptyl, cyclooctyl, norbornyl, and isobornyl.

The number of carbon atoms of the aryl group is preferably in a range of 6 to 12 and more preferably in a range of 6 to 10. Specific examples thereof include a phenyl group, a tolyl group, a xylyl group, a cumenyl group, and a 1-naphthyl group.

The heteroaryl group has the same definition as an aromatic heterocyclic group described below.

A monovalent organic group may include a substituent. Examples of such a substituent include the above-described substituents T, and an aryloxy group. Among these, a halogen atom, an aryl group, an alkoxy group, and an aryloxy group are preferable.

Examples of the halogen atom include a fluorine atom, a chlorine atom, a bromine atom, and an iodine atom. Among these, a fluorine atom or a chlorine atom is preferable. An alkyl group substituted with a halogen atom is referred to as a haloalkyl group.

The number of carbon atoms of the aryl group is preferably in a range of 6 to 20 and more preferably in a range of 6 to 12. Specific examples thereof include a phenyl group, an α-methylphenyl group, and a naphthyl group. Examples of the alkyl group substituted with an aryl group, that is, an aralkyl group include a benzyl group, an α-methylbenzyl group, a phenethyl group, and a naphthylmethyl group.

The number of carbon atoms of the alkoxy group is preferably in a range of 1 to 6 and more preferably in a range of 1 to 4, and a methoxy group or an ethoxy group is more preferable.

The number of carbon atoms of the aryloxy group is preferably in a range of 6 to 20 and more preferably in a range of 6 to 12, and specific examples thereof include a phenoxy group and a naphthyloxy group.

In a case where a monovalent organic group is a cycloalkyl group, the cycloalkyl group may include a linear or branched alkyl group having 1 to 10 carbon atoms as a substituent. In a case where a monovalent organic group is a linear or branched alkyl group, the alkyl group may include a cyclic alkyl group having 3 to 12 carbon atoms as a substituent. These substituents may further be substituted with the above-described substituents.

It is preferable that $R^{2b}$ represents an alkyl group and particularly preferable that $R^{2b}$ represents a methyl group. It is preferable that $R^{3b}$ represents a hydrogen atom. It is more preferable that $R^{4b}$ represents an alkyl group and particularly preferable that $R^{4b}$ represents an n-butyl group.

It is preferable that the repeating unit (IB) having a carboxy group protected by the decomposable group $Y^B$ represented by the above-described Formula (Y-1) is a repeating unit (IB-1) represented by the following Formula (IB-1). In the following Formula (IB-1), the symbol "*" represents a bonding position of the repeating unit (IB-1).

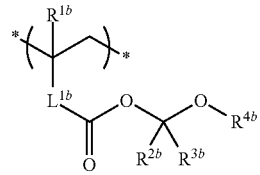

Formula (IB-1)

In Formula (IB-1), $R^{1b}$ represents a hydrogen atom, a halogen atom, or an alkyl group and has the same definition as that for $R^{1b}$ of the above-described Formula (IB). Further, preferable ranges thereof are the same as those of $R^{1b}$ of Formula (IB).

$L^{1b}$ represents a single bond or a linking group and has the same definition as that for $L^{1b}$ of the above-described Formula (IB). Further, preferable ranges thereof are the same as those of $L^{1b}$ of Formula (IB).

$R^{2b}$ and $R^{4b}$ each independently represent a monovalent organic group; $R^{3b}$ represents a hydrogen atom or a monovalent organic group; and $R^{2b}$ to $R^{4b}$ respectively have the same definitions as those for $R^{2b}$ to $R^{4b}$ of the above-described Formula (Y-1) and preferable ranges thereof are the same as those of $R^{2b}$ to $R^{4b}$ of the above-described Formula (Y-1).

In Formulae (Y-1) and (IB-1), $R^{2b}$, $R^{3b}$, and $R^{4b}$ may be bonded to each other to form a ring structure together with a carbon atom to which $R^{2b}$, $R^{3b}$, and $R^{4b}$ are bonded. Examples of the ring structure to be formed include cyclobutyl, cyclopentyl, cyclohexyl, a cycloheptyl group, tetrahydrofuranyl, adamantyl, and tetrahydropyranyl.

In a case where a ring structure is formed, it is preferable that $R^{2b}$ or $R^{3b}$ and $R^{4b}$ are bonded to each other to form cyclic ether together with a carbon atom to which $R^{2b}$ or $R^{3b}$ and $R^{4b}$ are bonded. Examples of the cyclic ether to be formed include tetrahydrofuranyl and tetrahydropyranyl. Among these, tetrahydrofuranyl is preferable.

As a repeating unit having tetrahydrofuranyl, the repeating unit (IB-2) represented by the following Formula (IB-2) is preferable. In the following Formula (IB-2), the symbol "*" represents a bonding position of the repeating unit (IB-2).

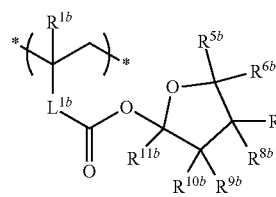

Formula (IB-2)

In Formula (IB-2), $R^{1b}$ represents a hydrogen atom, a halogen atom, or an alkyl group and has the same definition as that for $R^{1b}$ of the above-described Formula (IB). Further, preferable ranges thereof are the same as those of $R^{1b}$ of the above-described Formula (IB).

$L^{1b}$ represents a single bond or a linking group and has the same definition as that for $L^{1b}$ of the above-described Formula (IB). Further, preferable ranges thereof are the same as those of $L^{1b}$ of the above-described Formula (IB).

$R^{5b}$ to $R^{11b}$ each independently represent a hydrogen atom or a monovalent organic group and a hydrogen atom is preferable. Further, it is preferable that all of $R^{5b}$ to $R^{11b}$ represent a hydrogen atom. The monovalent organic group has the same definition as that for the monovalent organic group of the above-described Formula (Y-1), and an alkyl group and an aryl group are preferable.

In the repeating unit (IB), in a case where $L^{1b}$ represents a single bond or a group having —C(=O)—O—, examples of the constituent component which becomes the repeating unit (IB) include unsaturated carboxylic acid which has at least one carboxy group in a molecule, such as unsaturated monocarboxylic acid, unsaturated dicarboxylic acid, or unsaturated tricarboxylic acid. Examples of such a constituent component include (meth)acrylic acid, α-chloroacrylic acid, and 2-(meth)acryloyloxyethyl-succinic acid.

Examples of the unsaturated dicarboxylic acid include maleic acid, fumaric acid, itaconic acid, citraconic acid, and mesaconic acid.

Unsaturated polycarboxylic acid may be an acid anhydride thereof. Specific examples thereof include maleic anhydride, itaconic anhydride, and citraconic anhydride. Further, the unsaturated polycarboxylic acid may be mono(2-methacryloyloxyalkyl) ester of polycarboxylic acid, and examples thereof include mono(2-acryloyloxyethyl) succinate, mono(2-methacryloyloxyethyl) succinate, mono(2-acryloyloxyethyl) phthalate, and mono(2-methacryloyloxyethyl) phthalate. Further, the unsaturated polycarboxylic acid may be mono(meth)acrylate of a both-terminal dicarboxy polymer thereof, and examples thereof include ω-carboxy polycaprolactone monoacrylate and ω-carboxy polycaprolactone monomethacrylate. Moreover, acrylic acid-2-carboxyethyl ester, methacrylic acid-2-carboxyethyl ester, maleic acid monoalkyl ester, fumaric acid monoalkyl ester, or 4-carboxystyrene can be used as the unsaturated carboxylic acid.

Among these, it is preferable to use anhydride of (meth)acrylic acid, 2-(meth)acryloyloxyethyl-succinic acid, 2-(meth)acryloyloxyethyl-phthalic acid, or unsaturated polycarboxylic acid.

Specific examples of the repeating unit (IB) represented by Formula (IB) are described below, but the present invention is not limited thereto. Further, $R^{1b}$ represents a hydrogen atom, a halogen atom, or an alkyl group. In the repeating units described below, the symbol "*" represents a bonding position of the repeating unit (IB).

The specific examples described below may include substituents T.

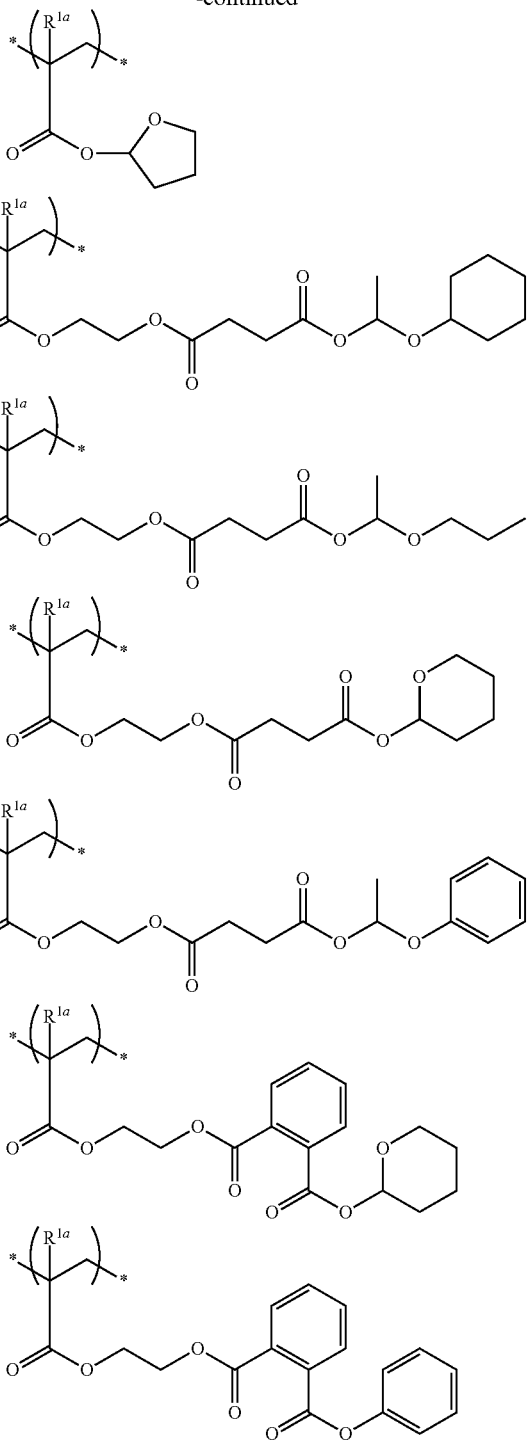

The content of the repeating unit (IB) is preferably in a range of 30 to 98% by mole, more preferably in a range of 40 to 95% by mole, and still more preferably in a range of 50 to 90% by mole with respect to all repeating units of the polymer compound. In this manner, a gate insulating layer which has a smooth surface and exhibits excellent solvent resistance can be formed.

<Other Repeating Units>

The polymer compound may include other repeating units other than the repeating unit (IA) and the repeating unit (IB).

Further, in addition to the polymer compound, polymers formed of other repeating units may be included in the range of the present invention.

Constituent components which become other repeating units are not particularly limited and examples thereof include a styrene compound, (meth)acrylic acid alkyl ester, (meth)acrylic acid cycloalkyl ester, (meth)acrylic acid aryl ester, unsaturated dicarboxylic acid diester, a bicyclo unsaturated compound, a maleimide compound, an unsaturated aromatic compound, a conjugated diene compound, unsaturated monocarboxylic acid, unsaturated dicarboxylic acid, an unsaturated dicarboxylic anhydride, and other unsaturated compounds. Other repeating units may be used alone or in combination of two or more kinds thereof.

Specific examples thereof include styrene, methylstyrene, hydroxystyrene, α-methylstyrene, acetoxystyrene, methoxystyrene, ethoxystyrene, chlorostyrene, methyl vinyl benzoate, ethyl vinyl benzoate, 4-hydroxybenzoic acid (3-methacryloyloxy propyl) ester, (meth)acrylic acid, methyl (meth)acrylate, ethyl (meth)acrylate, n-propyl (meth)acrylate, isopropyl (meth)acrylate, n-butyl (meth)acrylate, hydroxy ethyl (meth)acrylate, 2-hydroxypropyl (meth)acrylate, benzyl (meth)acrylate, isobornyl (meth)acrylate, (meth)acryloyl morpholine, N-cyclohexyl maleimide, acrylonitrile, and ethylene glycol monoacetoacetate mono(meth)acrylate. Other examples thereof include compounds described in paragraphs [0021] to [0024] of JP2004-264623A and the contents of which are incorporated in the specification of the present application.

The above-described styrene compound and a group having an aliphatic cyclic skeleton are preferable as other repeating units since they do not have a functional group trapping electrons. The group having an aliphatic cyclic skeleton may be a group having a structure of an aliphatic monocycle or polycycle (any of a fused ring, a bridged ring, and a spiro ring), and examples thereof include dicyclopentanyl (meth)acrylate, cyclohexyl (meth)acrylate, isobornyl (meth)acrylate, and benzyl (meth)acrylate.

From the viewpoint of adhesiveness, (meth)acrylic acid alkyl ester is preferable as other repeating unit. Among the examples described above, methyl (meth)acrylate is more preferable.

In a case where the polymer compound includes other repeating units described above, the content of other repeating units in the polymer compound is preferably in a range of 1 to 30% by mole, more preferably in a range of 1 to 20% by mole, and still more preferably in a range of 2 to 10% by mole with respect to all repeating units constituting the polymer compound.

<Polymer Compound>

The polymer compound includes the repeating unit (IA) and the repeating unit (IB), but may include a polymer that includes the repeating unit (IA) and does not include the repeating unit (IB) or a polymer that includes the repeating unit (IB) and does not include the repeating unit (IA).

Moreover, in the present invention, the polymer compound may be a mixture of a polymer that includes the repeating unit (IA) and does not include the repeating unit (IB) with a polymer that includes the repeating unit (IB) and does not include the repeating unit (IA).

It is preferable that the polymer compound is synthesized by modifying a group having a crosslinkable group X, for example, a $-L^{2a}-(X)m2a$ group with a polymer synthesized according to a radical polymerization method, a living radical polymerization method, or a living anionic polymerization method using a polymer reaction.

Particularly, in a case where the crosslinkable group X includes oxirane and oxetane, it is preferable that the polymer compound is synthesized by modifying a group having a polycyclic structure with an alkene with a polymer synthesized according to a radical polymerization method or a living radical polymerization method using a polymer reaction and then performing oxidation with an oxidant (such as hydrogen peroxide water, mCPBA, or the like).

Moreover, a dissociable group $Y^B$ can be introduced in conformity with a typical method of protecting a carboxy group.

The weight-average molecular weight (Mw) of the polymer compound used in the present invention is preferably in a range of 1000 to 200000, more preferably in a range of 2000 to 100000, and particularly preferably in a range of 2000 to 50000.

The dispersity (molecular weight distribution) (Mw/Mn) of the polymer compound is preferably in a range of 1.0 to 5.0 and more preferably in a range of 1.5 to 3.5. According to living polymerization such as living anionic polymerization, the dispersity of the polymer compound becomes uniform, which is preferable. The weight-average molecular weight and the dispersity of the polymer compound are defined as values in terms of polystyrene using GPC measurement. In the present specification, the weight-average molecular weight (Mw) and the number average molecular weight (Mn) can be acquired using HLC-8120 (manufactured by TOSOH CORPORATION), TSK gel Multipore HXL-M (manufactured by TOSOH CORPORATION, 7.8 mmID×30.0 cm) as a column, and tetrahydrofuran (THF) as an eluent.

Specific examples of the polymer compound having the repeating unit (IA) and the repeating unit (IB) are described below, but the present invention is not limited thereto. Further, the specific examples include examples of combinations of the repeating unit (IA) and the repeating unit (IB) as well as examples of each repeating unit. In the following specific examples, the symbol "*" represents respective bonding positions of repeating units.

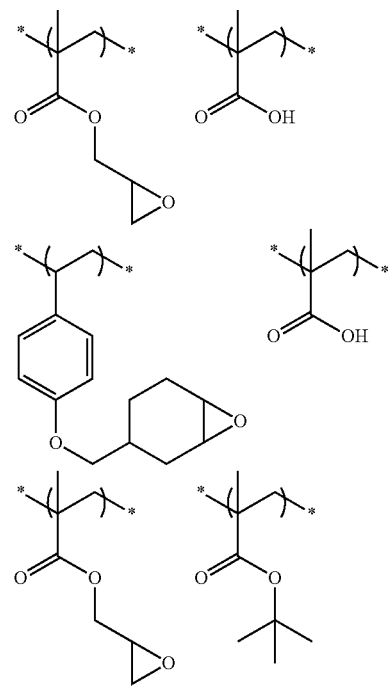

79
-continued
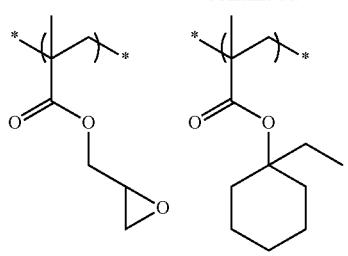
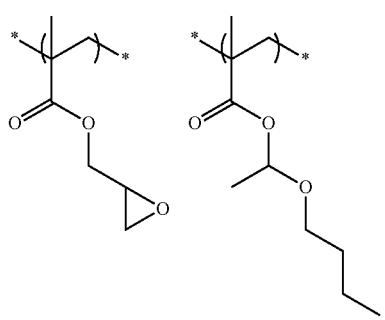
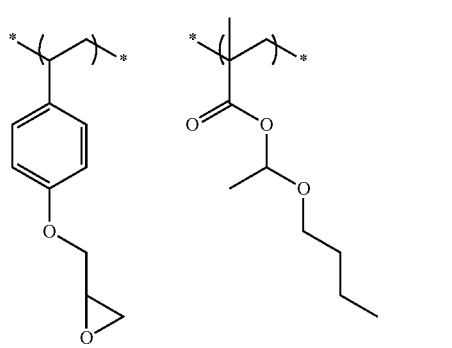
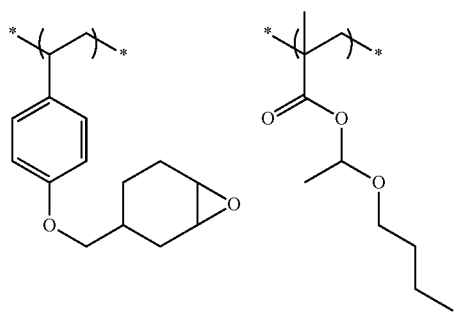
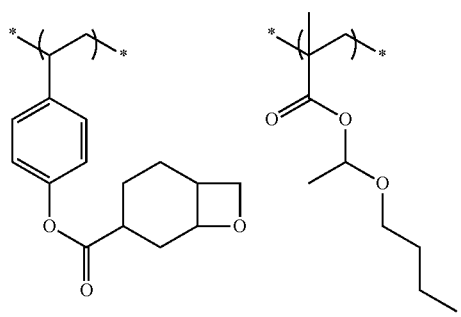
80
-continued
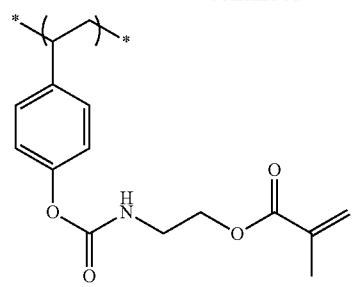
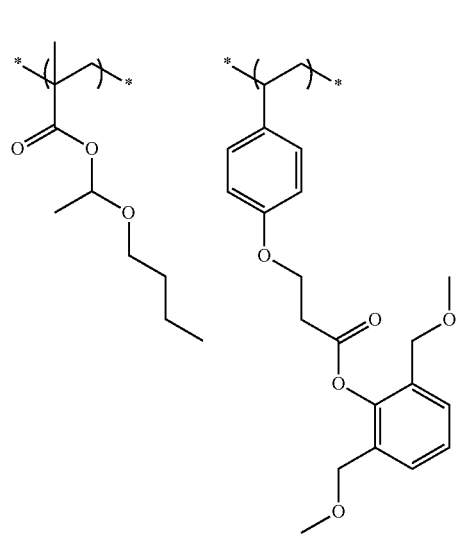
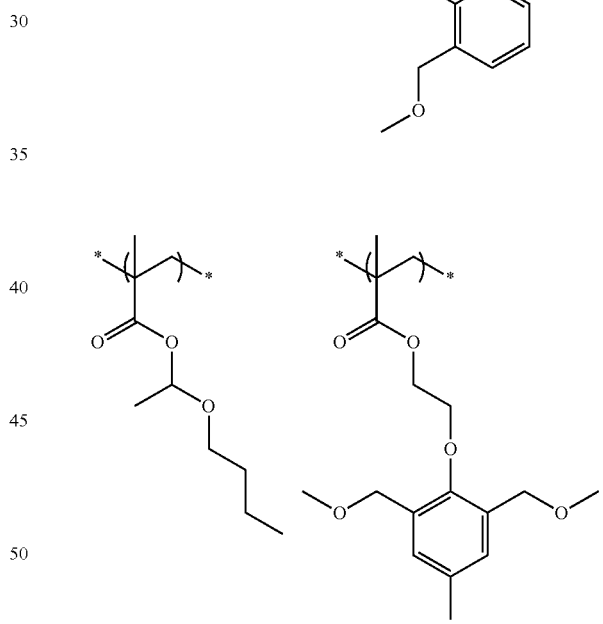
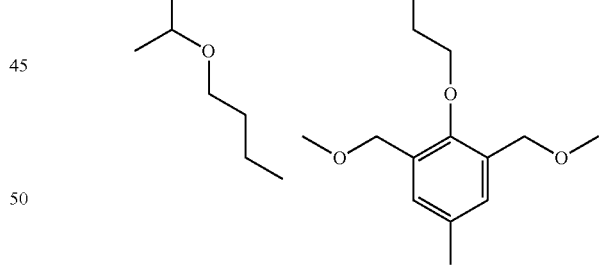
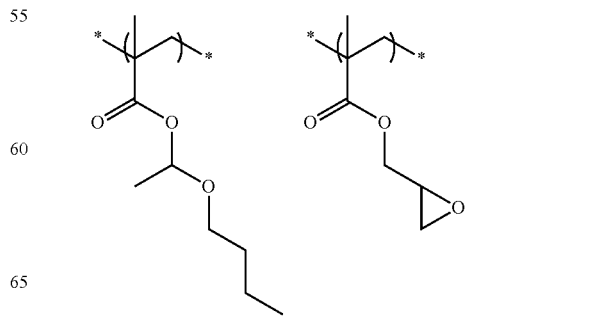

81
-continued
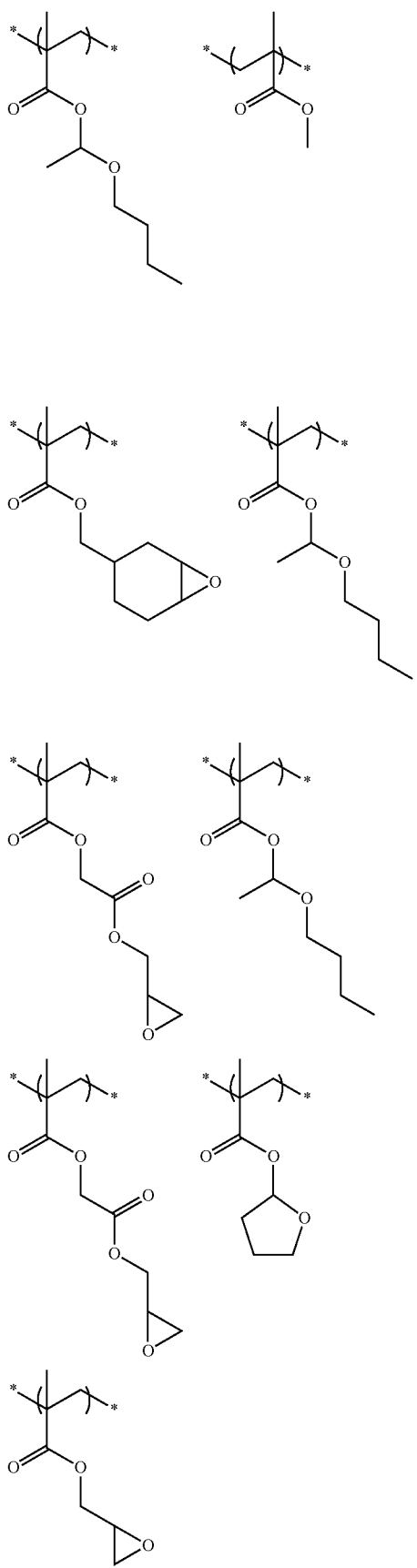
82
-continued
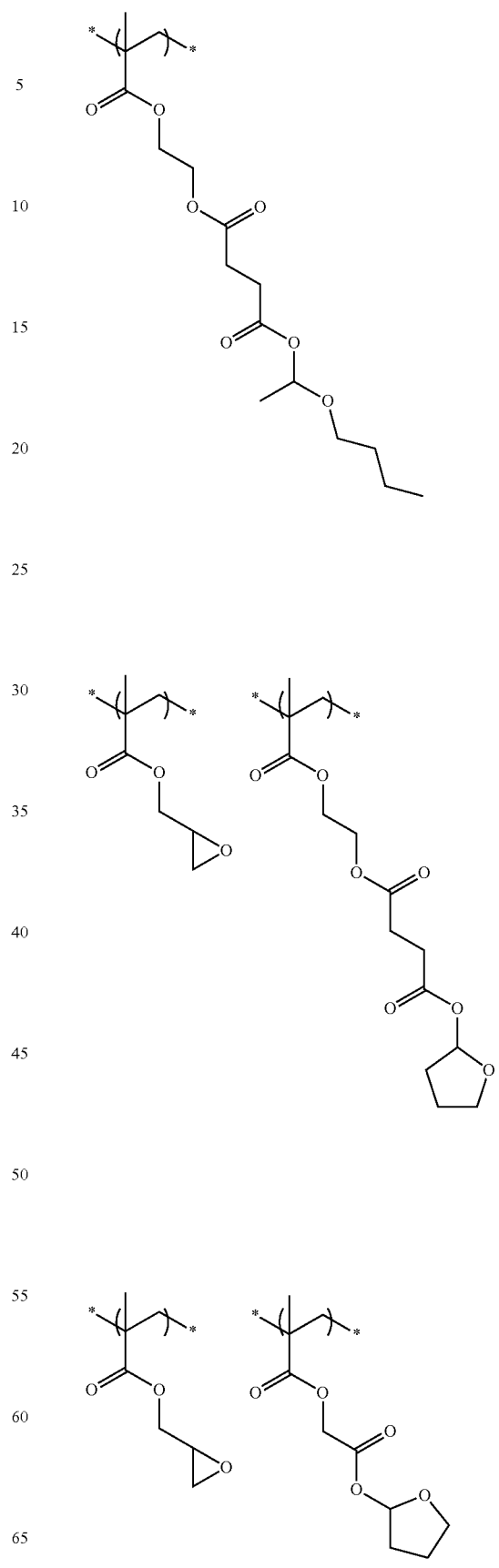

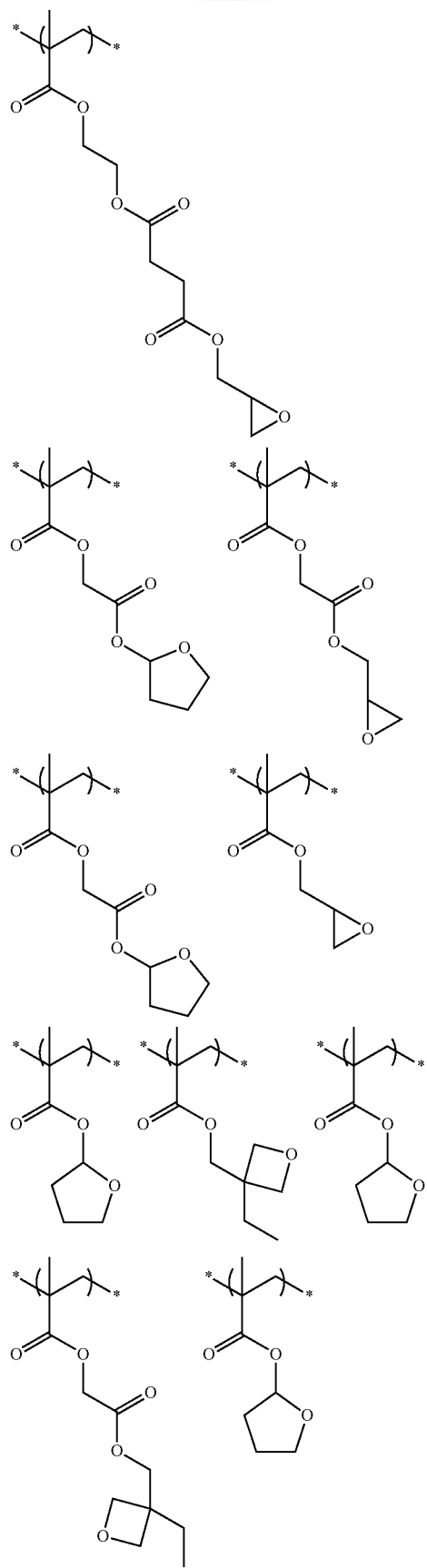
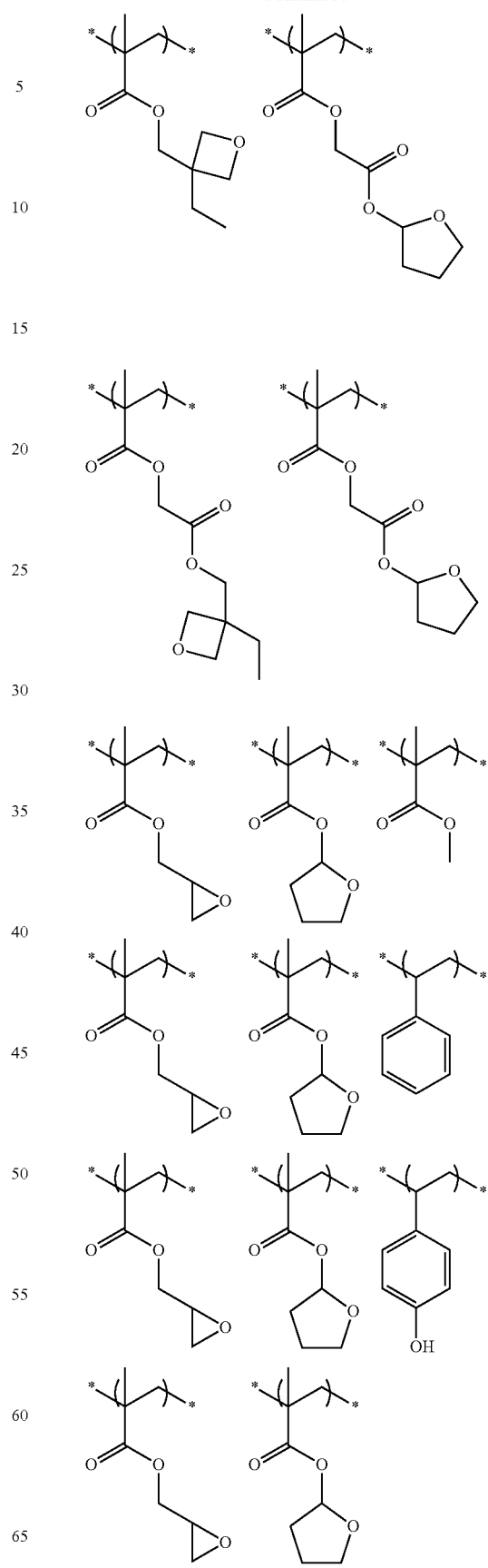

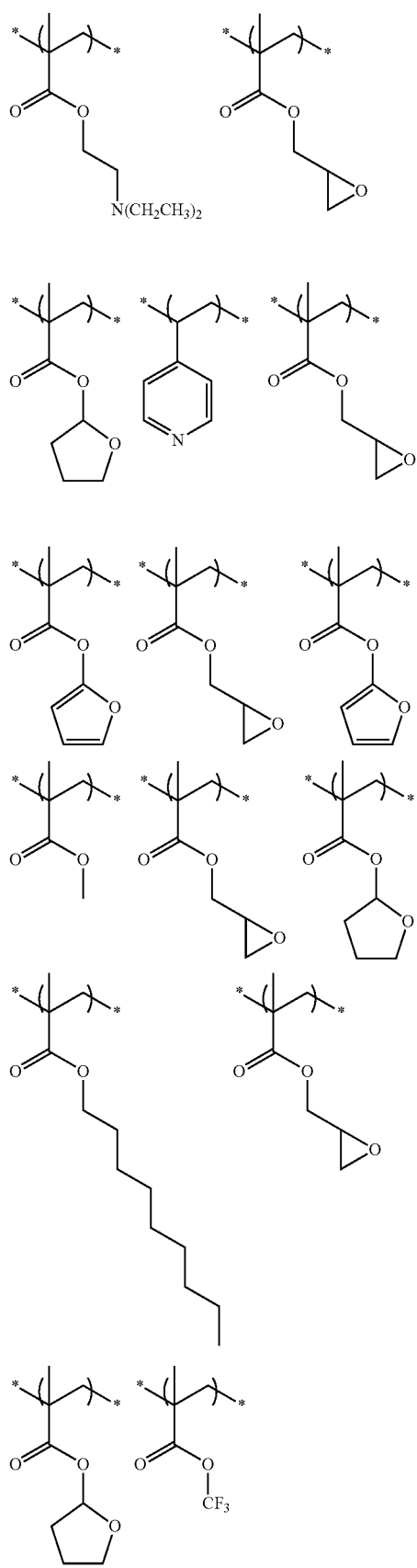
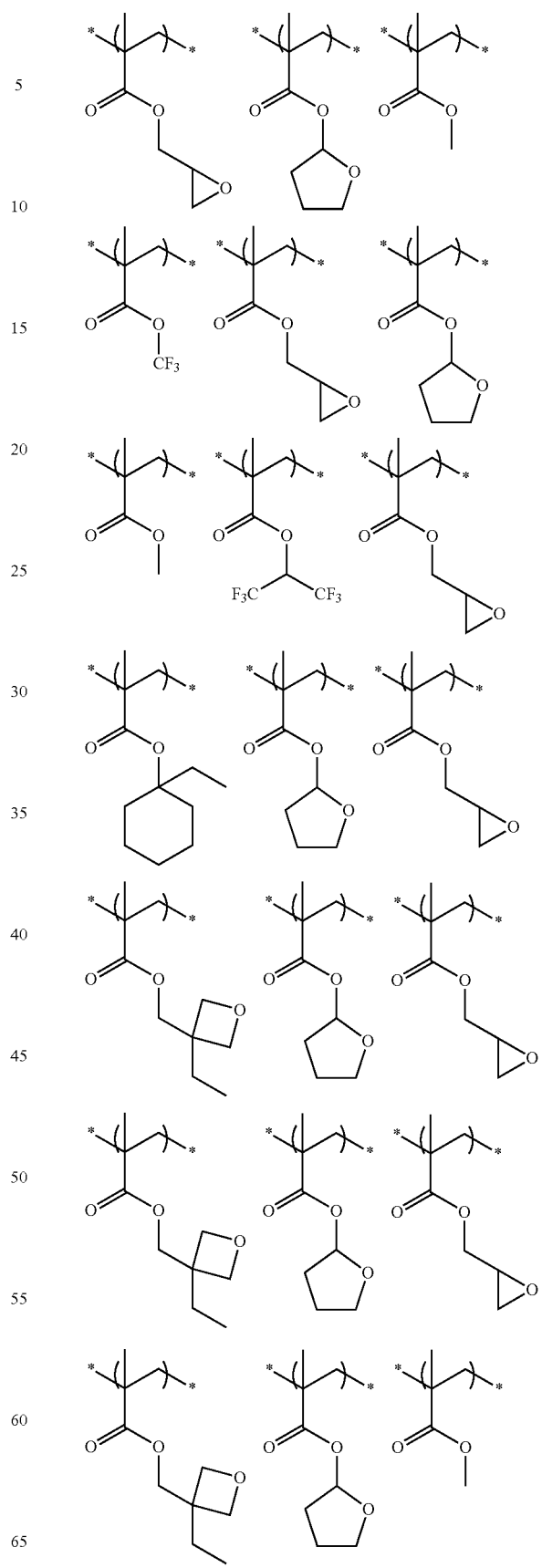

-continued

<Crosslinked Product>

According to an embodiment of the present invention, the polymer compound may be crosslinked by a crosslinking agent contained in an insulating layer-forming composition. When crosslinked by a crosslinking agent, the solvent resistance and insulation resistance of the gate insulating layer are improved. In this case, the crosslinked product of the polymer compound is a crosslinked product of the repeating unit (IA) and the repeating unit (IB) or a crosslinked product of at least one repeating unit and a crosslinking agent.

As the crosslinking agent which can be used in the present invention, a crosslinking agent having a functional group that reacts with at least one repeating unit may be exemplified. The crosslinking type is not particularly limited, and acid crosslinking, cationic polymerization, or radical polymerization can be used. Specifically, a compound containing a methylol group (referred to as a methylol compound), an epoxy compound, an oxetanyl compound, a (meth)acrylic acid ester compound, or a styrene compound can be used.

The number of functional groups in the crosslinking agent is not particularly limited, but preferably in a range of 2 to 6 because the crosslinking degree increases as the number of functional groups is larger.

As the methylol compound, a compound (C) including two or more hydroxymethyl groups or alkoxymethyl groups in a molecule is preferable.

Preferred examples of such a compound (C) include a hydroxymethylated or alkoxymethylated phenol compound, an alkoxymethylated melamine-based compound, alkoxymethyl glycoluril-based compounds, and an alkoxymethylated urea-based compound. Particularly preferred examples of the compound (C) include a phenol derivative which has 3 to 5 benzene rings in a molecule, two or more hydroxymethyl groups or alkoxymethyl groups, and has a molecular weight of 1200 or less; and a melamine-formaldehyde derivative and an alkoxymethyl glycoluril derivative which include at least two free N-alkoxymethyl groups.

As the alkoxymethyl group, a methoxymethyl group or an ethoxymethyl group is preferable.

Among the compounds (C), a phenol derivative having a hydroxymethyl group can be obtained by causing a reaction between a phenol compound that does not have the corresponding hydroxymethyl group with formaldehyde in the presence of a base catalyst. Further, a phenol derivative having an alkoxymethyl group can be obtained by causing a reaction between a phenol derivative having the corresponding hydroxymethyl group with alcohol in the presence of an acid catalyst.

Among phenol derivatives synthesized in the above-described manner, a phenol derivative having an alkoxymethyl group is particularly preferable from the viewpoints of sensitivity and storage stability.

As the preferred examples of the compounds (C), it is preferable that the above-described alkoxymethylated melamine-based compound, the alkoxymethyl glycoluril-based compounds, and the alkoxymethylated urea-based compound are compounds having a N-hydroxymethyl group or a N-alkoxymethyl group.

Specific examples of such compounds include hexamethoxy methyl melamine, hexaethoxy methyl melamine, tetramethoxy methyl glycoluril, 1,3-bismethoxymethyl-4,5-bismethoxyethyleneurea, and bismethoxy methyl urea, and these compounds are disclosed in EP0,133,216A, West German Patent No. 3,634,671, West German Patent No. 3,711,264, and EP0,212,482A.

Among these crosslinking agents, particularly preferred crosslinking agents are described below.

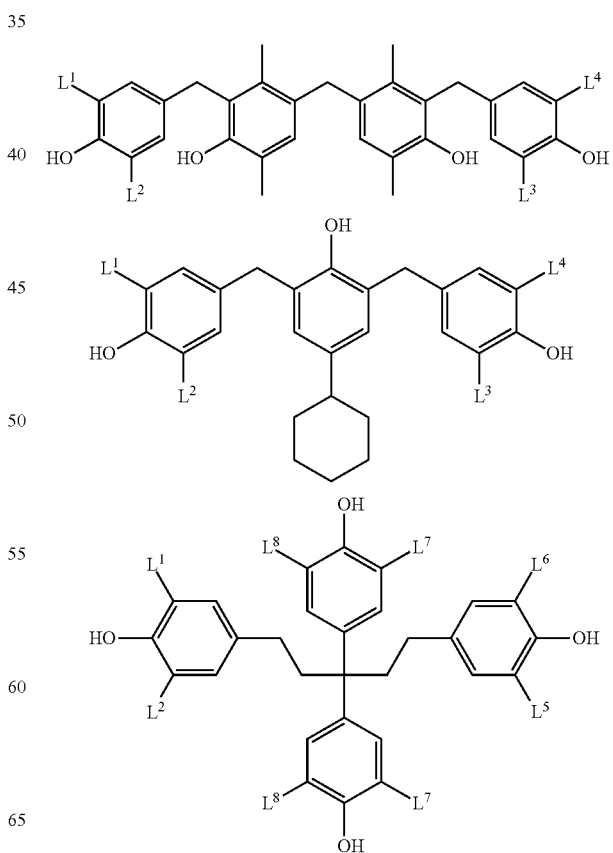

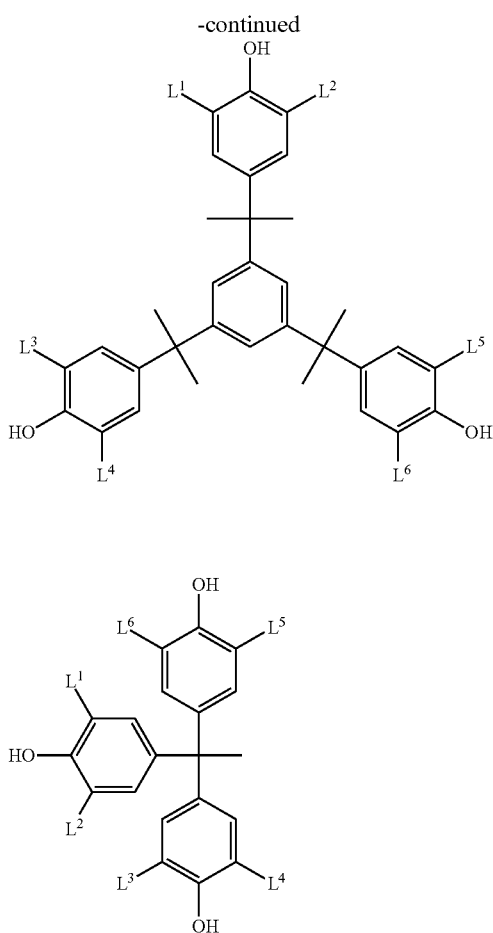

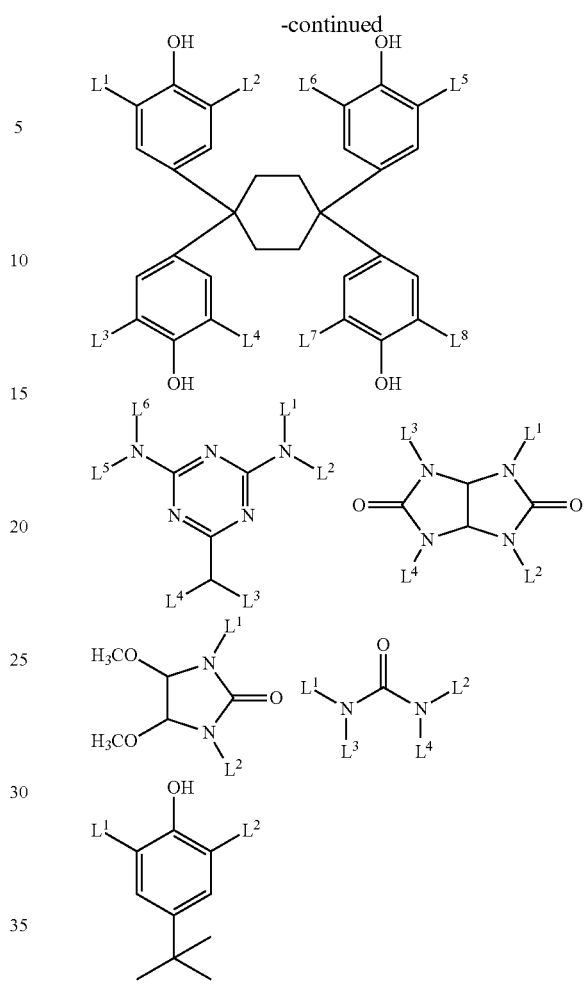

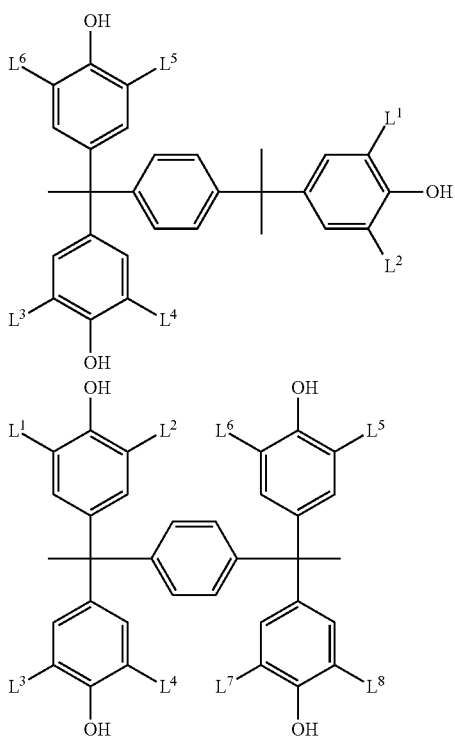

In the formulae, $L^1$ to $L^8$ each independently represent a hydrogen atom, a hydroxymethyl group, a methoxymethyl group, an ethoxymethyl group, or an alkyl group having 1 to 6 carbon atoms.

As crosslinking agents other than the methylol compound, for example, it is preferable to use compounds described in paragraphs [0046] to [0061] of JP2006-303465A, crosslinking to use compounds described in paragraphs [0046] to [0061] of JP2006-303465 crosslinking agents described in paragraphs [0032] and [0033] of JP2005-354012A, particularly a bi- or higher functional epoxy compound, and an oxetane compound, and the contents of which are incorporated in the present specification.

The crosslinking using a crosslinking agent can be performed by generating an acid or a radical using light or heat or both of these. Examples thereof include crosslinking using an acid, crosslinking using cation polymerization, and crosslinking using radical polymerization.

In a case where the crosslinking is performed by generating a radical, as a radical generator that generates a radical using light or heat, for example, a thermal polymerization initiator (H1) and a photopolymerization initiator (H2) described in the paragraphs [0182] to [0186] of JP2013-214649A, a photo-radical generator described in the paragraphs [0046] to [0051] of JP2011-186069A, and a photo-radical polymerization initiator described in the paragraphs [0042] to [0056] of JP2010-285518A can be preferably used, and it is preferable that the contents of which are incorporated in the present specification.

Moreover, it is preferable that "a compound (G) which has a number average molecular weight (Mn) of 140 to 5,000, includes a crosslinking functional group, and does not include a fluorine atom" described in the paragraphs [0167] to [0177] of JP2013-214649A is preferably used and the contents of which are incorporated in the specification of the present application.

In a case where the crosslinking is performed by generating an acid, as a photoacid generator that generates an acid using light, for example, a photocationic polymerization initiator described in the paragraphs [0033] and [0034] of JP2010-285518A, and an acid generator, particularly sulfonium salts and iodonium salts described in the paragraphs [0120] to [0136] of JP2012-163946A can be preferably used in addition to those described above, and it is preferable that the contents of which are incorporated in the present specification.

As a thermal acid generator (catalyst) that generates an acid using heat, for example, a thermal cationic polymerization initiator and particularly onium salts described in the paragraphs [0035] to [0038] of JP2010-285518A, and a catalyst and particularly sulfonic acids and sulfonic acid amine salts described in the paragraphs [0034] and [0035] of JP2005-354012A can be preferably used, and it is preferable that the contents of which are incorporated in the present specification.

<Formation of Gate Insulating Layer>

The gate insulating layer can be formed by applying the insulating layer-forming composition that contains the polymer compound having the repeating unit (IA) and the repeating unit (IB) and causing a crosslinking reaction between these repeating units.

The insulating layer-forming composition of the present invention may contain a partially crosslinked product in which the repeating units are partially crosslinked within the range not performing the object of the present invention.

In the insulating layer-forming composition of the present invention, it is necessary to avoid the presence of heat, light, and an acid for the purpose of suppressing generation of a crosslinked product of the polymer compound.

The insulating layer-forming composition may contain the crosslinking agent and the catalyst described above. In the present invention, the crosslinking agent and the catalyst may be used alone or in combination of two or more kinds thereof.

In order to improve wettability or adhesiveness of the insulating layer-forming composition to a substrate or an electrode, the insulating layer-forming composition may contain a surfactant or a coupling agent to the extent that does not impair the electrical characteristics such as insulating properties or the like.

The insulating layer-forming composition may contain a solvent. The solvent is not particularly limited, and examples thereof include ethylene glycol monomethyl ether, methyl cellosolve acetate, diethylene glycol monomethyl ether, propylene glycol, propylene glycol monomethyl ether, propylene glycol monobutyl ether, propylene glycol monomethyl ether acetate, toluene, xylene, methyl ethyl ketone, methyl isobutyl ketone, cyclohexanone, ethyl 2-hydroxypropionate, butyl acetate, ethyl lactate, butyl lactate, ethanol, 1-propanol, 2-propanol, 1-butanol, 2-butanol, and isobutanol. These organic solvents may be used alone or in combination of two or more kinds thereof.

Among these, from the viewpoint of improving levelability, propylene glycol monomethyl ether, propylene glycol monomethyl ether acetate, ethyl lactate, butyl lactate, cyclohexanone, ethanol, and 1-butanol are preferable.

The content of the polymer compound is preferably in a range of 60 to 100% by mass and more preferably in a range of 80 to 100% by mass with respect to the total solid content of the composition.

In a case where a crosslinking agent is used, the content of the crosslinking agent is preferably in a range of 1 to 40% by mass and more preferably in a range of 5 to 20% by mass with respect to the total content of the polymer compound. In this manner, it is possible to increase the crosslinking density so that the solvent resistance of the gate insulating layer is improved without degrading the carrier mobility due to an unreacted crosslinking agent.

Examples of the method of applying the insulating layer-forming composition include a spin casting method, a dipping method, a die-coating method, a slit coating method, a dropping method, a printing method such as offset, screen, or offset, and an ink-jet method. Further, it is preferable to prevent impurities from being mixed into the insulating layer-forming composition in order to maintain the surface smoothness of the obtained film and to filter the composition using a membrane filter or the like before application.

The conditions of crosslinking and hardening the insulating layer-forming composition are not particularly limited, and the crosslinking or the hardening can be carried out under conditions of heating, presence of an acid, or a combination of these. Among these, the heating is preferable. For example, the heating temperature is preferably in a range of 40° C. to 300° C. and more preferably in a range of 60° C. to 200° C. and the heating time is preferably in a range of 10 minutes to 3 hours and more preferably in a range of 5 minutes to 2 hours.

Moreover, since the polymer compound is crosslinked in a case where a crosslinking agent is used, it is preferable that the crosslinking is performed using suitable means described above. In a case where a methylol compound is used as a crosslinking agent, as the crosslinking conditions, the heating temperature is preferably in a range of 40° C. to 300° C. and more preferably in a range of 60° C. to 200° C. and the heating time is preferably in a range of 1 minute to 3 hours and more preferably in a range of 5 minutes to 2 hours. In a case where an epoxy compound or an oxetane compound is used as a crosslinking agent, it is preferable that the crosslinking is carried out under the conditions of heating.

The gate insulating layer may be subjected to a surface treatment such as a corona treatment, a plasma treatment, or a UV/ozone treatment. In this case, it is preferable not to make the surface rough due to the surface treatment. An arithmetic mean roughness Ra or a root mean square roughness $R_{MS}$ of the surface of the gate insulating layer is preferably 0.5 nm or less.

[Self-Assembled Monolayer (SAM)]

A self-assembled monolayer can be formed on the gate insulating layer.

A compound forming the self-assembled monolayer is not particularly limited as long as the compound is self-assembled. As the self-assembling compound, at least one compound represented by the following Formula 1S can be used.

$$R^{1S}\text{---}X^{S}$$ Formula 1S:

In Formula 1S, $R^{1S}$ represents any one of an alkyl group, an alkenyl group, an alkynyl group, an aryl group, an alkoxy group, an aryloxy group, and a heterocyclic group (thienyl, pyrrolyl, pyridyl, or fluorenyl).

$X^S$ represents an adsorptive or reactive substituent. Specifically, $X^S$ represents any one of ---SiX$^4$X$^5$X$^6$ group (X$^4$ represents a halide group or an alkoxy group, and X$^5$ and X$^6$ each independently represent a halide group, an alkoxy group, an alkyl group, or an aryl group. It is preferable that $X^4$, $X^5$, and $X^6$ may be the same as one another and more preferable that $X^4$, $X^5$, and $X^6$ represent a chloro group, a methoxy group, and an ethoxy group), a phosphonic acid group (—$PO_3H_2$), a phosphinic acid group (—$PRO_2H$, R represents an alkyl group), a phosphate group, a phosphorous acid group, an amino group, a halide group, a carboxy group, a sulfonic acid group, a boric acid group (—$B(OH)_2$), a hydroxy group, a thiol group, an ethynyl group, a vinyl group, a nitro group, and a cyano group.

It is preferable that $R^{1S}$ is not branched, and a structure of a linear normal alkyl (n-alkyl) group, a ter-phenyl group in which three phenyl groups are arranged in series, or an n-alkyl group being arranged on both sides of the para position of a phenyl group is preferable. In addition, an alkyl chain may have an ether bond or may have a double bond or a triple bond of carbon-carbon.

The self-assembled monolayer is formed on the gate insulating layer by forming a bond through an interaction of the adsorptive or reactive substituent $X^S$ with a reactive site (for example, a —OH group) on the surface of the corresponding gate insulating layer, adsorption, and a reaction therebetween. Since the surface of the self-assembled monolayer becomes smoother and the surface energy thereof becomes lower when the surface of the self-assembled monolayer is filled with molecules more densely, it is preferable that the compound represented by Formula 1S has a linear main skeleton and an aligned molecular length.

Preferred specific examples of the compound represented by Formula 1S include an alkyl trichlorosilane compound such as methyl trichlorosilane, ethyl trichlorosilane, butyl trichlorosilane, octyl trichlorosilane, decyl trichlorosilane, octadecyl trichlorosilane, or phenethyl trichlorosilane, an alkyl trialkoxysilane compound such as methyl trimethoxysilane, ethyl trimethoxysilane, butyl trimethoxysilane, octyl trimethoxysilane, decyl trimethoxysilane, or octadecyl trimethoxysilane, alkyl phosphonic acid, aryl phosphonic acid, alkyl carboxylic acid, an alkylboric acid group, an arylboric acid group, an alkyl thiol group, and an aryl thiol group.

The self-assembled monolayer can be formed using a method of depositing the compound on the gate insulating layer under vacuum, a method of immersing the gate insulating layer in a solution of the compound, or a Langmuir-Blodgett method. In addition, for example, the self-assembled monolayer can be formed by treating the gate insulating layer with a solution obtained by dissolving an alkyl chlorosilane compound or an alkyl alkoxysilane compound in an organic solvent at a content of 1% by mass to 10% by mass. In the present invention, the method of forming a self-assembled monolayer is not particularly limited thereto.

For example, preferred examples of a method of obtaining a denser self-assembled monolayer include methods described in Langmuir 19, 1159 (2003) and J. Phys. Chem. B 110, 21101 (2006).

Specifically, the self-assembled monolayer can be formed by immersing the gate insulating layer in a highly volatile dehydrating solvent in which the above-described compound is dispersed so that a film is formed, extracting the gate insulating layer, performing a process of reacting the above-described compound with the gate insulating layer such as annealing as needed, washing the resulting layer with a dehydrating solvent, and drying the washed layer.

The dehydrating solvent is not particularly limited, and chloroform, trichloroethylene, anisole, diethyl ether, hexane, or toluene can be used alone or in combination.

In addition, it is preferable that the film is dried in a dry atmosphere or by spraying dry gas. It is preferable that inert gas such as nitrogen is used as the dry gas. Since a dense self-assembled monolayer without aggregation or defects can be formed using such a method of producing a self-assembled monolayer, it is possible to suppress the surface roughness of the self-assembled monolayer to 0.3 nm or less.

[Semiconductor Layer]

A semiconductor layer is a layer which exhibits properties of a semiconductor and on which carriers can be accumulated.

A semiconductor layer is formed using a semiconductor material. In a case where a semiconductor layer is formed of an organic semiconductor compound (also simply referred to as an organic semiconductor), the semiconductor layer is referred to as an organic semiconductor layer. Further, in a case where a semiconductor layer is formed of an inorganic semiconductor compound (also simply referred to as an inorganic semiconductor), the semiconductor layer is referred to as an organic semiconductor layer. In the present invention, the semiconductor layer may be an organic semiconductor layer or an inorganic semiconductor layer.

The organic semiconductor and the inorganic semiconductor described below may be respectively used alone or in combination of two or more kinds thereof. Further, the organic semiconductor and the inorganic semiconductor may be used in combination.

<Organic Semiconductor Layer>

The organic semiconductor layer may be a layer that contains an organic semiconductor.

The organic semiconductor is not particularly limited, and examples thereof include an organic polymer, a derivative thereof, and a low molecular weight compound.

In the present invention, the low molecular weight compound indicates a compound other than an organic polymer and a derivative thereof, that is, a compound that does not have a repeating unit. As long as the low molecular weight compound is such a compound, the molecular weight thereof is not particularly limited. The molecular weight of the low molecular weight compound is preferably in a range of 300 to 2000 and more preferably in a range of 400 to 1000.

As the low molecular weight compound, a fused polycyclic aromatic compound may be exemplified. Examples thereof include acene such as naphthacene, pentacene(2,3,6,7-dibenzoanthracene), hexacene, heptacene, dibenzopentacene, or tetrabenzopentacene, anthradithiophene, pyrene, benzopyrene, dibenzopyrene, chrysene, perylene, coronene, terrylene, ovalene, quaterrylene, circumanthracene, a derivative in which some of these carbon atoms are substituted with atoms such as N, S, and O, a derivative (a dioxaanthanthrene-based compound including perixanthenoxanthene and a derivative thereof, triphenodioxazine, triphenodithiazine, or hexacene-6,15-quinone) in which at least one hydrogen atom bonded to the carbon atom is substituted with a functional group such as a carbonyl group, and a derivative in which the hydrogen atom is substituted with another functional group.

Further, other examples thereof include metal phthalocyanine represented by copper phthalocyanine, tetrathiapentalene and a derivative thereof, naphthalene tetracarboxylic acid diimide such as naphthalene-1,4,5,8-tetracarboxylic acid diimide, N,N'-bis(4-trifluoromethylbenzyl)naphthalene-1,4,5,8-tetracarboxylic acid diimide, N,N'-bis(1H,1H-perfluorooctyl), N,N'-bis(1H,1H-perfluorobutyl), a N,N'-dioctylnaphthalene-1,4,5,8-tetracarboxylic acid diimide derivative, or naphthalene-2,3,6,7-tetracarboxylic acid diimide, fused ring tetracarboxylic acid diimide, for example, anthracene tetracarboxylic acid diimide such as anthracene-2,3,6,7-tetracarboxylic acid diimide, fullerene such as C60, C70, C76, C78, or C84 and a derivative of these, a carbon nanotube such as single-wall nanotubes (SWNT), and dyes such as a merocyanine dye and a hemicyanine dye and a derivative of these.

Moreover, polyanthracene, triphenylene, and quinacridone are also exemplified.

In addition, examples of the low molecular weight compound include 4,4'-biphenyl dithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine (biphenyl-4,4'-diamine), tetracyanoquinodimethane (TCNQ), tetrathiafulvalene (TTF) and a derivative thereof, a tetrathiafulvalene (TTF)-TCNQ complex, a bisethylene tetrathiafulvalene (BEDTTTF)-perchloric acid complex, a BEDTTTF-iodine complex, a charge transfer complex represented by a TCNQ-iodine complex, biphenyl-4,4'-dicarboxylic acid, 1,4-di(4-thiophenylacetylenyl)-2-ethylbenzene, 1,4-di(4-isocyanophenylacetylenyl)-2-ethylbenzene, 1,4-di(4-thiophenylethynyl)-2-ethylbenzene, 2,2''-dihydroxy-1,1':4',1''-terphenyl, 4,4'-biphenyl diethanal, 4,4'-biphenyl diol, 4,4'-biphenyl diisocyanate, 1,4-diacetylenylbenzene, diethylbiphenyl-4,4'-dicarboxylate, benzo[1,2-c;3,4-c';5,6-c'']tris[1,2]dithiol-1,4,7-trithione, α-sexithiophene, tetrathiatetracene, tetraselenotetracene, tetratellurium tetracene, poly(3-alkylthiophene), poly(3-thiophene-β-ethanesulfonic acid), poly(N-alkylpyrrole), poly(3-alkylpyrrole), poly(3,4-dialkylpyrrole), poly(2,2'-thienylpyrrole), and poly(dibenzothiophene sulfide).

It is preferable that the organic semiconductor is a low molecular weight compound. Among examples thereof, a fused polycyclic aromatic compound is preferable. The fused polycyclic aromatic compound is highly effective for improving carrier mobility and durability and exhibits an excellent effect of decreasing the threshold voltage.

As the fused polycyclic aromatic compound, acene represented by any of Formulae (A1) to (A4) and a compound represented by any of the following Formulae (C) to (T) are preferable, and a compound represented by any of the following Formulae (C) to (T) is more preferable.

The acene which is preferable as the fused polycyclic aromatic compound is represented by the following Formula (A1) or (A2).

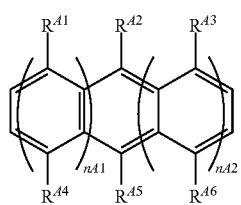

Formula (A1)

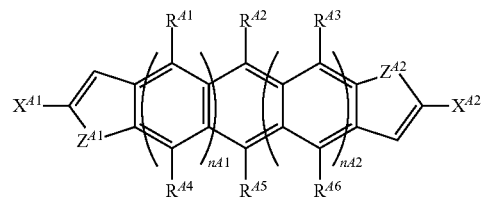

Formula (A2)

In Formulae, $R^{A1}$ to $R^{A6}$ and $X^{A1}$ and $X^{A2}$ represent a hydrogen atom or a substituent.

$Z^{A1}$ and $Z^{A2}$ represent S, O, Se, or Te.

nA1 and nA2 represent an integer of 0 to 3. In this case, nA1 and nA2 do not represent 0 at the same time.

The substituent respectively represented by $R^{A1}$ to $R^{A6}$ and $X^{A1}$ and $X^{A2}$ is not particularly limited, and examples thereof include an alkyl group (such as methyl, ethyl, propyl, isopropyl, tert-butyl, pentyl, tert-pentyl, hexyl, octyl, tert-octyl, dodecyl, tridecyl, tetradecyl, or pentadecyl), a cycloalkyl group (such as cyclopentyl or cyclohexyl), an alkenyl group (such as vinyl, allyl, 1-propenyl, 2-butenyl, 1,3-butadienyl, 2-pentenyl, or isopropenyl), an alkynyl group (such as ethynyl or propargyl), an aromatic hydrocarbon group (also referred to as an aromatic carbocyclic group or an aryl group, and examples thereof include phenyl, p-chlorophenyl, mesityl, tolyl, xylyl, naphthyl, anthryl, azulenyl, acenaphthenyl, fluorenyl, phenanthryl, indenyl, pyrenyl, and biphenylyl), an aromatic heterocyclic group (also referred to as a heteroaryl group, and examples thereof include a pyridyl group, a pyrimidinyl group, a furyl group, a pyrrolyl group, an imidazolyl group, a benzoimidazolyl group, a pyrazolyl group, a pyrazinyl group, a triazolyl group (such as a 1,2,4-triazol-1-yl group or a 1,2,3-triazol-1-yl group), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (a group in which one carbon atom constituting a carboline ring of a carbolinyl group is replaced with a nitrogen atom), a quinoxalinyl group, a pyridazinyl group, a triazinyl group, a quinazolinyl group, and a phthalazinyl group), a heterocyclic group (also referred to as a heteroaryl ring group, and examples thereof include a pyrrolidyl group, an imidazolidyl group, a morpholyl group, and an oxazolidyl group), an alkoxy group (such as methoxy, ethoxy, propyloxy, pentyloxy, hexyloxy, octyloxy, or dodecyloxy), a cycloalkoxy group (such as cyclopentyloxy or cyclohexyloxy), an aryloxy group (such as phenoxy or naphthyloxy), an alkylthio group (such as methylthio, ethylthio, propylthio, pentylthio, hexylthio, octylthio, or dodecylthio), a cycloalkylthio group (such as cyclopentylthio or cyclohexylthio), an arylthio group (such as phenylthio or naphthylthio), an alkoxycarbonyl group (such as methyloxycarbonyl, ethyloxycarbonyl, butyloxycarbonyl, octyloxycarbonyl, or dodecyloxycarbonyl), an aryloxycarbonyl group (such as phenyloxycarbonyl or naphthyloxycarbonyl), a sulfamoyl group (such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, or 2-pyridylaminosulfonyl), an acyl group (such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, or pyridylcarbonyl), an acyloxy group (such as acetyloxy, ethylcarbonyloxy, butylcarbonyloxy, octylcarbonyloxy, dodecylcarbonyloxy, or phenylcarbonyloxy), an amido group (such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, or naphthylcarbonylamino), a carbamoyl group (such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, or 2-pyridylaminocarbonyl), an ureido group (such as methylureido, ethylureido, pentylureido, cyclohexylureido, octylureido, dodecylureido, phenylureido, naphthylureido, or 2-pyridylaminoureido), a sulfinyl group (such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, or 2-pyridylsulfinyl), an alkylsulfonyl group (such as methylsulfonyl, ethylsulfonyl, butylsulfonyl, cyclohexylsulfonyl, 2-ethylhexylsulfonyl, or dodecylsulfonyl), an arylsulfonyl group (such as phenylsulfonyl, naphthylsulfonyl, or 2-pyridylsulfonyl), an amino group (such as amino, ethylamino, dimethylamino, butylamino, cyclopentylamino, 2-ethylhexylamino, dodecylamino, anilino, naphthylamino, or 2-pyridylamino), a halogen atom (such as a fluorine atom, a chlorine atom, or a bromine atom), a fluorinated hydrocarbon group (such as fluoromethyl, trifluoromethyl, pentafluoroethyl, or pentafluorophenyl), a cyano group, a nitro group, a hydroxy group, a mercapto group, a silyl group (such as trimethylsilyl, triisopropylsilyl, triphenylsilyl, or phenyldiethylsilyl), and a group (in this case, $X^A$ represents Ge or Sn) represented by the following Formula (SG1).

These substituents may further include a plurality of substituents. As the plurality of substituents which may be included in these substituents, substituents represented by $R^{A1}$ to $R^{A6}$ are exemplified.

Among the above-described examples of acene, one represented by the following Formula (A3) or (A4) is preferable.

Formula (A3)

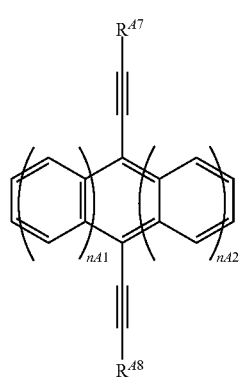

Formula (A4)

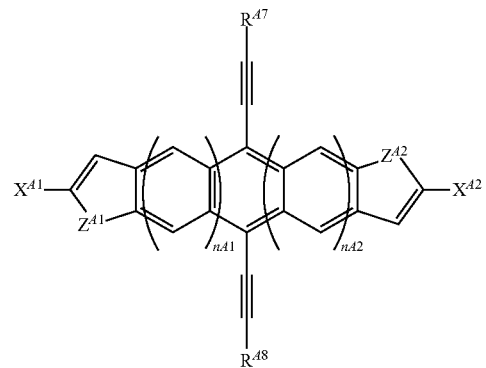

In the formulae, $R^{A7}$, $R^{A8}$, $X^{A1}$, and $X^{A2}$ represent a hydrogen atom or a substituent. $R^{A7}$, $R^{A8}$, $X^{A1}$, and $X^{A2}$ may be the same as or different from each other. Preferred examples of the substituents represented by $R^{A7}$ and $R^{A8}$ include those exemplified as the substituents which may be employed as $R^{A1}$ to $R^{A6}$ in Formulae (A1) and (A2).

$Z^{A1}$ and $Z^{A2}$ represent S, O, Se, or Te.

nA1 and nA2 represent an integer of 0 to 3. In this case, nA1 and nA2 do not represent 0 at the same time.

In Formula (A3) or (A4), it is preferable that $R^{A7}$ and $R^{A8}$ are represented by the following Formula (SG1).

Formula (SG1)

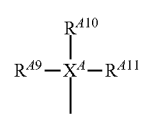

In the formula, $R^{A9}$ to $R^{A11}$ represent a substituent. $X^A$ represents Si, Ge, or Sn. Preferred examples of the substituents represented by $R^{A9}$ to $R^{A11}$ include those exemplified as the substituents which may be employed as $R^{A1}$ to $R^{A6}$ in Formulae (A1) and (A2).

Hereinafter, specific examples of acene or an acene derivative represented by Formula (A1) to (A4) will be described, but the present invention is not limited to those.

Compound A1

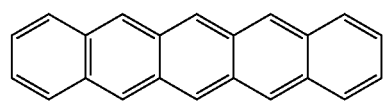

Compound A2

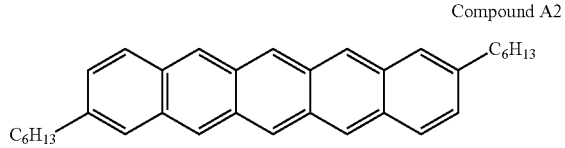

Compound A3
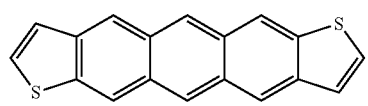
Compound A4
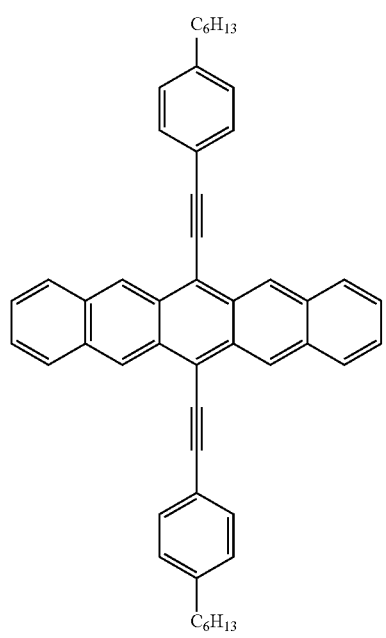
Compound A5
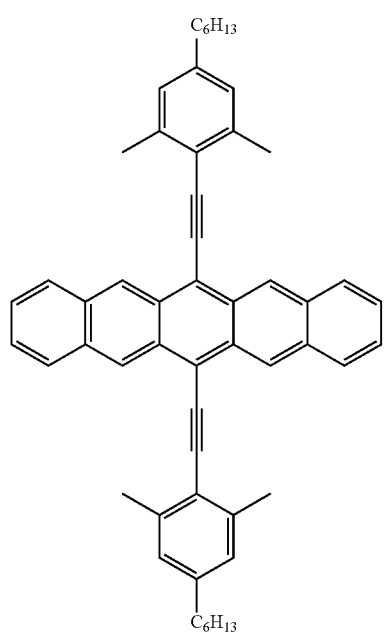
Compound A6
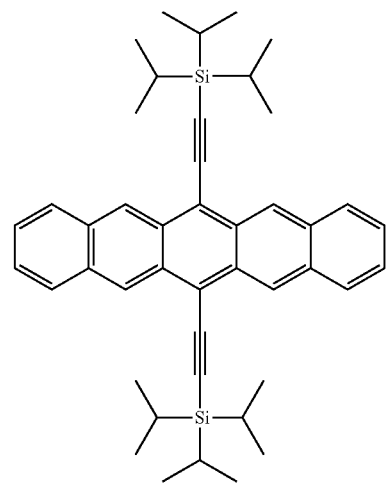
Compound A7
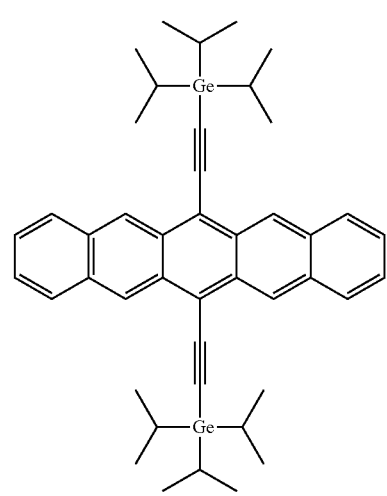
Compound A8
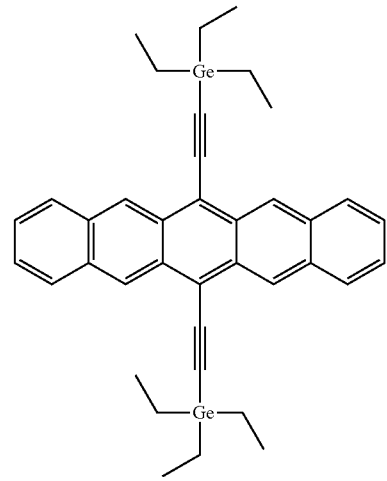

Compound A9
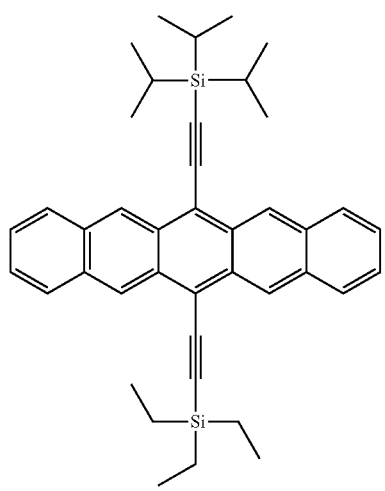
Compound A12
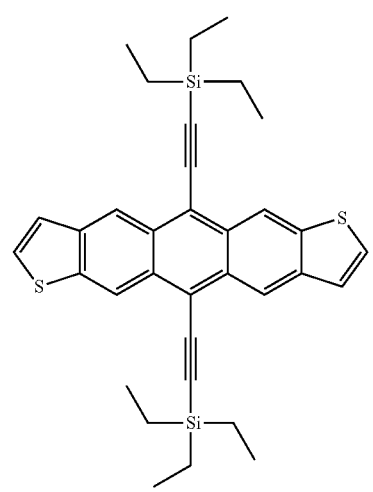
Compound A10
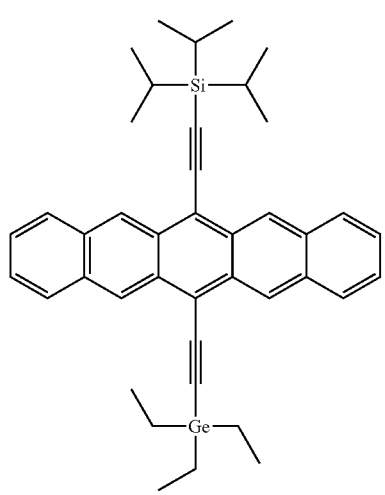
Compound A13
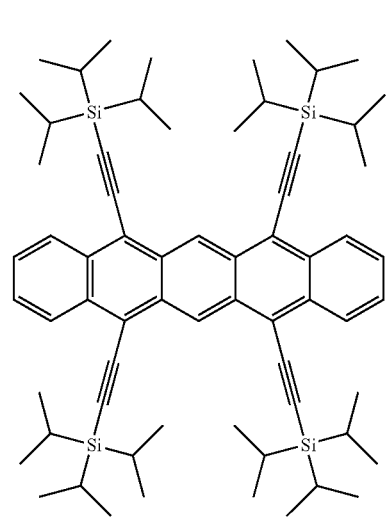
Compound A11
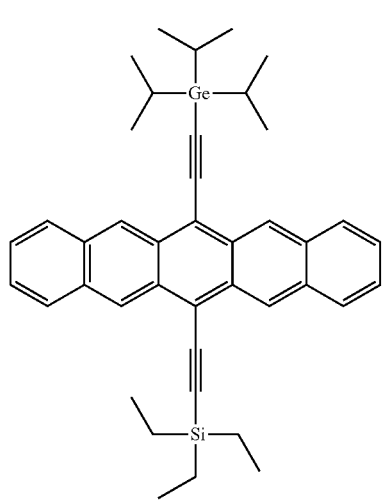
Compound A14
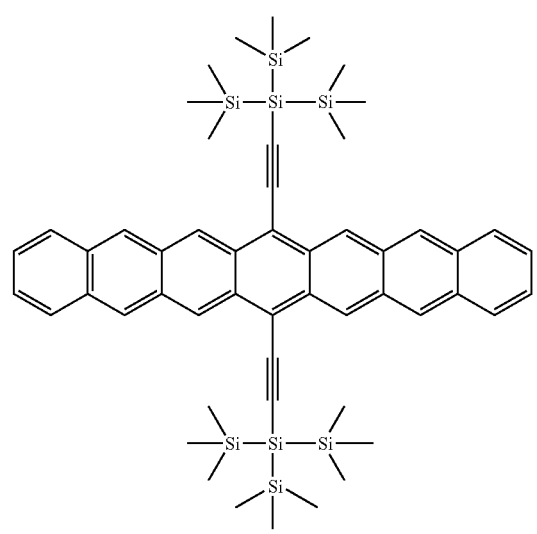

Compound A15
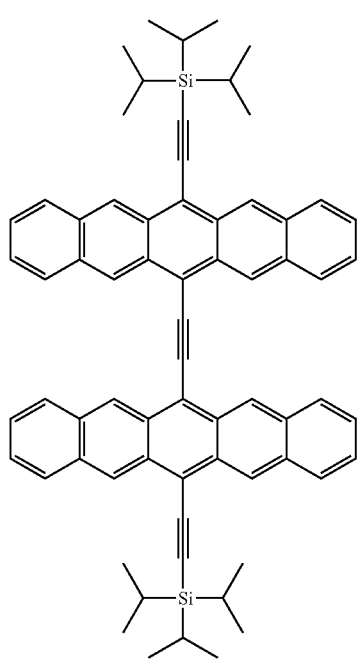
Compound A16
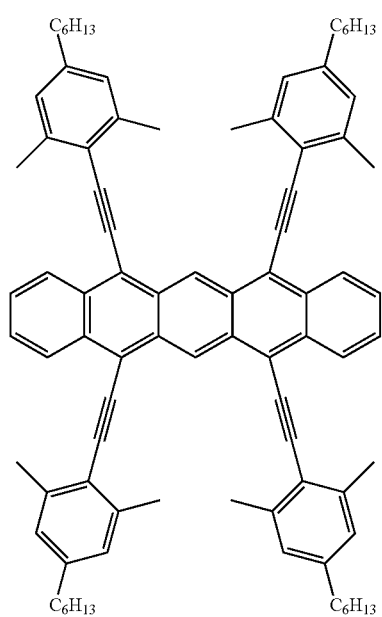
Compound A17
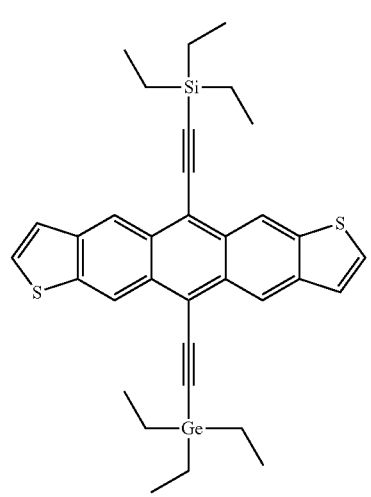
Compound A18
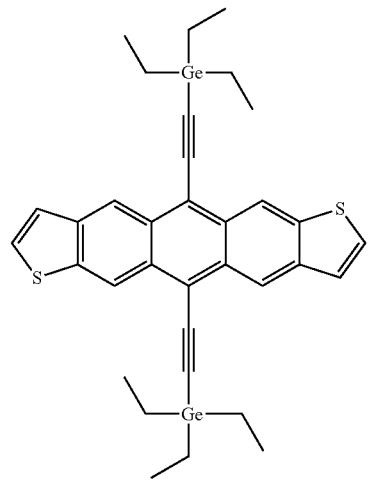
Compound A19
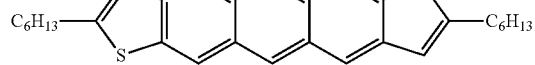
Compound A20
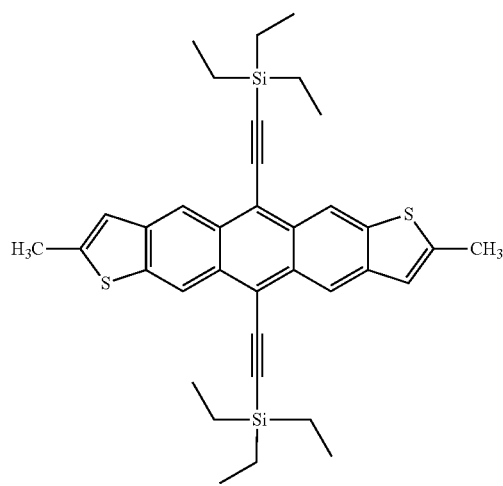

Compound A21
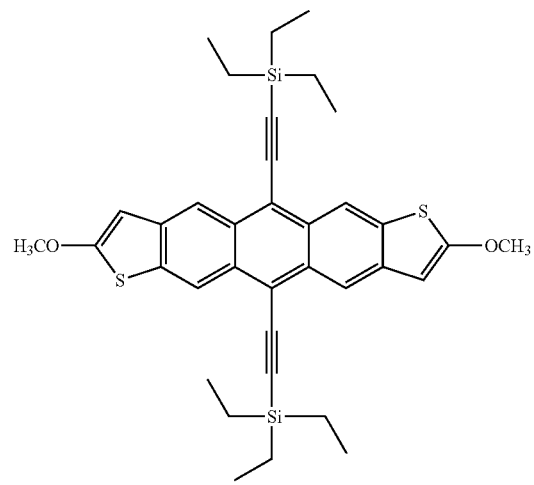
Compound A24
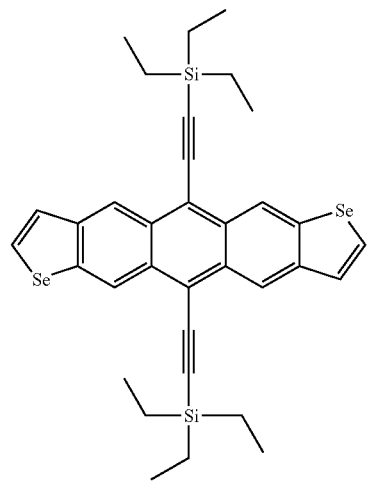
Compound A22
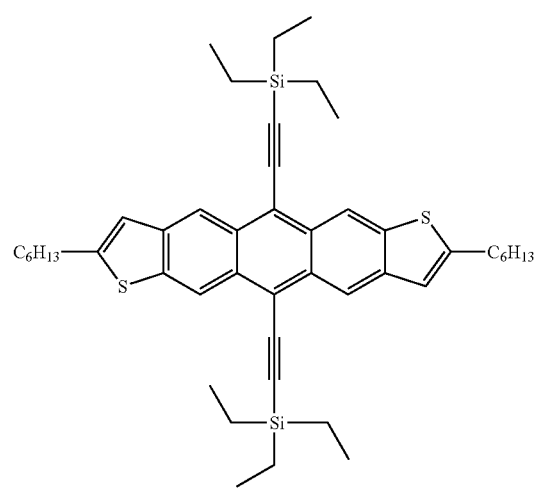
Compound A25
Compound A23
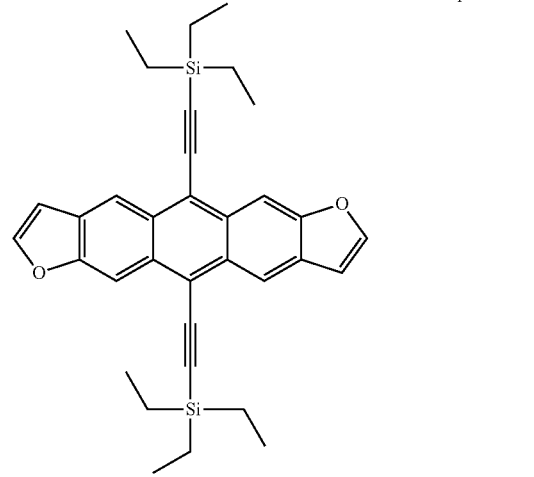
Compound A26
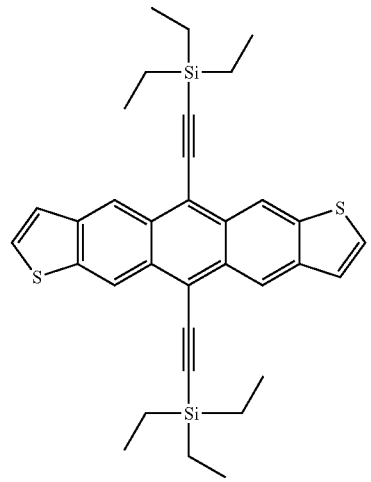

Compound A27
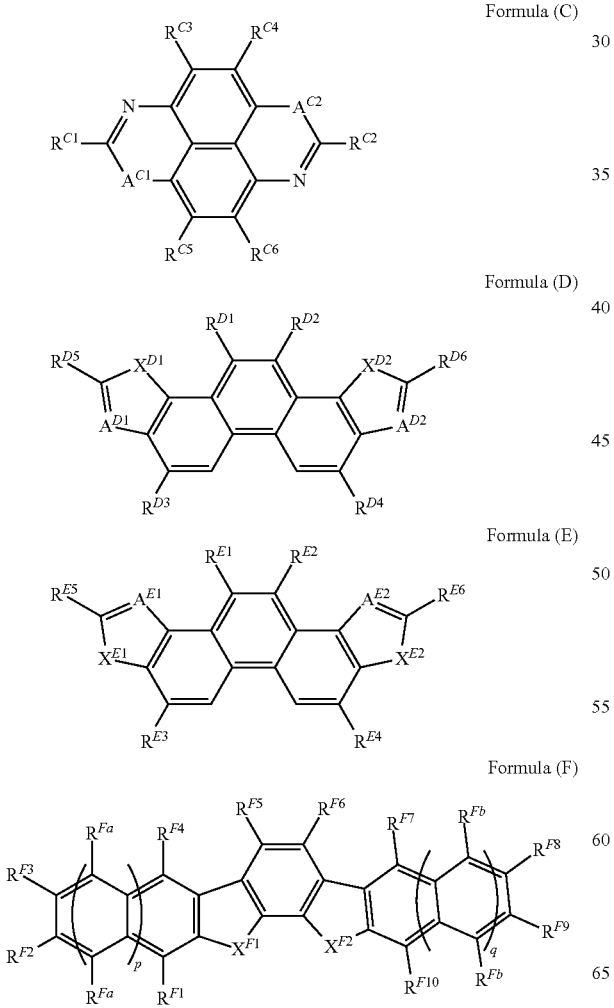
As the fused polycyclic aromatic compound, compounds represented by the following Formulae (C) to (T) are also preferable.
Formula (C)
Formula (D)
Formula (E)
Formula (F)
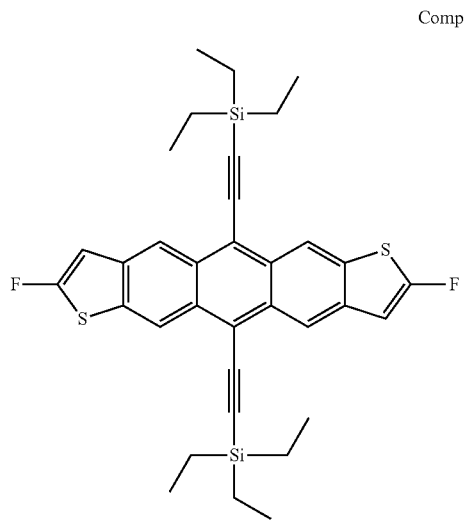
Formula (G)
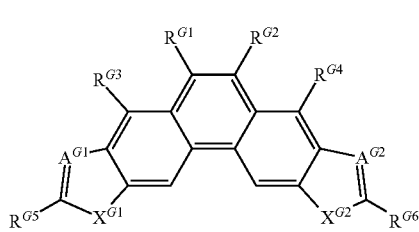
Formula (H)
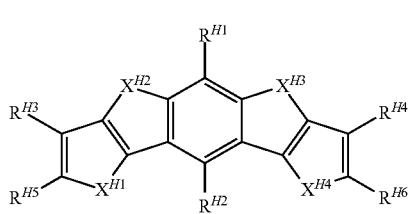
Formula (J)
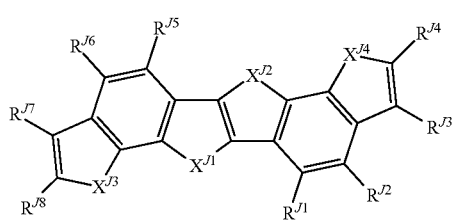
Formula (K)
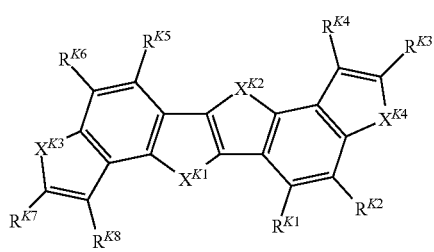
Formula (L)
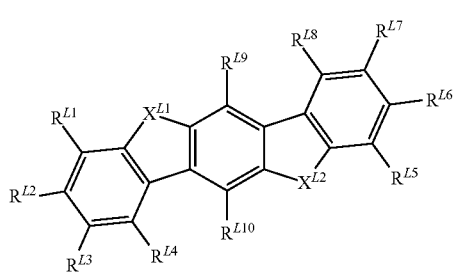
Formula (M)
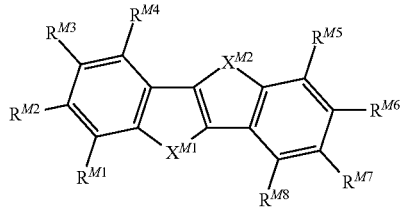

Formula (N)

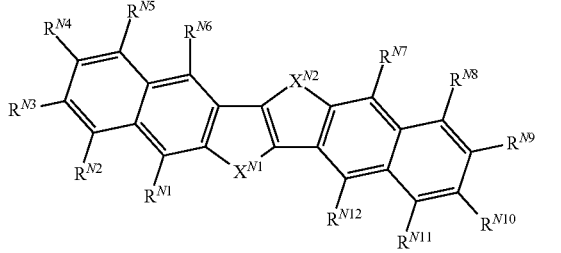

Formula (P)

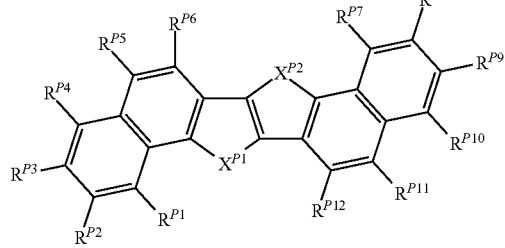

Formula (Q)

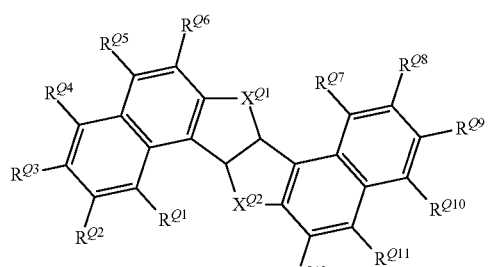

Formula (R)

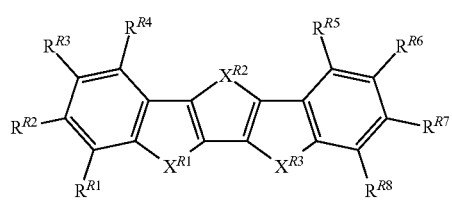

Formula (S)

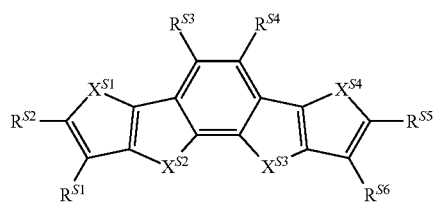

Formula (T)

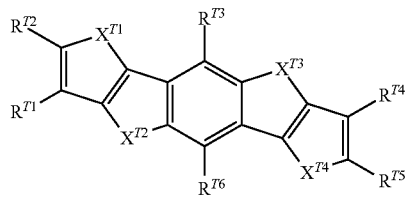

In Formula (C), $A^{C1}$ and $A^{C2}$ represent an oxygen atom, a sulfur atom, or a selenium atom. It is preferable that both of $A^{C1}$ and $A^{C2}$ represent an oxygen atom or a sulfur atom and more preferable that $A^{C1}$ and $A^{C2}$ represent a sulfur atom. $R^{C1}$ to $R^{C6}$ represent a hydrogen atom or a substituent. At least one of $R^{C1}$ to $R^{C6}$ represents a substituent represented by the following Formula (W).

In Formula (D), $X^{D1}$ and $X^{D2}$ represent $NR^{D9}$, an oxygen atom, or a sulfur atom. $A^{D1}$ represents $CR^{D7}$ or a N atom, $A^{D2}$ represents $CR^{D8}$ or a N atom, $R^{D9}$ represents a hydrogen atom, an alkyl group, an alkenyl group, an alkynyl group, or an acyl group. $R^{D1}$ to $R^{D8}$ represent a hydrogen atom or a substituent, and at least one of $R^{D1}$ to $R^{D8}$ represents a substituent represented by the following Formula (W).

In Formula (E), $X^{E1}$ and $X^{E2}$ represent an oxygen atom, a sulfur atom, or $NR^{E7}$. $A^{E1}$ and $A^{E2}$ represent $CR^{E8}$ or a nitrogen atom. $R^{E1}$ to $R^{E8}$ represent a hydrogen atom or a substituent. At least one of $R^{E1}$ to $R^{E8}$ represents a substituent represented by the following Formula (W).

In Formula (F), $X^{F1}$ and $X^{F2}$ represent an oxygen atom, a sulfur atom, or a selenium atom. It is preferable that $X^{F1}$ and $X^{F2}$ represent an oxygen atom or a sulfur atom and more preferable that $X^{F1}$ and $X^{F2}$ represent a sulfur atom. $R^{F1}$ to $R^{F10}$, $R^{Fa}$, and $R^{Fb}$ represent a hydrogen atom or a substituent. At least one of $R^{F1}$ to $R^{F10}$, $R^{Fa}$, or $R^{Fb}$ represents a substituent represented by Formula (W). p and q represent an integer of 0 to 2.

In Formula (G), $X^{G1}$ and $X^{G2}$ represent $NR^{G9}$, an oxygen atom, or a sulfur atom. $A^{G1}$ represents $CR^{G7}$ or a N atom. $A^{G2}$ represents $CR^{G8}$ or a N atom. $R^{G9}$ represents a hydrogen atom, an alkyl group, an alkenyl group, an alkynyl group, an acyl group, an aryl group, or a heteroaryl group. $R^{G1}$ to $R^{G8}$ represent a hydrogen atom or a substituent. At least one of $R^{G1}$ to $R^{G8}$ represents a substituent represented by the following Formula (W).

In Formula (H), $X^{H1}$ and $X^{H4}$ represent $NR^{H7}$, an oxygen atom, or a sulfur atom. It is preferable that $X^{H1}$ to $X^{H4}$ represent a sulfur atom. $R^{H7}$ represents a hydrogen atom, an alkyl group, an alkenyl group, an alkynyl group, an acyl group, an aryl group, or a heteroaryl group. $R^{H1}$ to $R^{H6}$ represent a hydrogen atom or a substituent. At least one of $R^{H1}$ to $R^{H6}$ represents a substituent represented by the following Formula (W).

In Formula (J), $X^{J1}$ and $X^{J2}$ represent an oxygen atom, a sulfur atom, a selenium atom, or $NR^{J9}$. $X^{J3}$ and $X^{J4}$ represent an oxygen atom, a sulfur atom, or a selenium atom. It is preferable that $X^{J1}$, $X^{J2}$, $X^{J3}$, and $X^4$ represent a sulfur atom. $R^{J1}$ to $R^{J9}$ represent a hydrogen atom or a substituent. At least one of $R^{J1}$ to $R^{J9}$ represents a substituent represented by the following Formula (W).

In Formula (K), $X^{K1}$ and $X^{K2}$ represent an oxygen atom, a sulfur atom, a selenium atom, or $NR^{K9}$. $X^{K3}$ and $X^{K4}$ represent an oxygen atom, a sulfur atom, or a selenium atom. It is preferable that $X^{K1}$, $X^{K2}$, $X^{K3}$, and $X^{K4}$ represent a sulfur atom. $R^{K1}$ to $R^{K9}$ represent a hydrogen atom or a substituent. At least one of $R^{K1}$ to $R^{K9}$ represents a substituent represented by the following Formula (W).

In Formula (L), $X^{L1}$ and $X^{L2}$ represent an oxygen atom, a sulfur atom, or $NR^{L1}$. It is preferable that $X^{L1}$ and $X^{L2}$ represent an oxygen atom or a sulfur atom. $R^{L1}$ to $R^{L11}$ represent a hydrogen atom or a substituent, and at least one of $R^{L1}$ to $R^{L11}$ represents a substituent represented by the following Formula (W).

In Formula (M), $X^{M1}$ and $X^{M2}$ represent an oxygen atom, a sulfur atom, a selenium atom, or $NR^{M9}$. It is preferable that $X^{M1}$ and $X^{M2}$ represent a sulfur atom. $R^{M1}$ to $R^{M9}$ represent a hydrogen atom or a substituent. At least one of $R^{M1}$ to $R^{M9}$ represents a substituent represented by the following Formula (W).

In Formula (N), $X^{N1}$ and $X^{N2}$ represent an oxygen atom, a sulfur atom, a selenium atom, or $NR^{N13}$. It is preferable that $X^{N1}$ and $X^{N2}$ represent a sulfur atom. $R^{N1}$ to $R^{N13}$ represent a hydrogen atom or a substituent. At least one of $R^{N1}$ to $R^{N13}$ represents a substituent represented by the following Formula (W).

In Formula (P), $X^{P1}$ and $X^{P2}$ represent an oxygen atom, a sulfur atom, a selenium atom, or $NR^{P13}$. It is preferable that $X^{P1}$ and $X^{P2}$ represent a sulfur atom. $R^{P1}$ to $R^{P13}$ represent a hydrogen atom or a substituent. At least one of $R^{P1}$ to $R^{P13}$ represents a substituent represented by the following Formula (W).

In Formula (Q), $X^{Q1}$ and $X^{Q2}$ represent an oxygen atom, a sulfur atom, a selenium atom, or $NR^{Q13}$. It is preferable that $X^{Q1}$ and $X^{Q2}$ represent a sulfur atom. $R^{Q1}$ to $R^{Q13}$ represent a hydrogen atom or a substituent. At least one of $R^{Q1}$ to $R^{Q13}$ represents a substituent represented by the following Formula (W).

In Formula (R), $X^{R1}$, $X^{R2}$, and $X^{R3}$ represent an oxygen atom, a sulfur atom, a selenium atom, or $NR^{R9}$. It is preferable that $X^{R1}$, $X^{R2}$, and $X^{R3}$ represent a sulfur atom. $R^{R1}$ to $R^{R9}$ represent a hydrogen atom or a substituent. At least one of $R^{R1}$ to $R^{R9}$ represents a substituent represented by the following Formula (W).

In Formula (S), $X^{S1}$, $X^{S2}$, $X^{S3}$, and $X^{S4}$ represent an oxygen atom, a sulfur atom, a selenium atom, or $NR^{S7}$. It is preferable that $X^{S1}$, $X^{S2}$, $X^{S3}$, and $X^{S4}$ represent a sulfur atom. $R^{S1}$ to $R^{S7}$ represent a hydrogen atom or a substituent. At least one of $R^{S1}$ to $R^{S7}$ represents a substituent represented by the following Formula (W).

In Formula (T), $X^{T1}$, $X^{T2}$, $X^{T3}$, and $X^{T4}$ represent an oxygen atom, a sulfur atom, a selenium atom, or $NR^{T7}$. It is preferable that $X^{T1}$, $X^{T2}$, $X^{T3}$, and $X^{T4}$ represent a sulfur atom. $R^{T1}$ to $R^{T7}$ represent a hydrogen atom or a substituent. At least one of $R^{T1}$ to $R^{T7}$ represents a substituent represented by the following Formula (W).

Hereinafter, in Formulae (C) to (T), $R^{C1}$ to $R^{C6}$, $R^{D1}$ to $R^{D8}$, $R^{E1}$ to $R^{E8}$, $R^{F1}$ to $R^{F10}$, $R^{Fa}$ and $F^{Fb}$, $R^{G1}$ to $R^{G8}$, $R^{H1}$ to $R^{H6}$, $R^{J1}$ to $R^{J9}$, $R^{K1}$ to $R^{K9}$, $R^{L1}$ to $R^{L11}$, $R^{M1}$ to $R^{M9}$, $R^{N1}$ to $R^{N13}$, $R^{P1}$ to $R^{P13}$, $R^{Q1}$ to $R^{Q13}$, $R^{R1}$ to $R^{R9}$, $R^{S1}$ to $R^{S7}$, and $R^{T1}$ to $R^{T7}$ (hereinafter, referred to as substituents $R^C$ to $R^T$) which represent a hydrogen atom or a substituent.

Examples of the substituent which may be employed by the substituents $R^C$ to $R^T$ include a halogen atom, an alkyl group (an alkyl group having 1 to 40 carbon atoms such as methyl, ethyl, propyl, butyl, pentyl, hexyl, heptyl, octyl, nonyl, decyl, undecyl, dodecyl, tridecyl, tetradecyl, or pentadecyl, and in this case, 2,6-dimethyloctyl, 2-decyltetradecyl, 2-hexyldodecyl, 2-ethyloctyl, 2-butyldecyl, 1-octylnonyl, 2-octyltetradecyl, 2-ethylhexyl, cycloalkyl, bicycloalkyl, and tricycloalkyl are included), an alkenyl group (such as 1-pentenyl, cycloalkenyl, or bicycloalkenyl), an alkynyl group (such as 1-pentynyl, trimethylsilylethynyl, triethylsilylethynyl, tri-i-propylsilylethynyl, or 2-p-propylphenylethynyl), an aryl group (for example, an aryl group having 6 to 20 carbon atoms such as phenyl, naphthyl, p-pentylphenyl, 3,4-dipentylphenyl, p-heptoxyphenyl, or 3,4-diheptoxyphenyl), a heterocyclic group (such as a 2-hexylfuranyl), a cyano group, a hydroxy group, a nitro group, an acyl group (such as hexanoyl or benzoyl), an alkoxy group (such as buthoxy), an aryloxy group, a silyloxy group, a heterocyclic oxy group, an acyloxy group, a carbamoyloxy group, an amino group (such as an anilino group), an acylamino group, an aminocarbonylamino group (such as an ureido group), an alkoxy and aryloxycarbonylamino group, an alkyl arylsulfonylamino group, a mercapto group, an alkyl and arylthio group (such as methylthio or octylthio), a heterocyclic thio group, a sulfamoyl group, a sulfo group, an alkyl and arylsulfinyl group, an alkyl and arylsulfonyl group, an alkyl and aryloxycarbonyl group, a carbamoyl group, an aryl and heterocyclic azo group, an imido group, a phosphino group, a phosphinyl group, a phosphinyloxy group, a phosphinylamino group, a phosphono group, a silyl group (such as a ditrimethylsiloxymethylbutoxy group), a hydrazino group, an ureido group, a boronic acid group ($-B(OH)_2$), a phosphate group ($-OPO(OH)_2$), a sulfato group ($-OSO_3H$), and other known substituents.

These substituents may further include the above-described substituents.

Among these, as the substituents which may be employed by the substituents $R^C$ to $R^T$, an alkyl group, an aryl group, an alkenyl group, an alkynyl group, a heterocyclic group, an alkoxy group, an alkylthio group, and a group represented by the following Formula (W) are preferable, an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, and a group represented by the following Formula (W) are more preferable, and a group represented by the following Formula (W) is particularly preferable.

The alkyl group, the alkenyl group, the alkynyl group, the acyl group, and the aryl group as $R^{D9}$, $R^{G9}$, and $R^{H7}$ described above respectively have the same definitions as those for the alkyl group, the alkenyl group, the alkynyl group, the acyl group, and the aryl group described in the section of the substituents which may be employed by the substituents $R^C$ to $R^T$.

Moreover, the heteroaryl group has the same definition as that for the heteroaryl group described in the section of the substituents of $R^{41}$ to $R^{46}$.

Formula (W) describes a group represented by $-L-R^W$.

In Formula (W), L represents a divalent linking group represented by any one of the following Formulae (L-1) to (L-25) or a divalent linking group in which two or more (preferably 2 to 10, more preferably 2 to 6, and still more preferably 2 or 3) divalent linking groups represented by any one of the following Formulae (L-1) to (L-25) are bonded to each other. $R^W$ represents a substituted or unsubstituted alkyl group, a cyano group, a vinyl group, an ethynyl group, an oxyethylene group, an oligooxyethylene group in which a repeating number v of oxyethylene units is 2 or greater, a siloxane group, an oligosiloxane group having 2 or more silicon atoms, or a substituted or unsubstituted trialkylsilyl group.

(L-1)

(L-2)

(L-3)

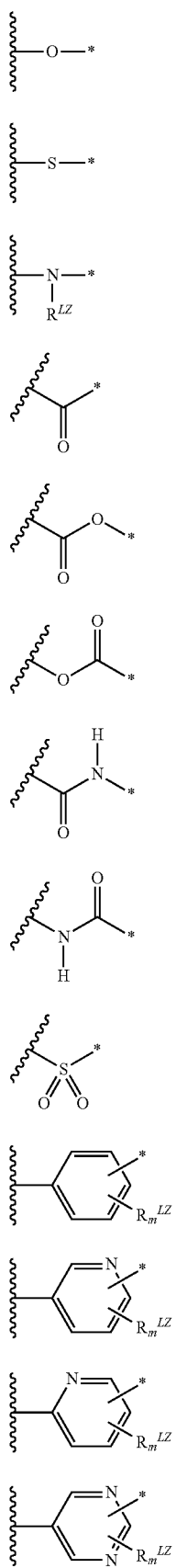
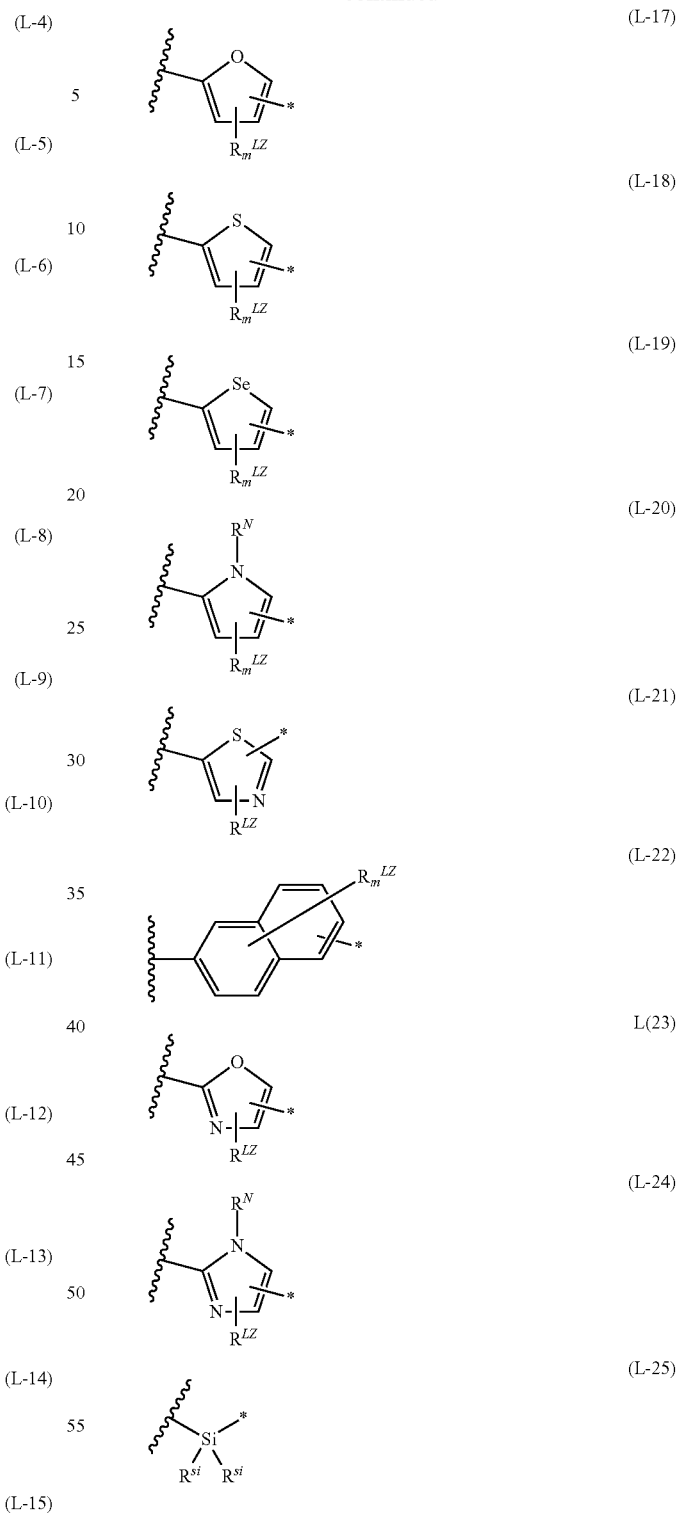

In Formulae (L-1) to (L-25), each wavy line represents a binding position with respect to a ring forming each skeleton represented by any of Formulae (C) to (T). Moreover, in the present specification, in a case where L represents a divalent linking group in which two or more divalent linking groups represented by any of Formulae (L-1) to (L-25) are bonded to each other, each wavy line may represent a binding position with a ring forming each skeleton represented by any of Formulae (C) to (T) or a binding position with respect to any of the divalent linking groups represented by Formulae (L-1) to (L-25).

The symbol "*" represents a binding position with respect to RW or a binding position with respect to a wavy line represented by any of Formula (L-1) to (L-25).

m in Formula (L-13) represents 4, m's in Formulae (L-14) and (L-15) represent 3, m's in Formulae (L-16) to (L-20) represent 2, and m in Formula (L-22) represents 6.

$R^{LZ}$'s in Formulae (L-1), (L-2), (L-6), (L-13) to (L-24) each independently represent a hydrogen atom or a substituent, and $R^{LZ}$'s in Formulae (L-1) and (L-2) may be respectively bonded to $R^W$ adjacent to L and form a fused ring.

$R^N$'s represent a hydrogen atom or a substituent and $R^{si}$'s each independently represent a hydrogen atom, an alkyl group, an alkenyl group, or an alkynyl group.

It is more preferable that the divalent linking groups represented by Formulae (L-17) to (L-21), (L-23), and (L-24) are divalent linking groups represented by the following Formulae (L-17A) to (L-21A), (L-23A), and (L-24A).

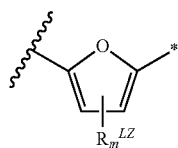
(L-17A)

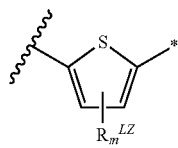
(L-18A)

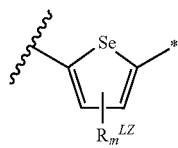
(L-19A)

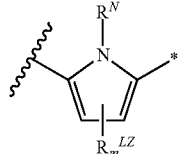
(L-20A)

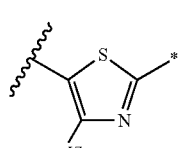
(L-21A)

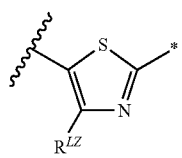
(L-23A)

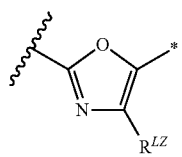

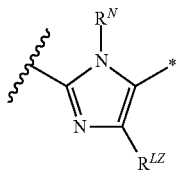
(L24-A)

Here, in a case where a substituted or unsubstituted alkyl group, an oxyethylene group, an oligooxyethylene group in which the repeating number v of oxyethylene units is 2 or greater, a siloxane group, an oligosiloxane group having 2 or more silicon atoms, or a substituted or unsubstituted trialkylsilyl group is present at the terminal of a substituent, this substituent can be interpreted as —$R^W$ alone in Formula (W) or as -L-$R^W$ in Formula (W).

In the present invention, in a case where a substituted or unsubstituted alkyl group having N carbon atoms in the main chain is present at the terminal of a substituent, this substituent is determined to be interpreted not as —$R^W$ alone but as -L-$R^W$ in Formula (W), including as many linking groups as possible from the terminal of the substituent. Specifically, this substituent is interpreted as a substituent in which "one (L-1) corresponding to L in Formula (W)" is bonded to "a substituted or unsubstituted alkyl group having N−1 carbon atoms in the main chain corresponding to $R^W$ in Formula (W)." For example, in a case where an n-octyl group which is an alkyl group having 8 carbon atoms is present at the terminal of a substituent, this substituent is interpreted as a substituent in which one (L-1) having two $R^{LZ}$'s representing a hydrogen atom is bonded to an n-heptyl group having 7 carbon atoms. Further, in a case where a substituent represented by Formula (W) is an alkoxy group having 8 carbon atoms, this substituent is interpreted as a substituent in which one linking group represented by —O— of Formula (L-4), one linking group represented by (L-1) in which two $R^{LZ}$'s represent a hydrogen atom, and an n-heptyl group having 7 carbon atoms are bonded to each other.

Meanwhile, in the present invention, in a case where an oxyethylene group, an oligooxyethylene group in which the repeating number v of oxyethylene units is 2 or greater, a siloxane group, an oligosiloxane group having 2 or more silicon atoms, or a substituted or unsubstituted trialkylsilyl group is present at the terminal of a substituent, this substituent is interpreted as $R^W$ alone in Formula (W), including linking groups as many as possible from the terminal of the substituent. For example, in a case where a —(OCHCH$_2$CH$_2$)—(OCH$_2$CH$_2$)—(OCH$_2$CH$_2$)—OCH$_3$ group is present at the terminal of a substituent, this substituent is interpreted as an oligooxyethylene group alone in which the repeating number v of oxyethylene units is 3.

In a case where a linking group to which a divalent linking group in which L is represented by any of Formulae (L-1) to (L-25) is formed, the number of bonds of the divalent linking group represented by any of Formulae (L-1) to (L-25) is preferably in a range of 2 to 4 and more preferably 2 or 3.

Examples of the substituent $R^{LZ}$ in Formulae (L-1), (L-2), (L-6), and (L-13) to (L-24) include those exemplified as the substituents which may be employed by the substituents $R^C$ to $R^T$ of Formulae (C) to (T). Among these, it is preferable that the substituent $R^{LZ}$ in Formula (L-6) represents an alkyl group. In a case where $R^{LZ}$ in Formula (L-6) represents an alkyl group, the number of carbon atoms of the alkyl group is preferably in a range of 1 to 9, more preferably in a range of 4 to 9 from the viewpoints of chemical stability and carrier transportability, and still more preferably in a range of 5 to 9. In the case where $R^{LZ}$ in (L-6) is an alkyl group, it is preferable that the alkyl group is a linear alkyl group from the viewpoint of improving the carrier transportability.

Examples of $R^N$ include those exemplified as the substituents which may be employed by the substituents $R^C$ to $R^T$. Among these, it is preferable that $R^N$ represents a hydrogen atom or a methyl group.

It is preferable that $R^{si}$ represents an alkyl group. The alkyl group which may be employed by $R^{si}$ is not particularly limited, but the preferable range of the alkyl group which may be employed by $R^{si}$ is the same as the preferable range of an alkyl group which may be employed by a silyl group in a case where $R^W$ represents a silyl group. The alkenyl group which may be employed as $R^{si}$ is not particularly limited, but a substituted or unsubstituted alkenyl group is preferable and a branched alkenyl group is more preferable as the alkenyl group. The number of carbon atoms thereof is preferably 2 or 3. The alkynyl group which may be employed as $R^{si}$ is not particularly limited, but a substituted or unsubstituted alkynyl group is preferable and a branched alkynyl group is more preferable as the alkynyl group. The number of carbon atoms thereof is preferably 2 or 3.

It is preferable that L represents a divalent linking group represented by any of Formulae (L-1) to (L-5), (L-13), (L-17), and (L-18) or a divalent linking group in which two or more divalent linking groups represented by any of Formulae (L-1) to (L-5), (L-13), (L-17), and (L-18) are bonded to each other, more preferable that L represents a divalent linking group represented by any of Formulae (L-1), (L-3), (L-13), and (L-18) or a divalent linking group in which two or more divalent linking groups represented by any of Formulae (L-1), (L-3), (L-13), and (L-18) are bonded to each other, and particularly preferable that L represents a divalent linking group represented by any of Formulae (L-1), (L-3), (L-13), or (L-18) or a divalent linking group in which a divalent linking group represented by any one of Formulae (L-3), (L-13), and (L-18) is bonded to a divalent linking group represented by Formula (L-1). In the divalent linking group in which a divalent linking group represented by any one of Formulae (L-3), (L-13), and (L-18) is bonded to a divalent linking group represented by Formula (L-1), it is preferable that the divalent linking group represented by Formula (L-1) is bonded to the $R^W$ side.

From the viewpoints of chemical stability and carrier transportability, it is particularly preferable that L represents a divalent linking group which has a divalent linking group represented by Formula (L-1), more particularly preferable that L represents a divalent linking group represented by Formula (L-1), still more particularly preferable that L represents a divalent linking group represented by Formula (L-18) and (L-1), the divalent linking group is bonded to $R^W$ through (L-1), and $R^W$ represents a substituted or unsubstituted alkyl group, and even still more particularly preferable that L represents a divalent linking group represented by Formula (L-18A) and (L-1), the divalent linking group is bonded to $R^W$ through (L-1), and $R^W$ represents a substituted or unsubstituted alkyl group.

In Formula (W), it is preferable that $R^W$ represents a substituted or unsubstituted alkyl group. In Formula (W), in a case where L adjacent to $R^W$ represents a divalent linking group represented by Formula (L-1), it is preferable that $R^W$ represents a substituted or unsubstituted alkyl group, an oxyethylene group, an oligooxyethylene group in which the repeating number of oxyethylene units is 2 or greater, a siloxane group, or an oligosiloxane group having 2 or more silicon atoms and more preferable that $R^W$ represents a substituted or unsubstituted alkyl group.

In Formula (W), in a case where L adjacent to $R^W$ represents a divalent linking group represented by any of Formulae (L-2) and (L-4) to (L-25), it is more preferable that $R^W$ represents a substituted or unsubstituted alkyl group.

In Formula (W), in a case where L adjacent to $R^W$ represents a divalent linking group represented by Formula (L-3), it is preferable that $R^W$ represents a substituted or unsubstituted alkyl group or a substituted or unsubstituted silyl group.

In a case where $R^W$ represents a substituted or unsubstituted alkyl group, the number of carbon atoms is preferably in a range of 4 to 17, more preferably in a range of 6 to 14 from the viewpoints of chemical stability and carrier transportability, and still more preferably in a range of 6 to 12. From the viewpoints of improving linearity of a molecule and carrier transportability, it is preferable that $R^W$ represents a long-chain alkyl group, particularly a long-chain linear alkyl group, within the above-described range.

In a case where $R^W$ represents an alkyl group, the alkyl group may be linear, branched, or cyclic, but it is preferable that the alkyl group is linear from the viewpoints of improving the linearity of a molecule and the carrier transportability.

As a combination of $R^W$ and L of Formula (W), from the viewpoint of improving the carrier mobility, it is preferable that L in Formulae (C) to (T) represents a divalent linking group represented by Formula (L-1) and $R^W$ represents a linear alkyl group having 4 to 17 carbon atoms or L represents a divalent linking group in which a divalent linking group represented by any one of Formulae (L-3), (L-13), and (L-18) is bonded to a divalent linking group represented by Formula (L-1) and $R^W$ represents a linear alkyl group.

In the case where L represents a divalent linking group represented by Formula (L-1) and $R^W$ represents a linear alkyl group having 4 to 17 carbon atoms, it is more preferable that $R^W$ represents a linear alkyl group having 6 to 14 carbon atoms from the viewpoint of improving the carrier mobility and particularly preferable that $R^W$ represents a linear alkyl group having 6 to 12 carbon atoms.

In the case where L represents a divalent linking group in which a divalent linking group represented by any one of Formulae (L-3), (L-13), and (L-18) is bonded to a divalent linking group represented by Formula (L-1) and $R^W$ represents a linear alkyl group, it is more preferable that $R^W$ represents a linear alkyl group having 4 to 17 carbon atoms, more preferable that $R^W$ represents a linear alkyl group having 6 to 14 carbon atoms from the viewpoints of the chemical stability and carrier mobility, and particularly preferable that $R^W$ represents a linear alkyl group having 6 to 12 carbon atoms from the viewpoint of improving the carrier mobility.

Meanwhile, from the viewpoint of improving solubility in an organic solvent, it is preferable that $R^W$ represents a branched alkyl group.

In a case where $R^W$ represents an alkyl group having a substituent, a halogen atom may be exemplified as the substituent and a fluorine atom is preferable. Moreover, in a case where $R^W$ represents an alkyl group having fluorine atoms, all hydrogen atoms of the alkyl group may be substituted with fluorine atoms to form a perfluoroalkyl group. In this case, it is preferable that $R^W$ represents an unsubstituted alkyl group.

In a case where $R^W$ represents an ethyleneoxy group or an oligoethyleneoxy group, in the present specification, the "oligooxyethylene group" represented by $R^W$ indicates a group represented by —$(OCH_2CH_2)_vOY^W$ (the repeating number v of oxyethylene units is an integer of 2 or greater and $Y^W$ at the terminal represents a hydrogen atom or a substituent). Further, in a case where $Y^W$ at the terminal of the oligooxyethylene group represents a hydrogen atom, this becomes a hydroxy group. The repeating number v of the oxyethylene units is preferably in a range of 2 to 4 and more preferably 2 or 3. It is preferable that the hydroxy group at the terminal of the oligooxyethylene group is sealed, that is, $Y^W$ represents a substituent. In this case, it is preferable that the hydroxy group is sealed by an alkyl group having 1 to 3 carbon atoms, that is, $Y^W$ represents an alkyl group having 1 to 3 carbon atoms, more preferable that $Y^W$ represents a methyl group or an ethyl group, and particularly preferable that $Y^W$ represents a methyl group.

In a case where $R^W$ represents a siloxane group or an oligosiloxane group, the repeating number of siloxane units is preferably 2 to 4 and more preferably 2 or 3. Further, it is preferable that a hydrogen atom or an alkyl group is bonded to a Si atom. In a case where an alkyl group is bonded to a Si atom, the number of carbon atoms of the alkyl group is preferably in a range of 1 to 3, and it is preferable that a methyl group or an ethyl group is bonded to the Si atom. The same alkyl groups may be bonded to a Si atom or alkyl groups which are different from each other or hydrogen atoms may be bonded thereto. In addition, all siloxane units constituting an oligosiloxane group may be the same as or different from each other, but it is preferable that all siloxane units are the same as each other.

In a case where L adjacent to $R^W$ represents a divalent linking group represented by Formula (L-3), it is also preferable that $R^W$ represents a substituted or unsubstituted silyl group. In a case where $R^W$ represents a substituted or unsubstituted silyl group, it is preferable that $R^W$ represents a substituted silyl group. The substituted of the silyl group is not particularly limited, but a substituted or unsubstituted alkyl group is preferable and a branched alkyl group is more preferable as the substituent. In the case where $R^W$ represents a trialkylsilyl group, the number of carbon atoms of an alkyl group bonded to a Si atom is preferably in a range of 1 to 3, and it is preferable that a methyl group, an ethyl group, or an isopropyl group is bonded to a Si atom. Alkyl groups which are the same as or different from each other may be bonded to a Si atom. In a case where $R^W$ represents a trialkylsilyl group having other substituents in addition to an alkyl group, the substituents are not particularly limited.

In Formula (W), the total number of carbon atoms included in L and $R^W$ is preferably in a range of 5 to 18. When the total number of carbon atoms included in L and $R^W$ is greater than or equal to the lower limit of the above-described range, the carrier mobility is increased and the driving voltage is lowered. The total number of carbon atoms included in L and $R^W$ is less than or equal to the upper limit of the above-described range, the solubility in an organic solvent is increased.

The total number of carbon atoms included in L and $R^W$ is preferably in a range of 5 to 14, more preferably in a range of 6 to 14, particularly preferably in a range of 6 to 12, and more particularly preferably in a range of 8 to 12.

Among the substituents $R^C$ to $R^T$ in respective compounds represented by Formulae (C) to (T), the number of groups represented by Formula (W) is preferably in a range of 1 to 4 from the viewpoints of improving the carrier mobility and the solubility in an organic solvent, more preferably 1 or 2, and particularly preferably 2.

Among the substituents the $R^C$ to $R^T$, the positions of groups represented by Formula (W) are not particularly limited.

In the compound represented by Formula (C), a group in which any of $R^{C1}$, $R^{C2}$, $R^{C3}$, and $R^{C6}$ is represented by Formula (W) is preferable and a group in which both of $R^{C1}$ and $R^{C2}$ or both of $R^{C3}$ and $R^{C6}$ are represented by Formula (W) is more preferable.

In the compound represented by Formula (D), a group in which $R^{D6}$ is represented by Formula (W) is preferable and a group in which both of $R^{D5}$ and $R^{D6}$ are represented by Formula (W) is more preferable.

In the compound represented by Formula (E), a group in which $R^{E6}$ is represented by Formula (W) is preferable and a group in which both of $R^{E5}$ and $R^{E6}$ are represented by Formula (W) is more preferable. Further, in a case of a substituent other than the group in which both of $R^{E5}$ and $R^{E6}$ are represented by Formula (W), a group in which two $R^{E7}$'s are represented by Formula (W) is also preferable.

In the compound represented by Formula (F), a substituent in which at least one of $R^{F2}$, $R^{F3}$, $R^{F8}$, or $R^{F9}$ is represented by Formula (W) is preferable.

In the compound represented by Formula (G), a group in which $R^{G5}$ or $R^{G6}$ is represented by Formula (W) is preferable from the viewpoints of improving the carrier mobility and the solubility in an organic solvent.

In the compound represented by Formula (H), a group in which $R^{H4}$ or $R^{H6}$ is represented by Formula (W) is preferable and a group in which $R^{H4}$ or $R^{H6}$ and $R^{H3}$ or $R^{H5}$ are represented by Formula (W) is more preferable.

In the compound represented by Formula (J), a group in which $R^{J8}$ is represented by Formula (W) is preferable and a group in which both of $R^{J8}$ and $R^{J4}$ are represented by Formula (W) is more preferable.

In the compound represented by Formula (K), a group in which $R^{K7}$ is represented by Formula (W) is preferable and a group in which both of $R^{K7}$ and $R^{K3}$ are represented by Formula (W) is more preferable.

In the compound represented by Formula (L), a group in which at least one of $R^{L2}$, $R^{L3}$, $R^{L6}$, or $R^{L7}$ is represented by Formula (W) is more preferable.

In the compound represented by Formula (M), a group in which $R^{M2}$ is represented by Formula (W) is preferable and a group in which both of $R^{M2}$ and $R^{M6}$ are represented by Formula (W) is more preferable.

In the compound represented by Formula (N), a group in which $R^{N3}$ is represented by Formula (W) is preferable and a group in which both of $R^{N3}$ and $R^{N9}$ are represented by Formula (W) is more preferable.

In the compound represented by Formula (P), a group in which $R^{P2}$ or $R^{P3}$ is represented by Formula (W) is preferable and a group in which both of $R^{P2}$ and $R^{P8}$ or both of $R^{P3}$ and $R^{P9}$ are represented by Formula (W) is more preferable.

In the compound represented by Formula (Q), a group in which $R^{Q3}$ is represented by Formula (W) is preferable and a group in which both of $R^{Q3}$ and $R^{Q9}$ are represented by Formula (W) is more preferable.

In the compound represented by Formula (R), a group in which $R^{R2}$ is represented by Formula (W) is preferable and a group in which both of R$^{R2}$ and R$^{R7}$ are represented by Formula (W) is more preferable.

In the compound represented by Formula (S), a group in which R$^{S2}$ is represented by Formula (W) is preferable and a group in which both of R$^{S2}$ and R$^{S5}$ are represented by Formula (W) is more preferable.

In the compound represented by Formula (T), a group in which R$^{T2}$ is represented by Formula (W) is preferable and a group in which both of R$^{T2}$ and R$^{T5}$ are represented by Formula (W) is more preferable.

Among the substituents R$^C$ to R$^T$, the number of substituents other than the groups represented by Formula (W) is preferably in a range of 0 to 4 and more preferably in a range of 0 to 2.

Hereinafter, specific examples of respective compounds represented by Formulae (C) to (T) will be described, but the compounds which can be used in the present invention should not be limitatively interpreted by these specific examples.

Specific examples of compounds C represented by Formula (C) are described.

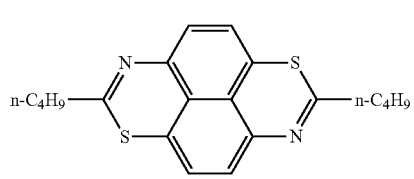
Compound C1

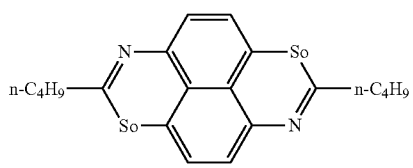
Compound C2

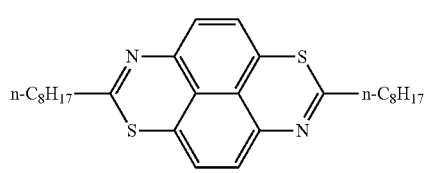
Compound C3

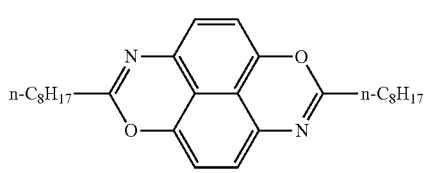
Compound C4

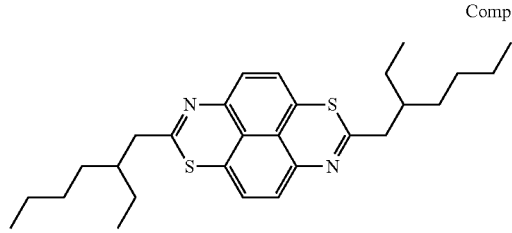
Compound C5

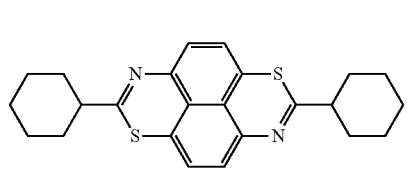
Compound C6

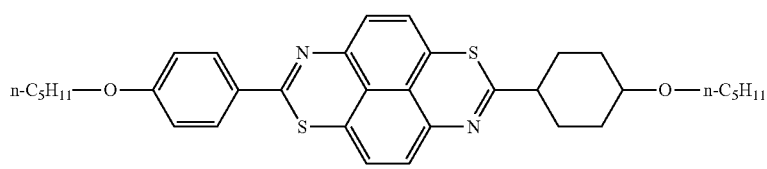
Compound C7

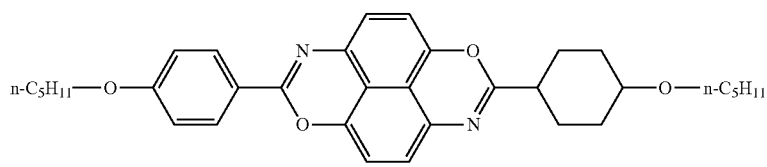
Compound C8

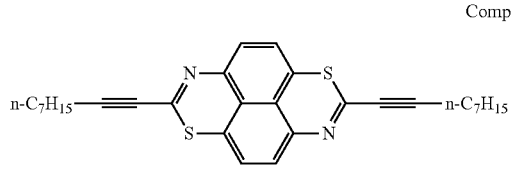
Compound C9

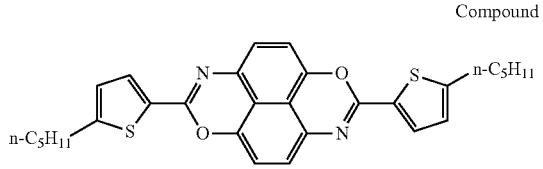
Compound C10

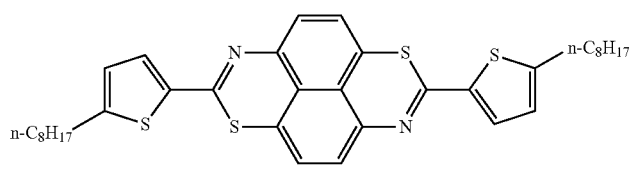
Compound C11

-continued
Compound C12
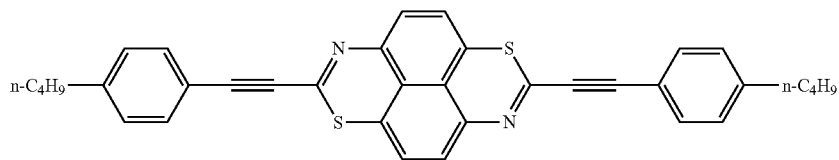
Compound C13
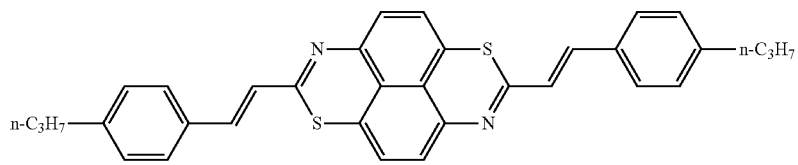
Compound C14
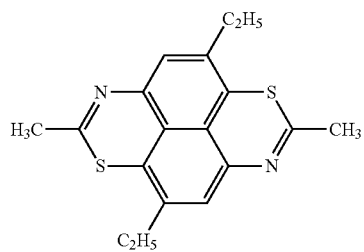
Compound C15
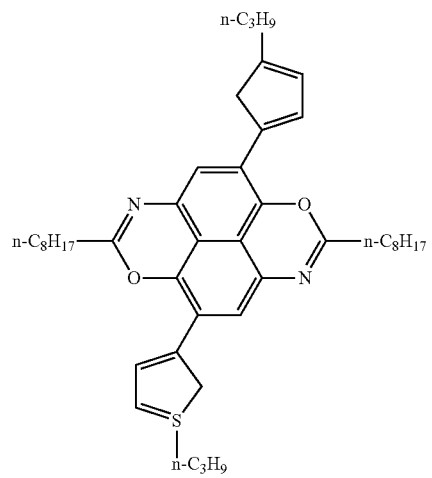
Compound C16
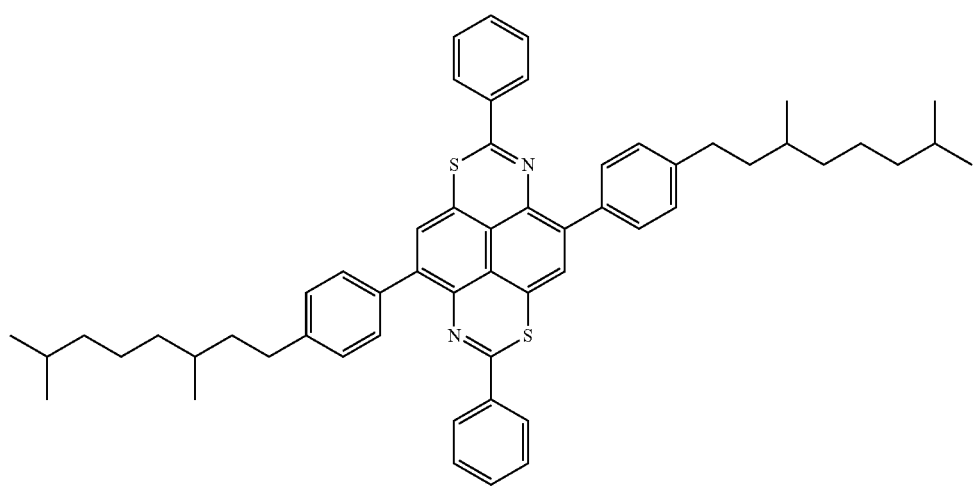

Compound C17

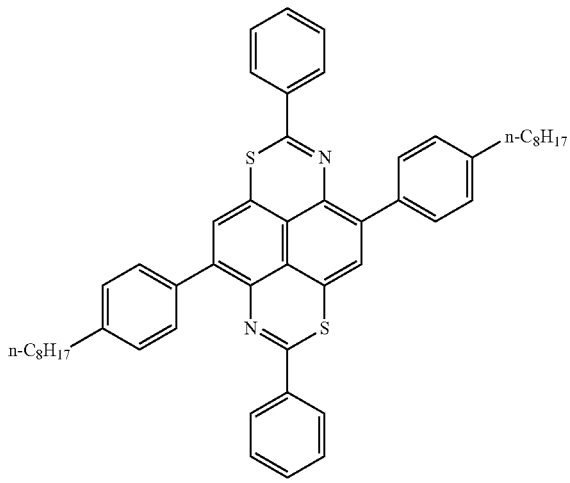

The molecular weight of a compound represented by Formula (C) is preferably 3000 or less, more preferably 2000 or less, still more preferably 1000 or less, and particularly preferably 850 or less. When the molecular weight is in the above-described range, the solubility in a solvent can be improved.

Meanwhile, from the viewpoint of stable film quality of a thin film, the molecular weight thereof is preferably 300 or greater, more preferably 350 or greater, and still more preferably 400 or greater.

Specific examples of compounds D represented by Formula (D) are described.

Compound D1

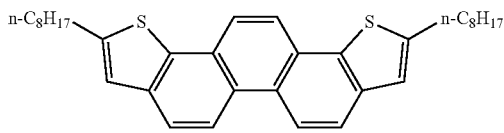

Compound D2

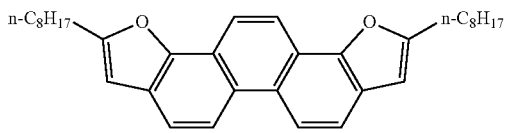

Compound D3

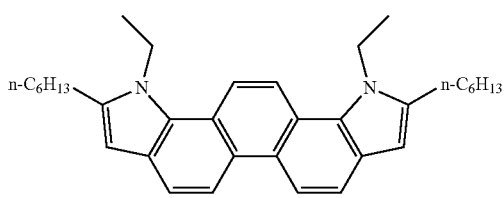

Compound D4

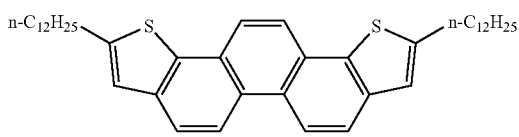

Compound D5

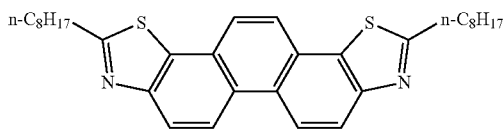

Compound D6

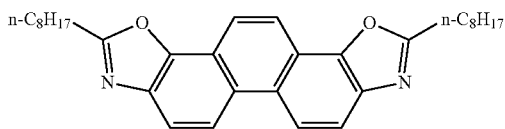

Compound D7

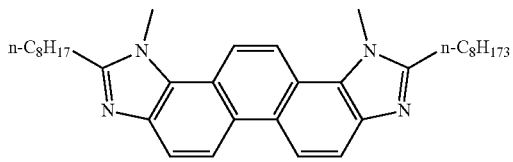

Compound D8

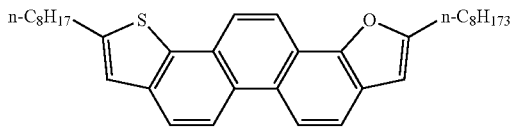

Compound D9

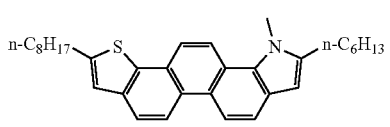

Compound D10

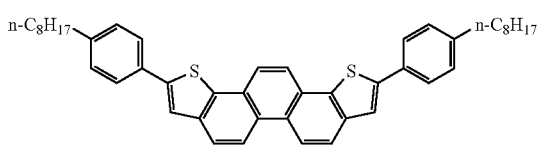

Compound D11

Compound D12

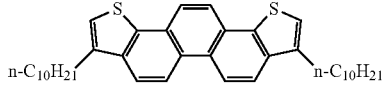

Compound D13

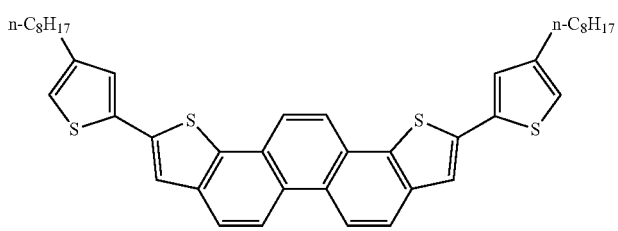

Compound D14

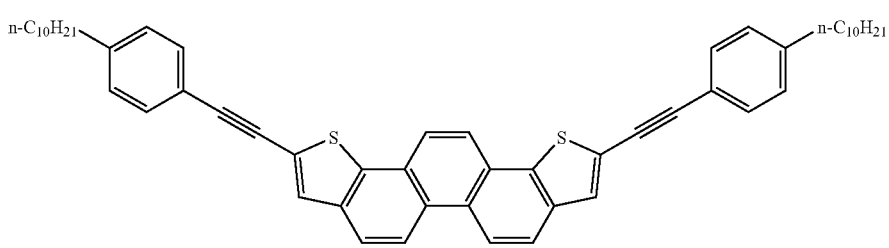

Compound D15

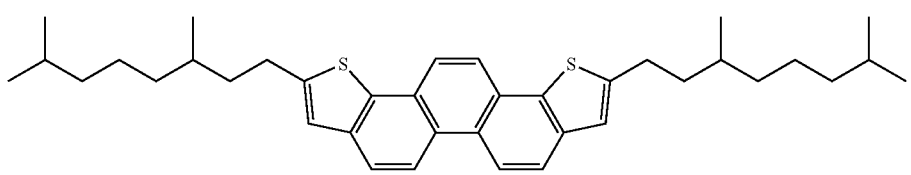

Compound D16

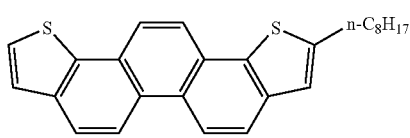

From the viewpoint of improving the solubility in a solvent, it is preferable that the upper limit of the molecular weight of a compound represented by Formula (D) is the same as that of the compound represented by Formula (C). Meanwhile, from the viewpoint of stable film quality of a thin film, the molecular weight thereof is preferably 400 or greater, more preferably 450 or greater, and still more preferably 500 or greater.

Specific examples of a compound E represented by Formula (E), a compound F represented by Formula (F), a compound G represented by Formula (G), and a compound H represented by Formula (H) are respectively described in order.

Compound E1

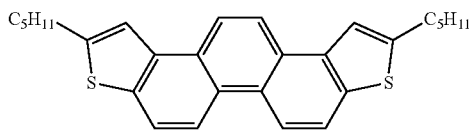

Compound E2

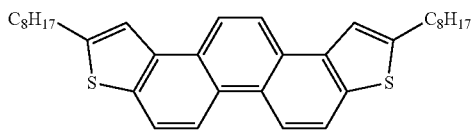

Compound E3

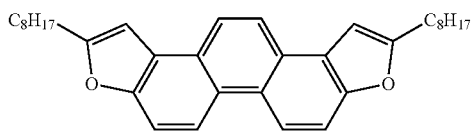

Compound E4

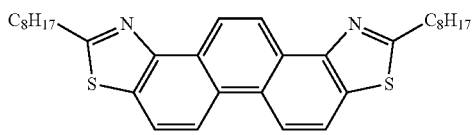

-continued
Compound E5
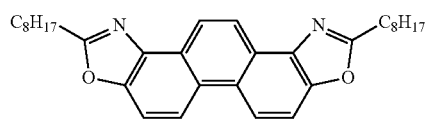
Compound E6
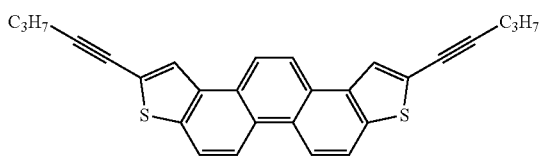
Compound E7
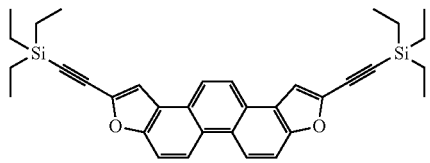
Compound E8
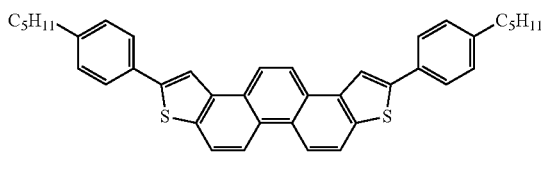
Compound E9
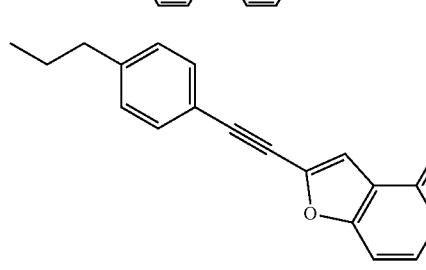
Compound E10
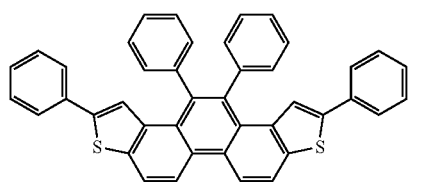
Compound E11
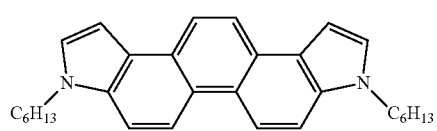
Compound E12
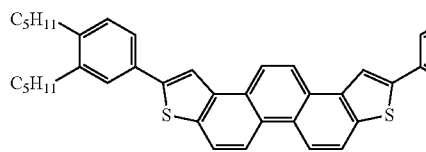
Compound E13
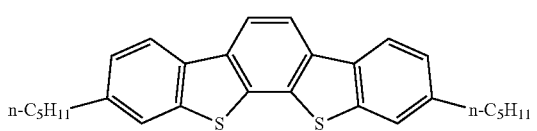
Compound F1
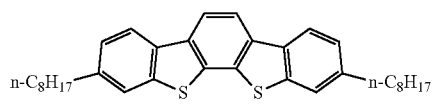
Compound F2
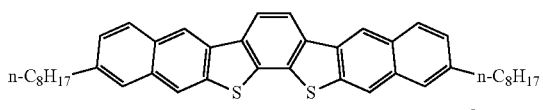
Compound F3
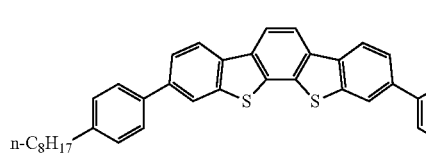
Compound F4
Compound F5
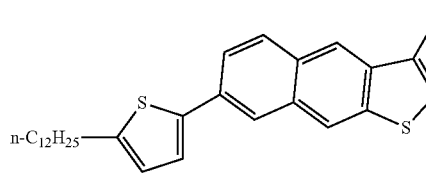
Compound F6

-continued
Compound F7
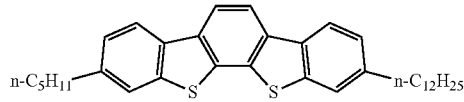
Compound F8
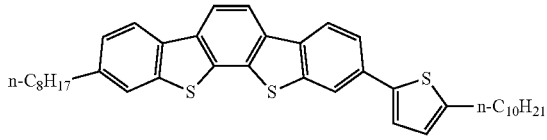
Compound F9
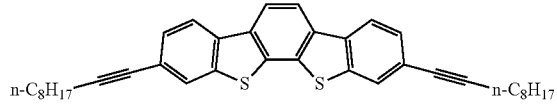
Compound F10
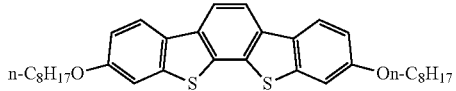
Compound F11
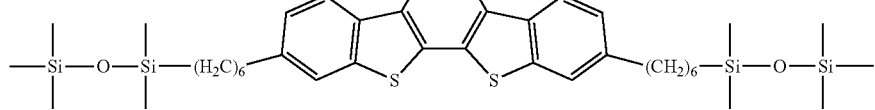
Compound F12
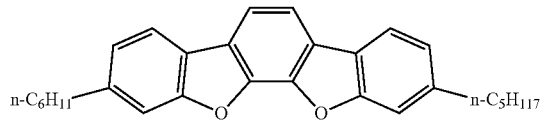
Compound G1
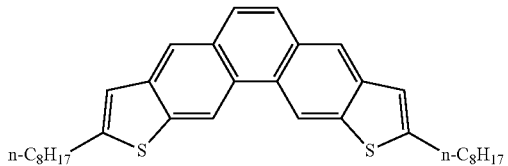
Compound G2
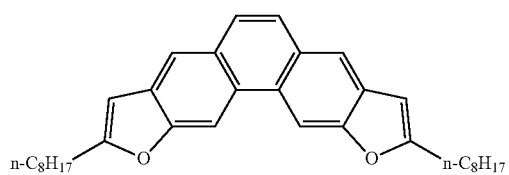
Compound G3
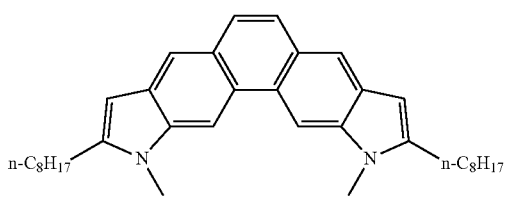
Compound G4
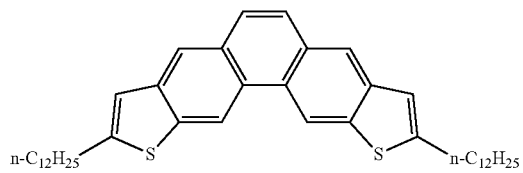
Compound G5
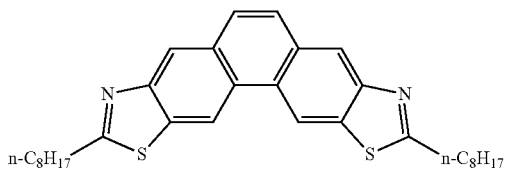
Compound G6
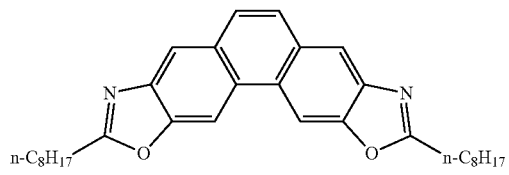
Compound G7
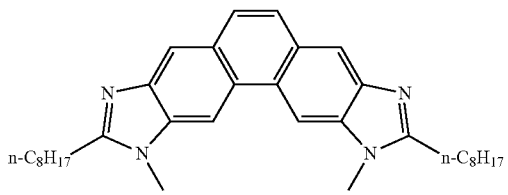
Compound G8
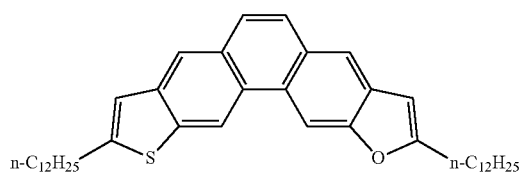
Compound G9
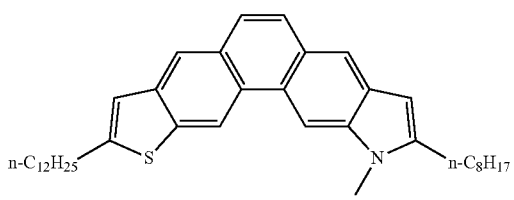

-continued
Compound G10
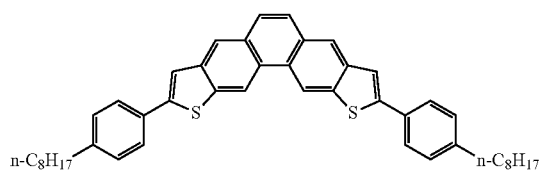
Compound G11
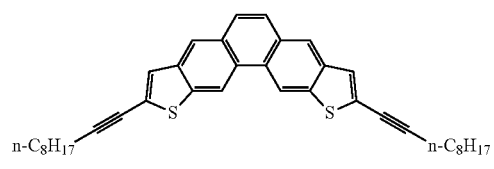
Compound G12
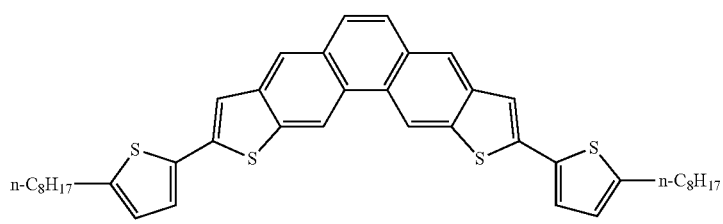
Compound G13
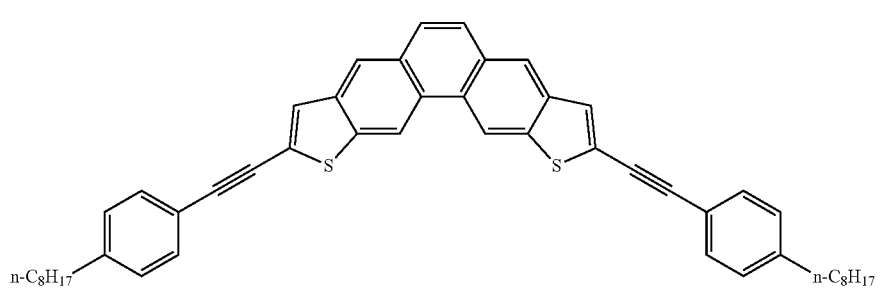
Compound G14
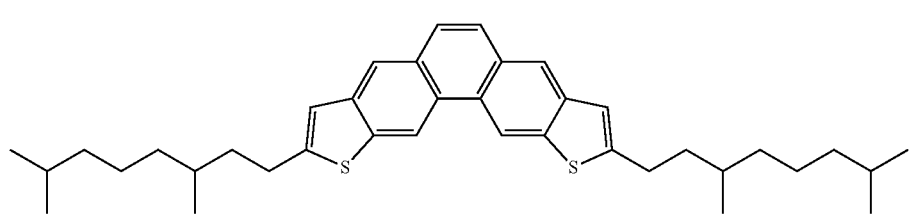
Compound G15
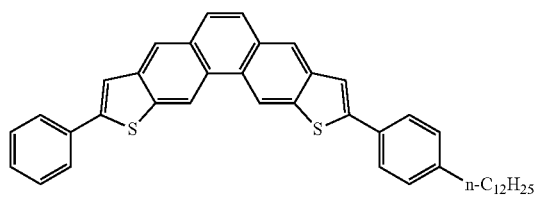
Compound H1
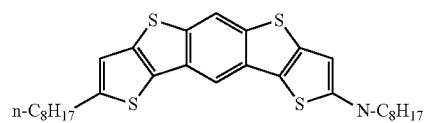
Compound H2
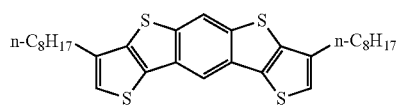
Compound H3
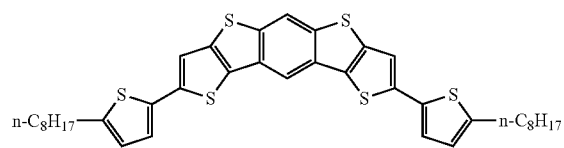
Compound H4
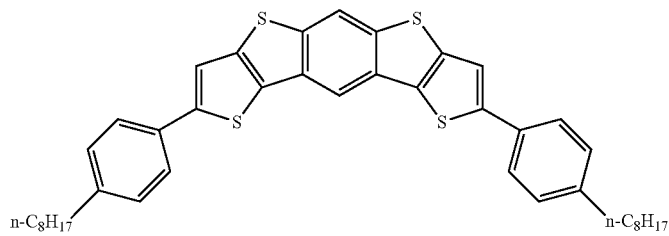

Compound H5

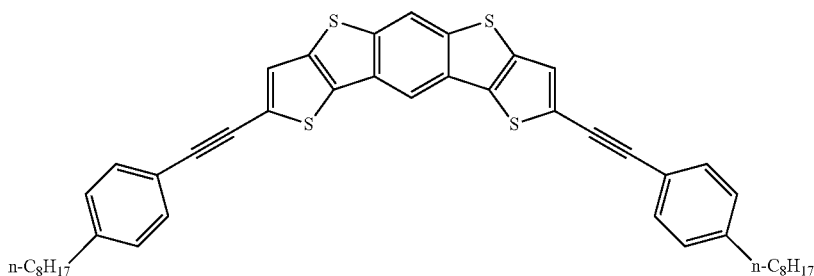

Compound H6

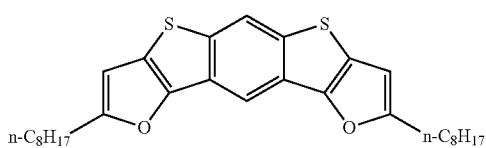

Compound H7

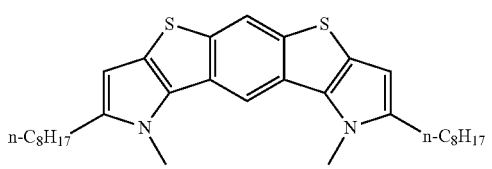

Compound H8

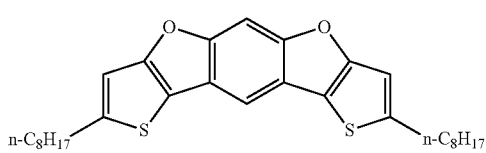

Compound H9

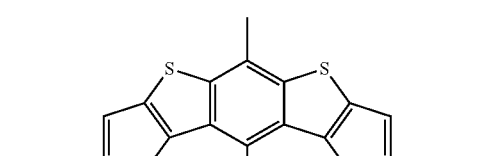

Compound H10

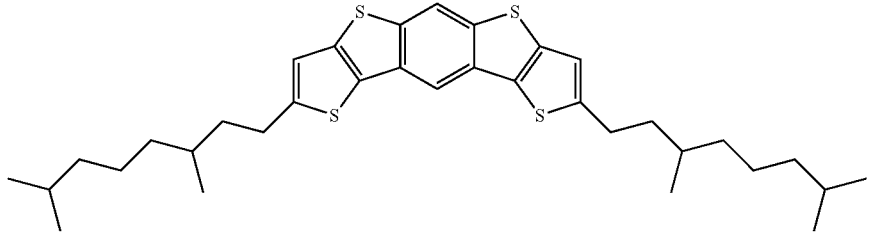

Compound H11

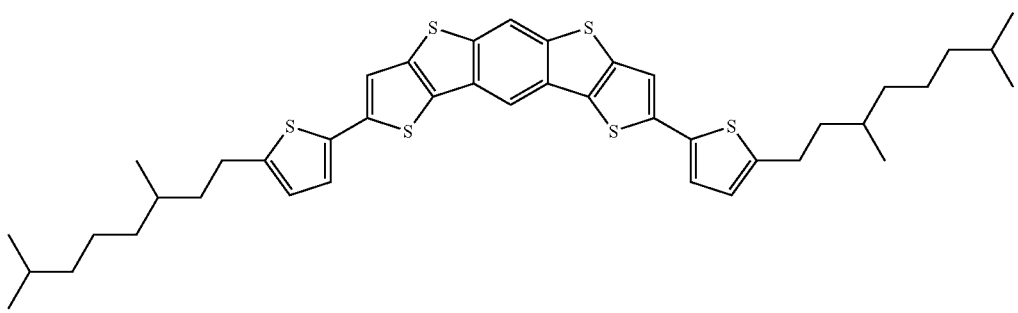

Compound H12

From the viewpoint of improving the solubility in a solvent, it is preferable that the upper limits of the molecular weights of the compounds E, F, G and H are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound J represented by Formula (J) and a compound K represented by Formula (K) are described.

Compound J1
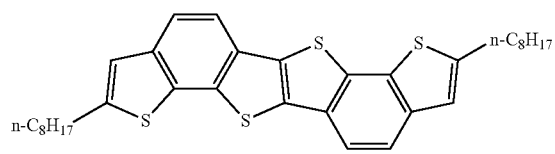
Compound J2
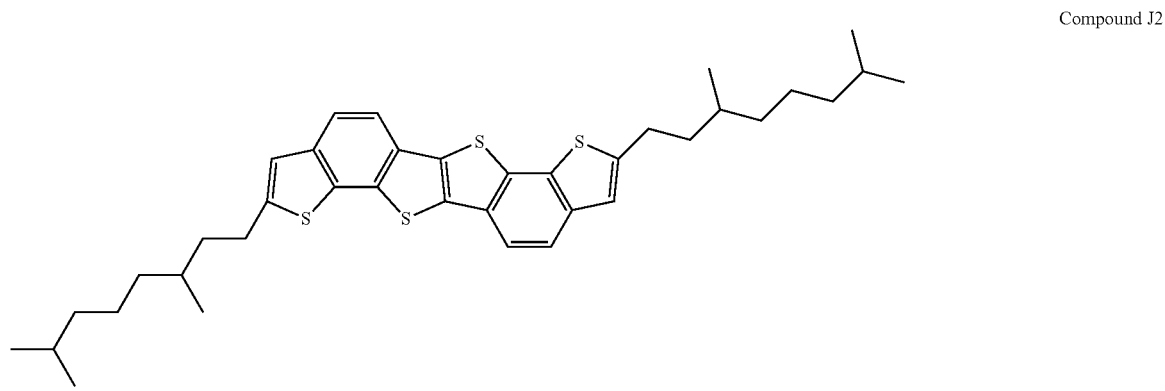
Compound J3
Compound J4
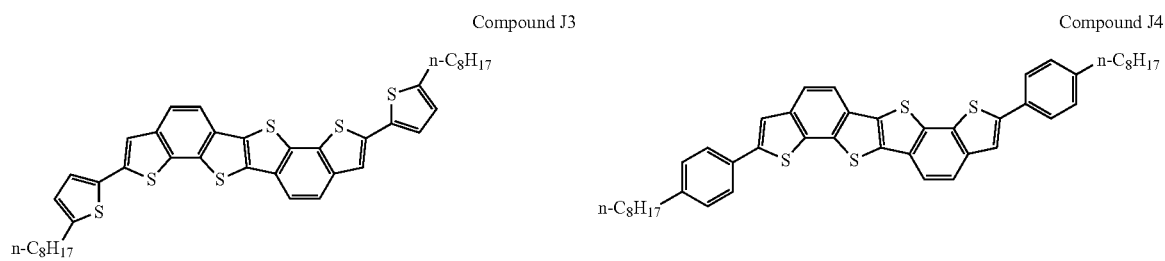
Compound J5
Compound J6
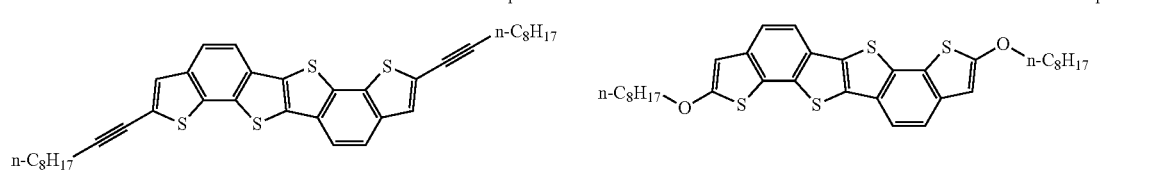
Compound J7
Compound J8
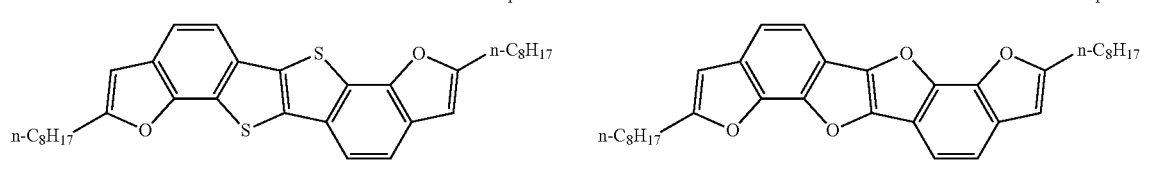
Compound K1
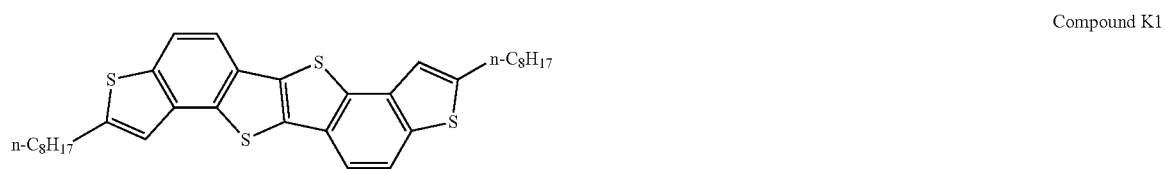

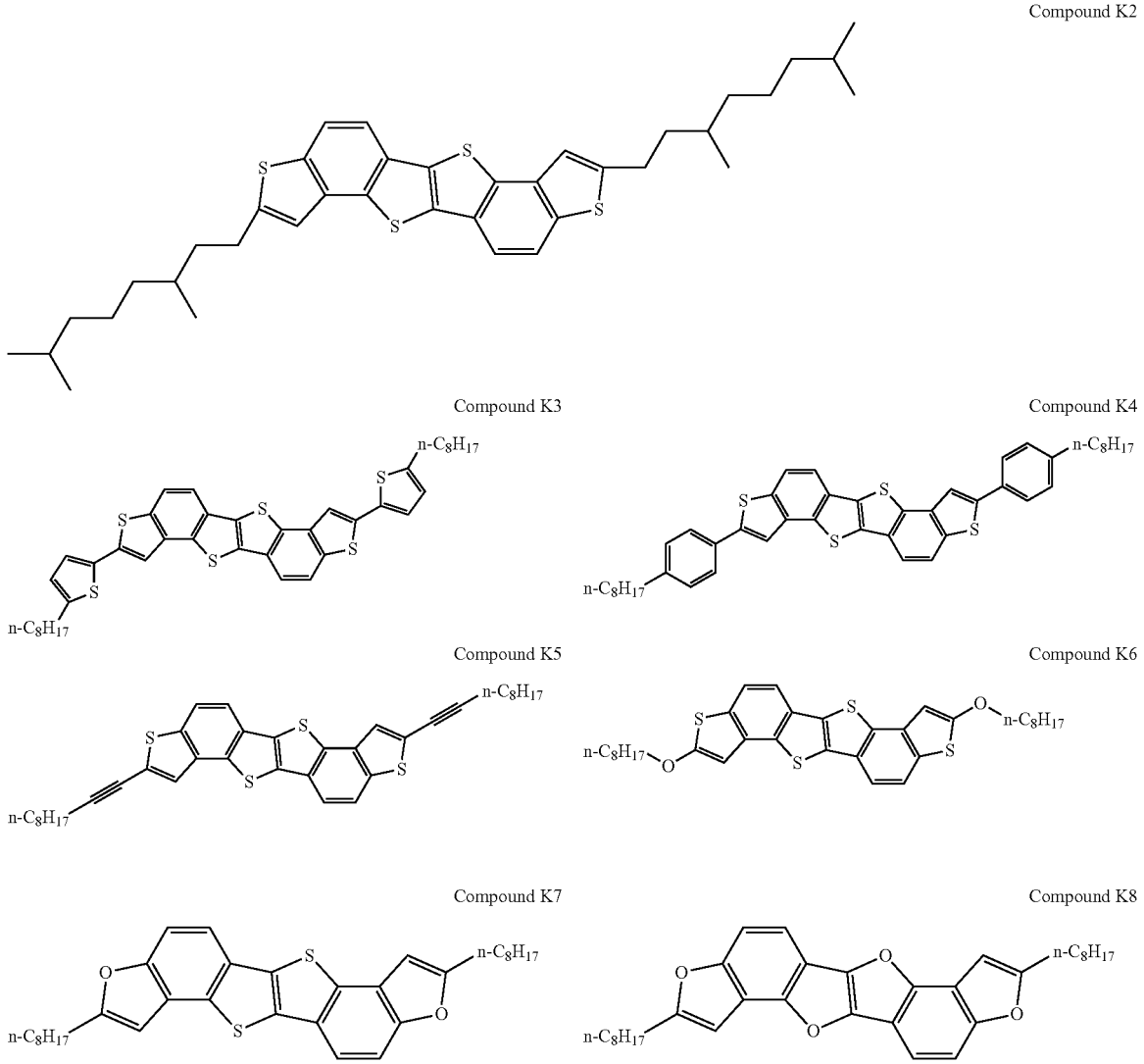

From the viewpoint of improving the solubility in a solvent, it is preferable that the upper limits of the molecular weights of the compounds J and K are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound L represented by Formula (L), a compound M represented by Formula (M), a compound N represented by Formula (N), a compound P represented by Formula (P), and a compound Q represented by Formula (Q) are respectively described in order.

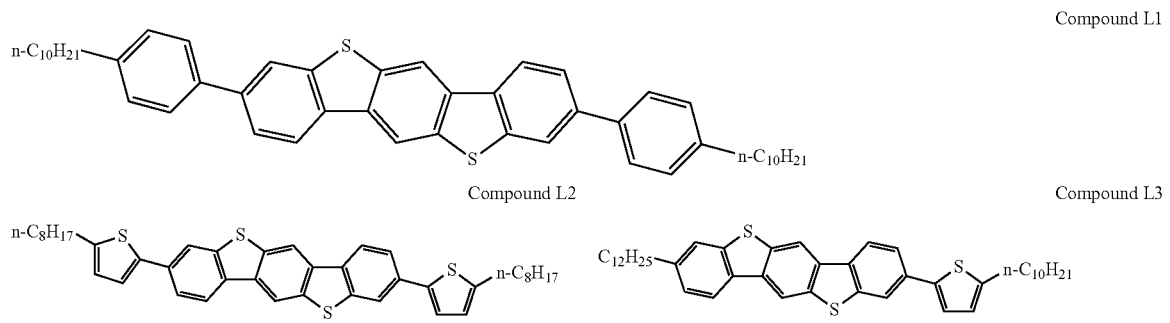

-continued
Compound L4
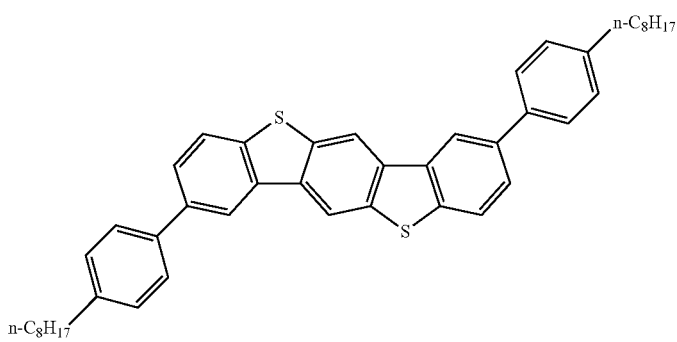
Compound L5
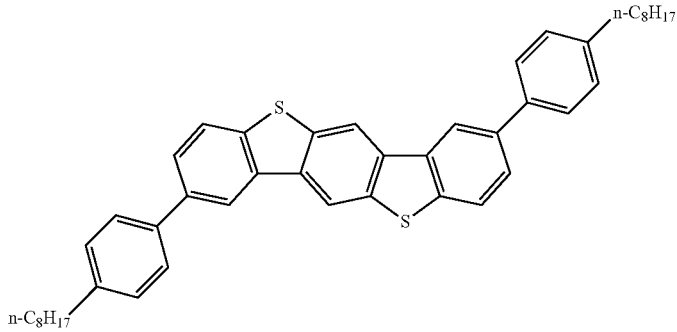
Compound L6
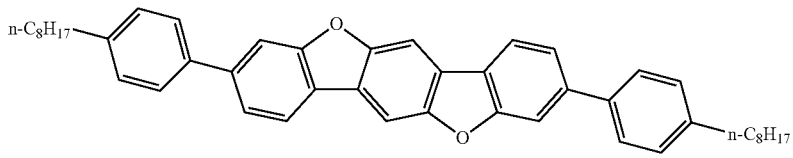
Compound L7
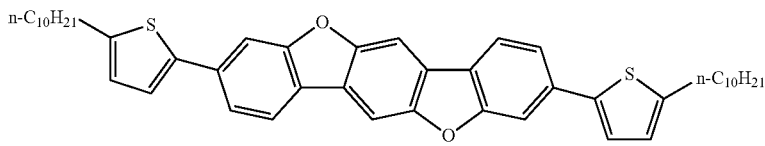
Compound L8
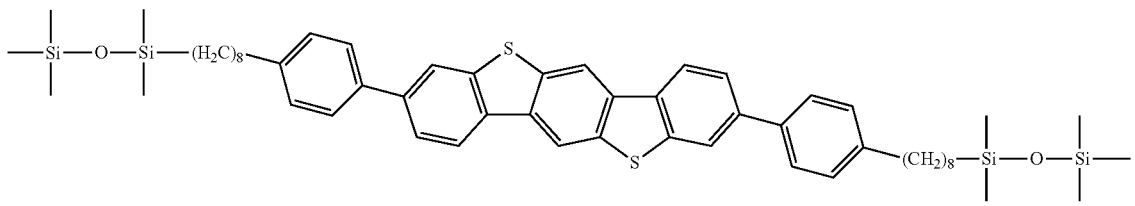
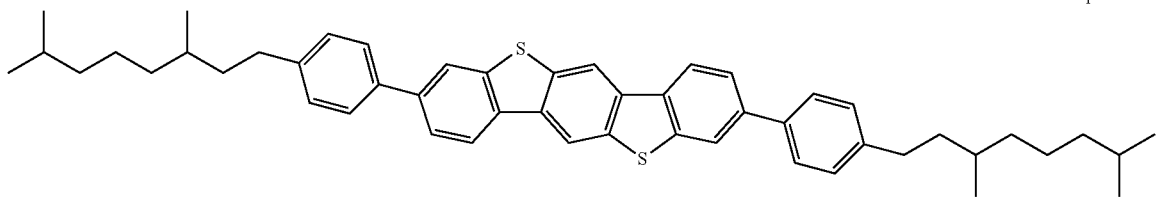
Compound L9
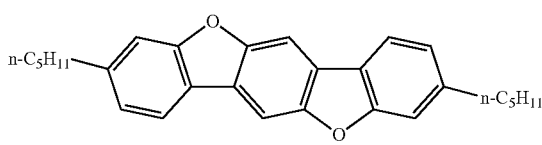
Compound L10
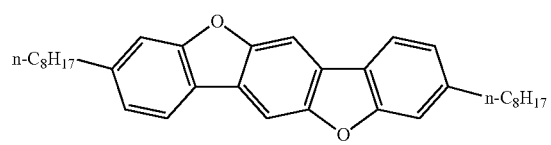

-continued
Compound L11
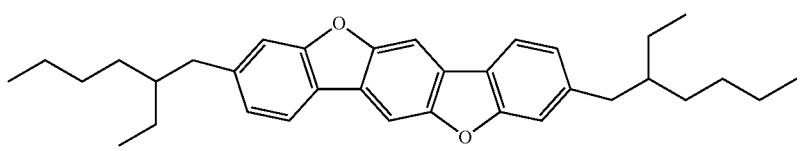
Compound L12
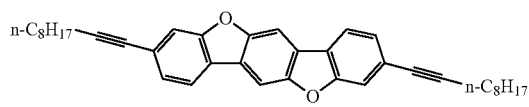
Compound L13
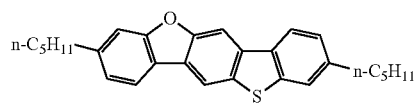
Compound L14
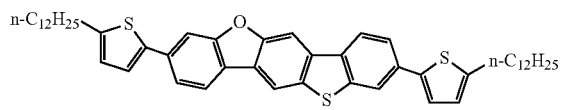
Compound L15
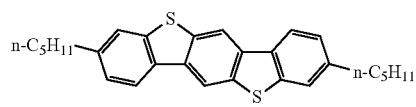
Compound M1
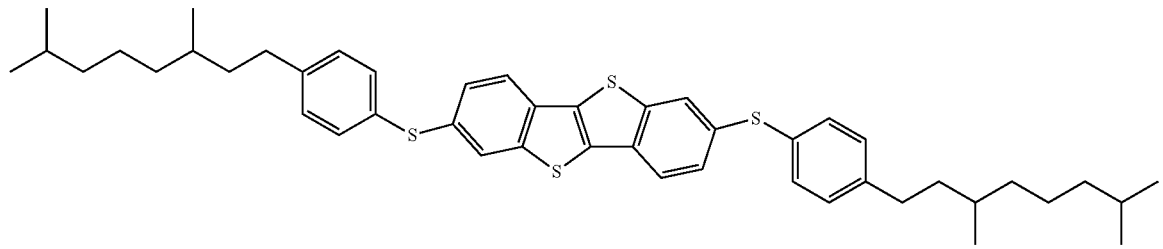
Compound M2
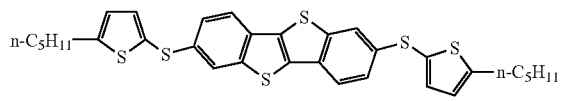
Compound M3
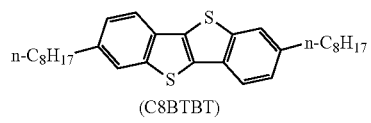
(C8BTBT)
Compound M4
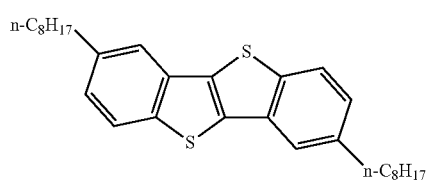
Compound M5
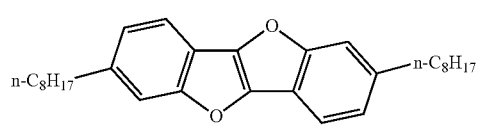
Compound M6
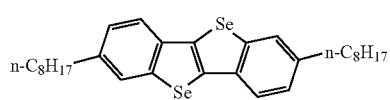
Compound M7
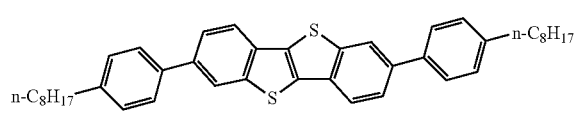
Compound M8
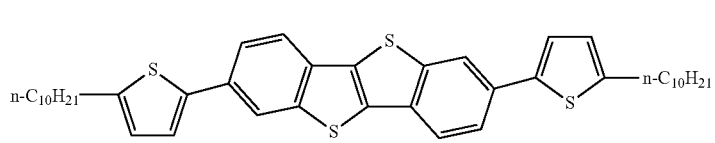

-continued
Compound N1
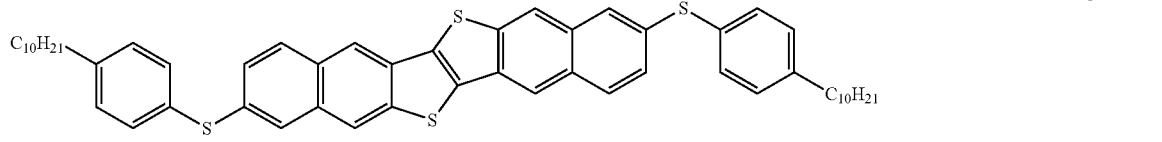
Compound N2
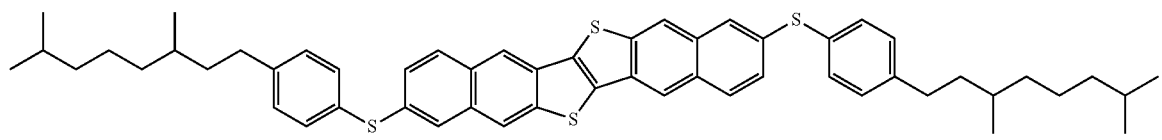
Compound N3
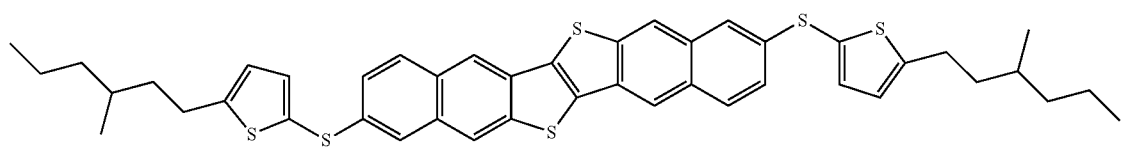
Compound N4
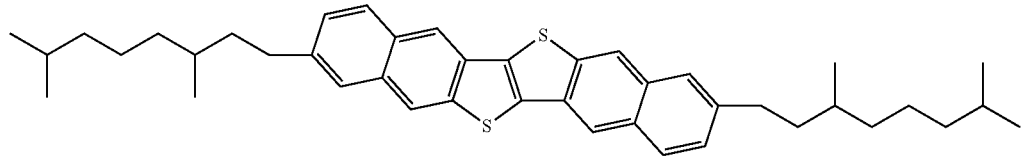
Compound N5
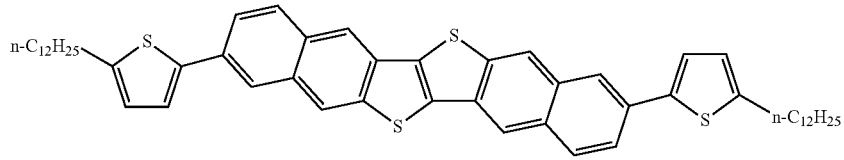
Compound N6
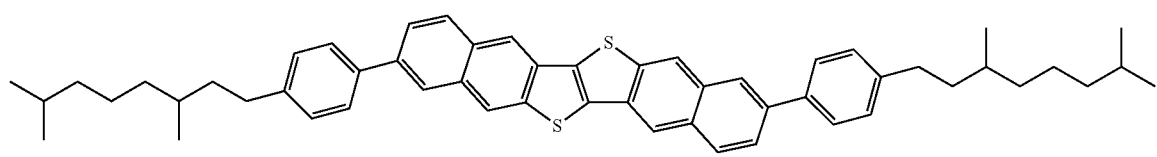
Compound N7
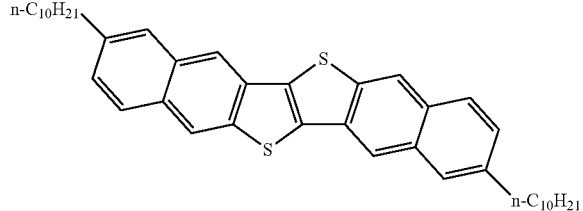

Compound P1
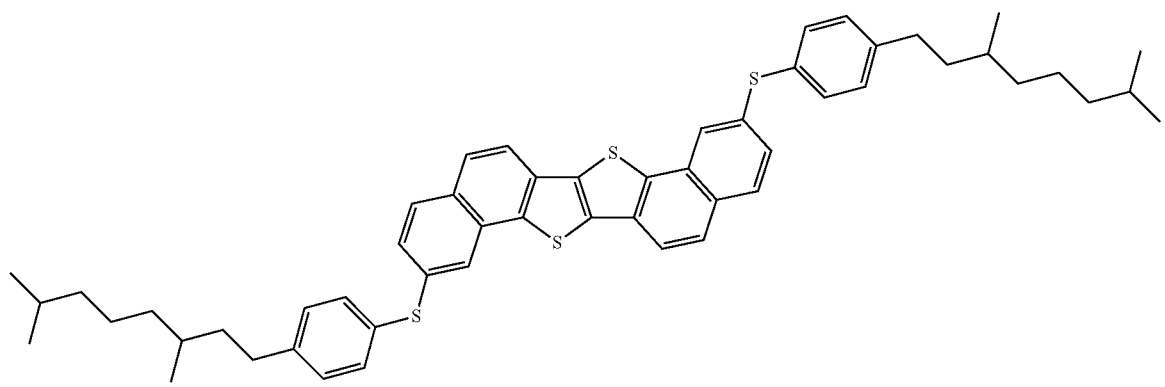
Compound P2
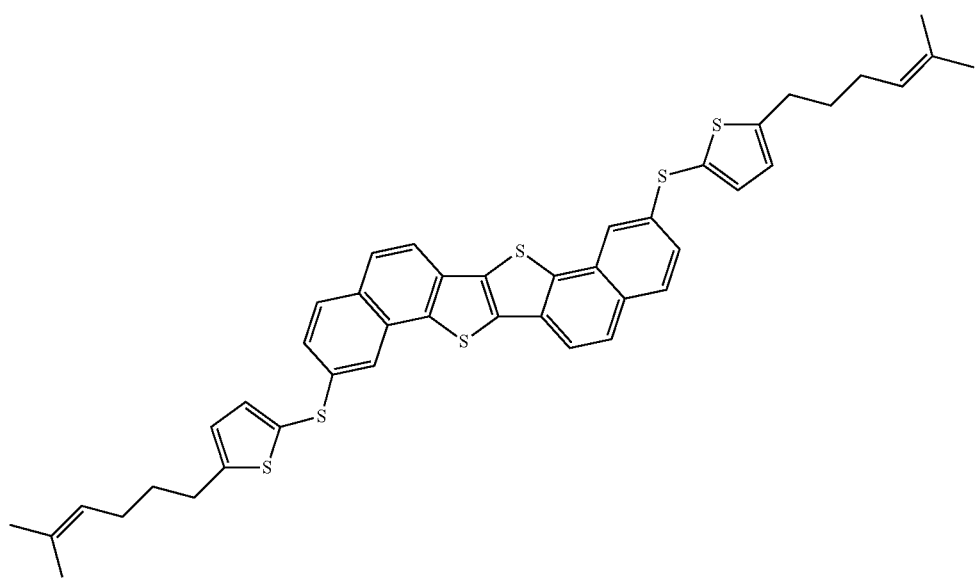
Compound P3
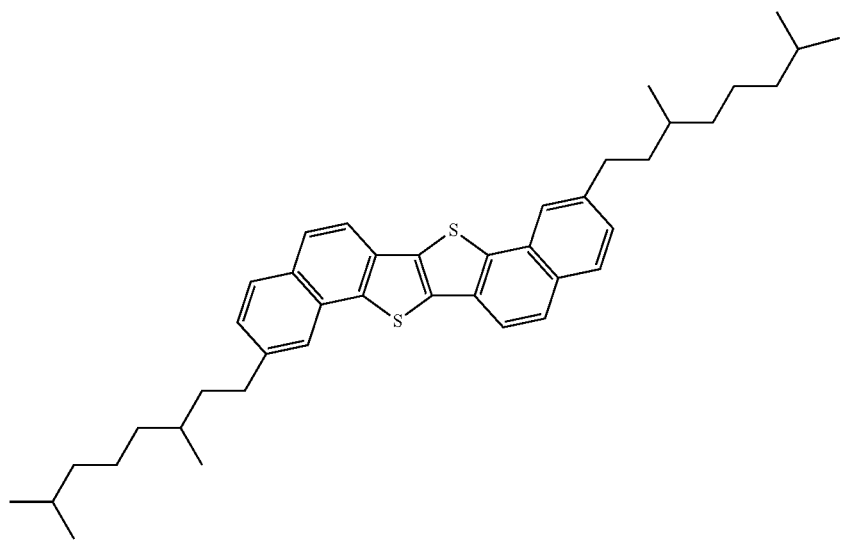

-continued
Compound P4
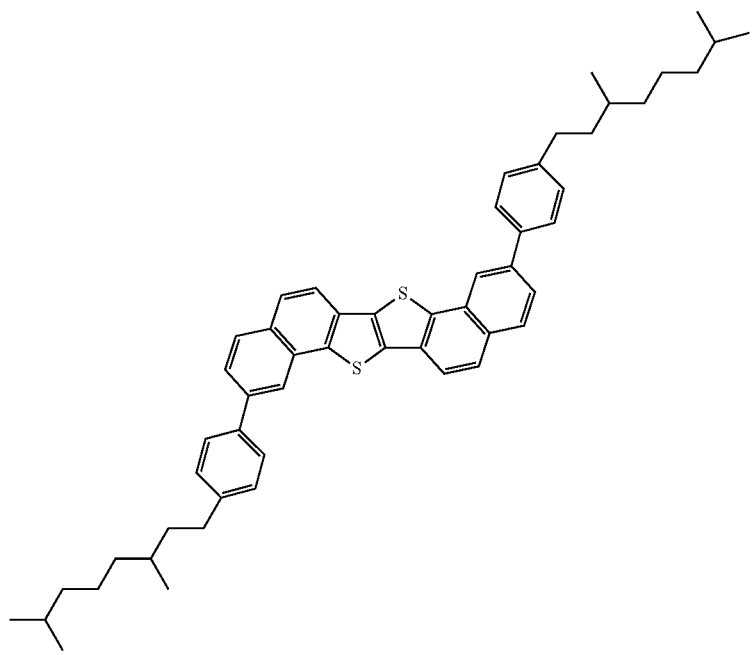
Compound P5
Compound P6
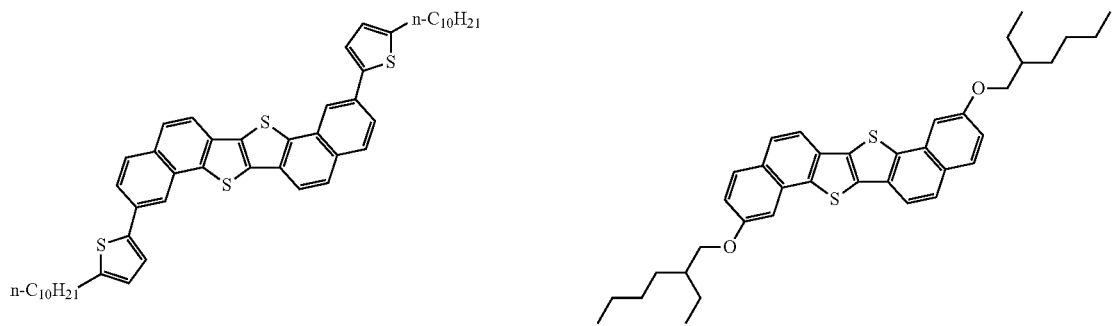
Compound Q1
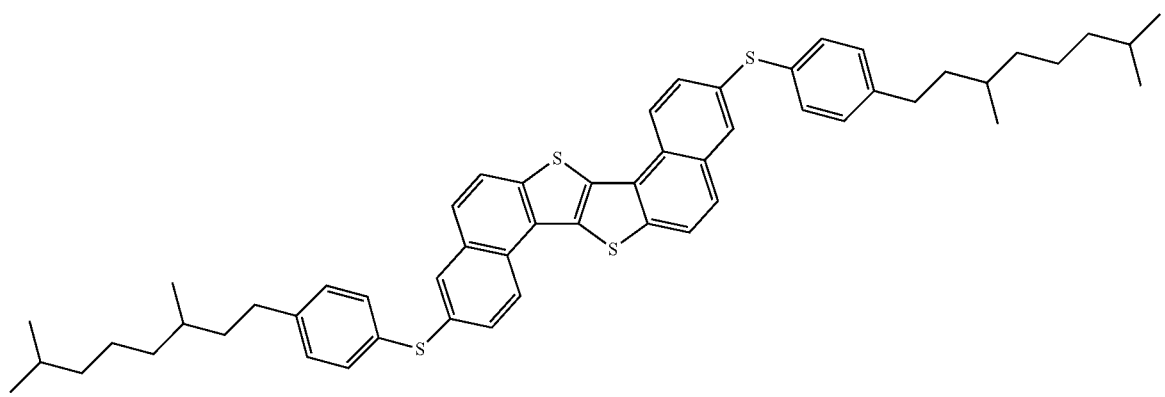

-continued
Compound Q2
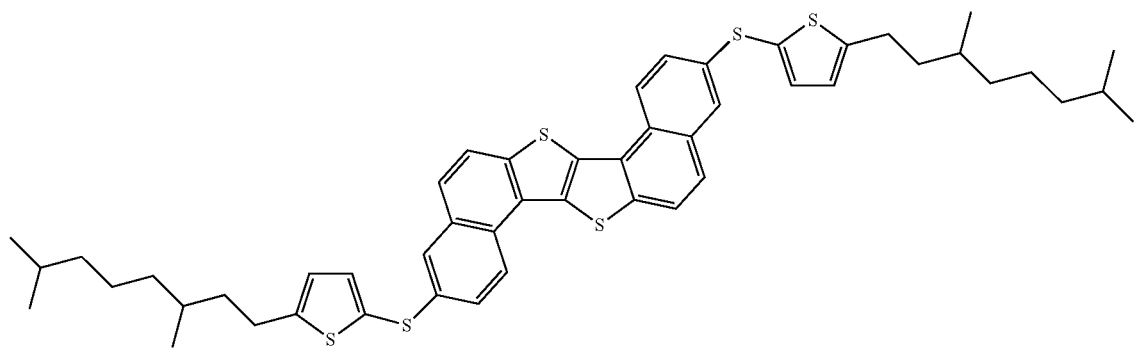
Compound Q3
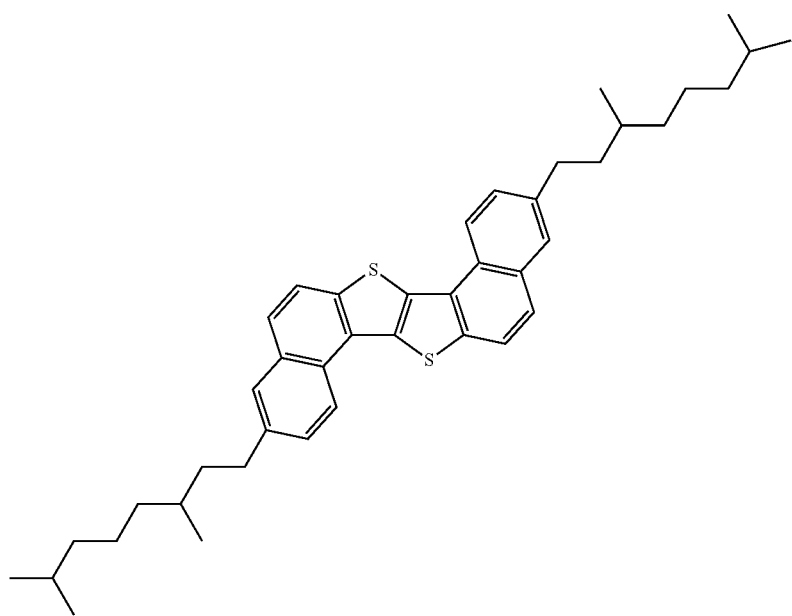
Compound Q4
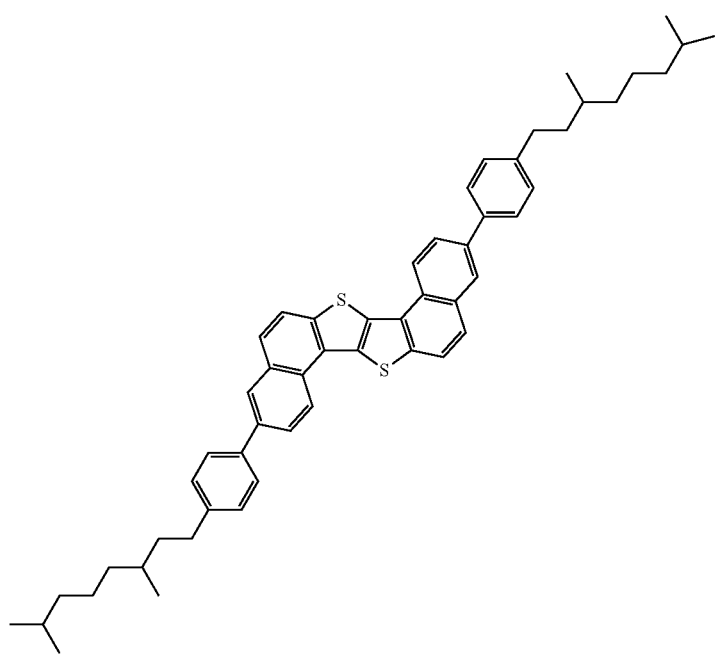

-continued

Compound Q5

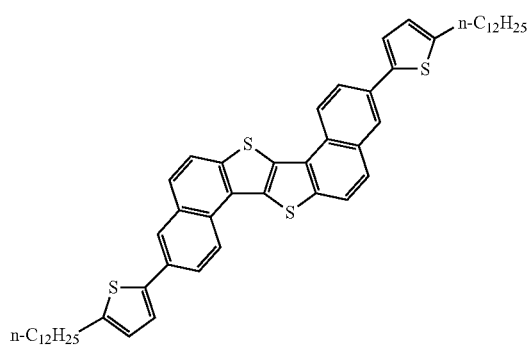

Compound Q6

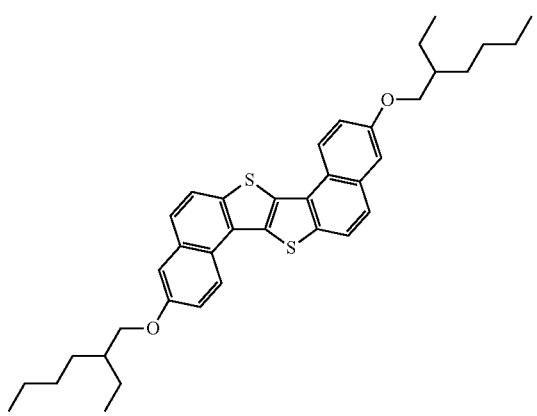

From the viewpoint of improving the solubility in a solvent, it is preferable that the upper limits of the molecular weights of the compounds L, M, N, P, and Q are respectively the same as that of the compound C represented by Formula (C). Meanwhile, from the viewpoint of stable film quality of a thin film, the lower limits of the molecular weights thereof are respectively the same as that of the compound represented by Formula (D).

Specific examples of a compound R represented by Formula (R), a compound S represented by Formula (S), and a compound T represented by Formula (T) are respectively described in order.

Compound R1

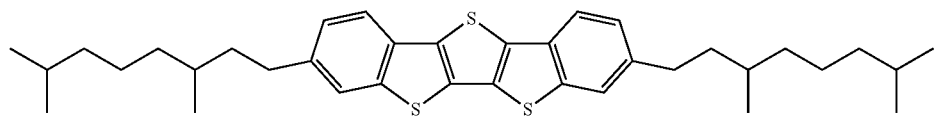

Compound R2

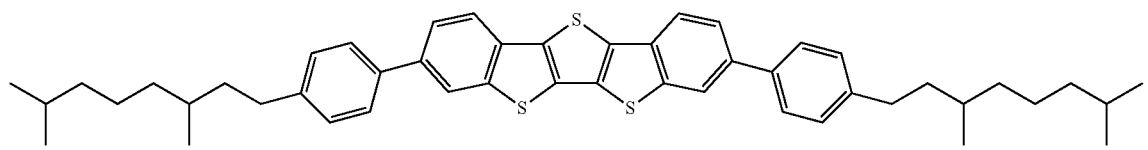

Compound R3

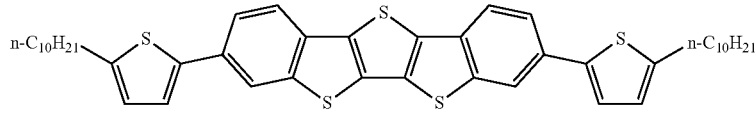

Compound R4

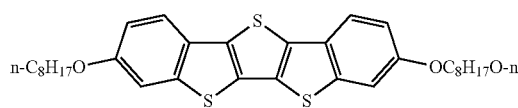

Compound S1

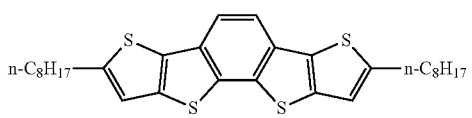

Compound S2

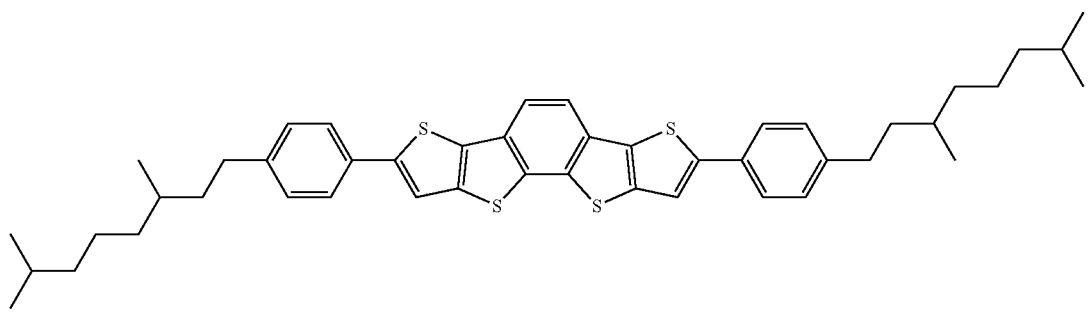

Compound S3

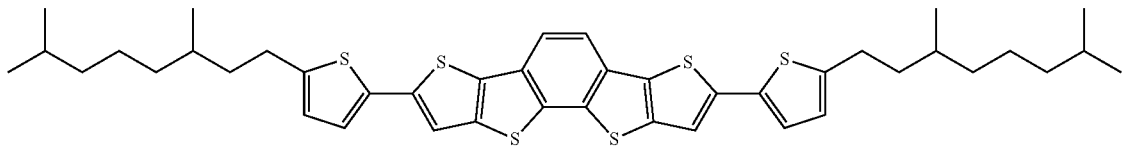

Compound S4

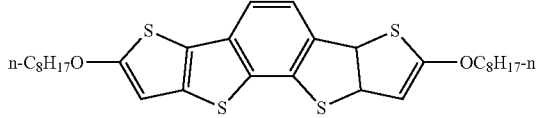

Compound T1

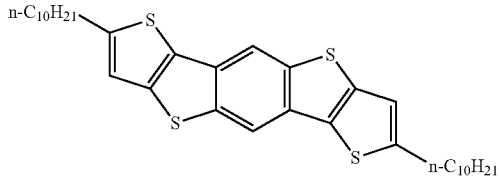

Compound T2

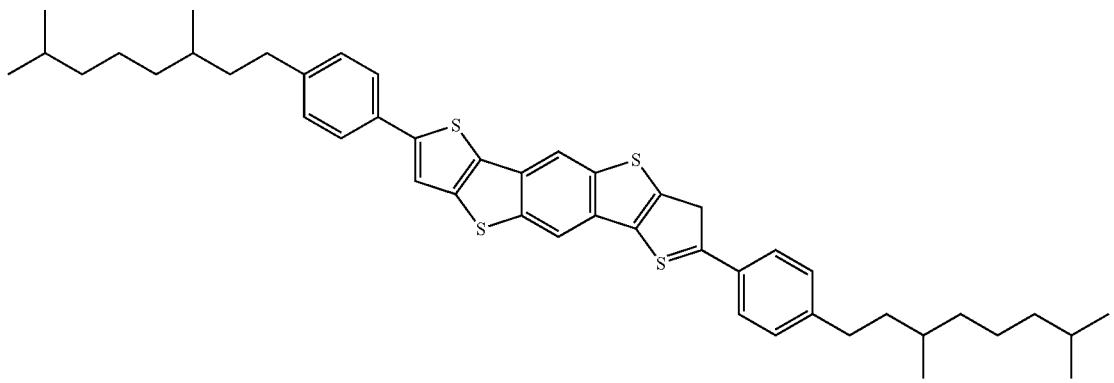

Compound T3

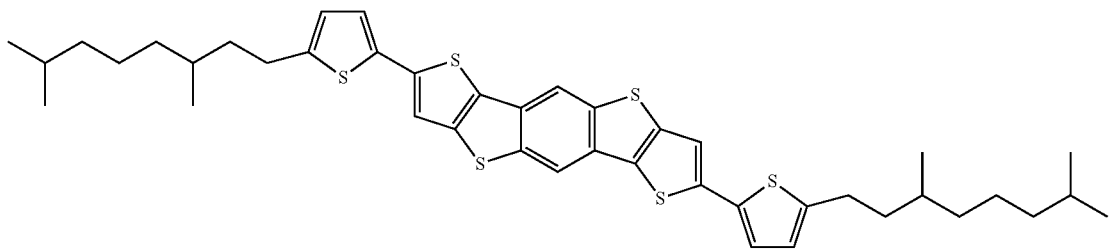

Compound T4

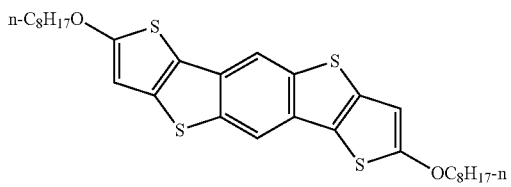

From the viewpoint of improving the solubility in a solvent, it is preferable that the upper limits of the molecular weights of the compounds R, S, and T are respectively the same as that of the compound C represented by Formula (C). Meanwhile, from the viewpoint of stable film quality of a thin film, the lower limits of the molecular weights thereof are respectively the same as that of the compound represented by Formula (D).

Examples of an organic polymer and a derivative thereof include polypyrrole and a derivative thereof, polydiketopyrrole and a derivative thereof, polythiophene and a derivative thereof, isothianaphthene such as polyisothianaphthene, thienylene vinylene such as polythienylene vinylene, poly (p-phenylenevinylene), polyaniline and a derivative thereof, polymers such as polyacetylene, polydiacetylene, polyazulene, polypyrene, polycarbazole, polyselenophene, polyfuran, poly(p-phenylene), polyindole, polypyridazine, polytellurophene, polynaphthalene, polyvinylcarbazole, polyphenylene sulfide, and polyvinylene sulfide, and a polymer of a fused polycyclic aromatic compound.

The polythiophene and a derivative thereof are not particularly limited, and examples thereof include poly-3-hexylthiophene (P3HT) in which a hexyl group is introduced into polythiophene, polyethylene dioxythiophene, and poly (3,4-ethylenedioxythiophene)/polystyrenesulfonic acid (PEDOT/PSS).

Further, oligomers (such as oligothiophene) having repeating units which are the same as those of these polymers may also be exemplified.

Moreover, examples of the organic polymer include polymer compounds in which compounds represented by the following Formulae (C) to (T) have a repeating structure.

Examples of such polymers compound include n-conjugated polymers in which the compounds represented by Formulae (C) to (T) have a repeating structure through at least one or more arylene groups or heteroarylene groups (such as thiophene or bithiophene) and pendant type polymers in which the compounds represented by Formulae (C) to (T) are bonded to the polymer main chains through the side chains. Preferred examples of the polymer main chain include polyacrylate, polyvinyl, and polysiloxane and preferred examples of the side chain include an alkylene group and a polyethylene oxide group. In a case of the pendant type polymer, the polymer main chain may be formed by at least one of the substituents $R^C$ to $R^T$ having a group derived from a polymerizable group to be polymerized.

The weight-average molecular weight of these organic polymers is preferably 30000 or greater, more preferably 50000 or greater, and still more preferably 100000 or greater. When the weight-average molecular weight is set to be the above-described lower limit or greater, intermolecular interaction can be increased so that high mobility is obtained.

In addition to the above-described organic polymer, it is preferable to use a resin (D) other than the block copolymer. Examples of the resin (D) include an insulating polymer such as polystyrene, poly α-methylstyrene, polycarbonate, polyarylate, polyester, polyamide, polyimide, polyurethane, polysiloxane, polysilsesquioxane, polysulfone, polymethacrylate represented by polymethyl methacrylate, polyacrylate represented by polymethyl acrylate, cellulose represented by triacetyl cellulose, polyethylene, polypropylene, polyvinyl phenol, polyvinyl alcohol, or polyvinyl butyral, and a copolymer obtained by copolymerizing two or more kinds of these constituent components.

In a case of using the resin (D), the mass ratio of the organic polymer polymer is preferably 10% by mass or greater and less than 100% by mass and more preferably 20% by mass or greater and less than 100% by mass with respect to the total amount of the organic polymer and the resin (D).

The total content of the organic polymer and the resin (D) in the organic semiconductor layer is preferably in a range of 1% to 80% by mass, more preferably in a range of 5% to 60% by mass, and still more preferably in a range of 10% to 50% by mass.

When the organic semiconductor layer is formed on the gate insulating layer using a wet method (wet coating method), it is easy to obtain a high-performance OTFT at low cost in a simple manner and this method is suitable for a large area. Accordingly, a wet method is preferable as the method of forming the organic semiconductor layer.

The wet method is not particularly limited, and the organic semiconductor layer can be formed by coating the gate insulating layer with a semiconductor material using a spin coating method, an ink-jet method, nozzle printing, stamp printing, screen printing, gravure printing, or an electrospray deposition method and drying the layer.

In a case where the organic semiconductor layer is formed on the gate insulating layer using a wet coating method, since the OTFT is likely to have high performance, it is preferable that the organic semiconductor layer is subjected to a crystallization treatment and particularly preferable that the organic semiconductor layer is subjected to a crystallization treatment through heating or irradiation with laser.

The method of the crystallization treatment is not particularly limited, and examples thereof include heating using a hot plate or an oven and irradiation with laser. As the heating temperature, a high temperature is preferable from the viewpoint that crystallization easily progresses and a low temperature is preferable from the viewpoint that a substrate or the like is unlikely to be affected by the heat. Specifically, the heating temperature thereof is preferably 50° C. or higher and particularly preferably 100° C. or higher. Further, the heating temperature is preferably 300° C. or lower and particularly preferably 250° C. or lower.

<Inorganic Semiconductor Layer>

An inorganic semiconductor material that forms a semiconductor layer is not particularly limited, but a coating type semiconductor is preferable. Further, preferred examples thereof include an oxide semiconductor.

The oxide semiconductor is not particularly limited as long as the oxide semiconductor is formed of a metal oxide. It is preferable that a semiconductor layer formed of an oxide semiconductor is formed using an oxide semiconductor precursor, that is, a material converted into a semiconductor material formed of a metal oxide when subjected to a conversion treatment such as thermal oxidation.

The oxide semiconductor is not particularly limited, and examples thereof include indium gallium zinc oxide, indium gallium oxide, indium tin zinc oxide, gallium zinc oxide, indium tin oxide, indium zinc oxide, tin zinc oxide, zinc oxide, and tin oxide, such as $InGaZnO_x$, $InGaO_x$, $InSnZnO_x$, $GaZnO_x$, $InSnO_x$, $InZnO_x$, $SnZnO_x$ (all cases, x>0), ZnO, and $SnO_2$.

Examples of the oxide semiconductor precursor include metal nitrate, a metal halide, and alkoxide. The metal contained in the oxide semiconductor precursor is at least one selected from the group consisting of Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu.

Specific examples of the oxide semiconductor precursor include indium nitrate, zinc nitrate, gallium nitrate, tin nitrate, aluminum nitrate, indium chloride, zinc chloride, tin chloride (divalent), tin chloride (tetravalent), gallium oxide, aluminum oxide, tri-i-propoxyindium, diethoxy zinc, bis (dipivaloylmethanato) zinc, tetraethoxy tin, tetra-i-propoxy tin, tri-i-propoxy gallium, and tri-i-propoxy aluminum.

The inorganic semiconductor layer can be provided using a known method.

The film thickness of the semiconductor layer is optional, and preferably 1 nm or greater and more preferably 10 nm or greater. Further, the film thickness thereof is preferably 10 μm or less, more preferably 1 μm or less, and particularly preferably 500 nm or less.

[Source Electrode and Drain Electrode]

In the TFT of the present invention, a source electrode is an electrode into which a current from the outside flows through wiring. Further, a drain electrode is an electrode that sends the current to the outside through the wiring and is typically provided in contact with the above-described semiconductor layer.

As materials of the source electrode and the drain electrode, conductive materials used for organic thin-film transistors of the related art can be used, and examples thereof include the conductive materials described in the section of the gate electrode above.

The source electrode and the drain electrode can be respectively formed according to the same method as the method of forming the above-described gate electrode.

The above-described photolithography method, a lift-off method or an etching method can be employed.

Particularly, since the gate insulating layer has excellent resistance to an etching solution or a stripping solution, the source electrode and the drain electrode can be suitably formed even when an etching method is employed. The etching method is a method of removing unnecessary portions by etching after a film is formed using a conductive material. When patterning is performed according to the etching method, it is possible to prevent peeling of a conductive material remaining on a base at the time of removing a resist and to prevent re-attachment of resist residues or the removed conductive material to the base. Accordingly, the shape of an electrode edge portion is excellent. From this viewpoint, the etching method is preferred than the lift-off method.

The lift-off method is a method of coating a portion of a base with a resist, forming a film thereon with a conductive material, and eluting or peeling the resist and the like using a solvent so that the conductive material on the resist is entirely removed, and then forming a film of the conductive material only on the portion which is not coated with the resist.

The thicknesses of the source material and the drain material are optional, but are respectively preferably 1 nm or greater and particularly preferably 10 nm or greater. Further, the thickness thereof is preferably 500 nm or less and particularly preferably 300 nm or less.

The space (channel length) between the source electrode and the drain electrode is optional, but is preferably 100 μm or less and particularly preferably 50 μm or less. Further, the channel width thereof is preferably 5000 μm or less and particularly preferably 1000 μm or less.

[Overcoat Layer]

The TFT of the present invention may have an overcoat layer. The overcoat layer is typically a layer formed on the surface of a TFT as a protective layer. The overcoat layer may have a single-layer structure or a multi-layer structure.

The overcoat layer may be organic or inorganic.

The material forming an organic overcoat layer is not particularly limited, and examples thereof include organic polymers such as polystyrene, an acrylic resin, polyvinyl alcohol, polyolefin, polyimide, polyurethane, polyacenaphthylene, and an epoxy resin, and derivatives obtained by introducing a crosslinkable group or a water-repellent group into these organic polymers. These organic polymers or derivatives thereof can be also used in combination with a crosslinking component, a fluorine compound, or a silicon compound.

The material forming an inorganic overcoat layer is not particularly limited, and examples thereof include metal oxides such as silicon oxide and aluminum oxide, and metal nitrides such as silicon nitride.

These materials may be used alone or in combination of optional two or more kinds thereof at an optional ratio.

A method of forming an overcoat layer is not limited and an overcoat layer can be formed according to known various methods.

For example, an organic overcoat layer can be formed using a method of coating an underlayer with a solution containing a material which becomes the overcoat layer and drying the layer, or a method of coating an underlayer with a solution containing a material which becomes the overcoat layer, drying the layer, exposing the layer to light, and developing the layer to be patterned. Moreover, the patterning of the overcoat layer can be directly formed using a printing method or an ink-jet method. In addition, after the overcoat layer is patterned, the overcoat layer may be cross-linked by being exposed to light or heated.

Meanwhile, an inorganic overcoat layer can be formed using a dry method such as a sputtering method or a vapor deposition method or a wet method such as a sol-gel method.

[Other Layers]

The TFT of the present invention may be provided with other layers or members.

As other layers or members, a bank may be exemplified. A bank is used for the purpose of holding a discharge liquid in a predetermined position when a semiconductor layer or an overcoat layer is formed using an ink-jet method. For this reason, a bank typically has liquid repellency. Examples of forming a bank include a method of performing a liquid repellent treatment such as a fluorine plasma method after patterning is performed according to a photolithography method or the like and a method of hardening a photosensitive composition or the like containing liquid repellent components such as a fluorine compound.

In a case of the organic thin-film transistor of the present invention, since a gate insulating layer is an organic layer, the latter method of hardening a photosensitive composition containing liquid repellent components is preferable from the viewpoint that the gate insulating layer is not affected by the liquid repellent treatment. In addition, a technique of allowing a base to have a contrast of liquid repellency without using a bank so that the base plays the same role as that of a bank may be used.

[Manufacturing Method]

The TFT of the present invention can be manufactured by forming or providing a gate electrode, a gate insulating layer, a semiconductor layer, a source electrode, a drain electrode, and the like on a substrate according to the above-described method.

When an organic material is used as a material that forms a gate insulating layer or a semiconductor layer, a TFT exhibiting the above-described excellent characteristics can be manufactured while taking advantages of a solution coating method.

[Display Panel]

A display panel may be exemplified as an example of the application of the organic thin-film transistor of the present invention. Examples of the display panel include a liquid crystal panel, an organic EL panel, and an electronic paper panel.

EXAMPLES

Hereinafter, the present invention will be described in detail based on examples, but the present invention is not limited to those examples.

Polymer compounds AP1 to AP27 used in each example and polymer compounds cAP1 to cAP5 for comparison are shown below (the symbol "*" represents a bonding position of each repeating unit). Each of the polymer compounds were synthesized according to the above-described method.

The weight-average molecular weight (Mw) of each polymer compound was measured using gel permeation chromatography (GPC). Further, the compositional ratio (molar ratio) of each polymer compound was calculated by $^1$H-NMR or $^{13}$C-NMR using an NMR determination device (AVANCEIII 400 type, manufactured by Bruker BioSpin K.K.). Further, the description of the compositional ratio corresponds to the description of repeating units shown by the chemical formula. The obtained results are shown below.

| Polymer compound | Repeating units (IA) and (IB) | Compositional ratio (molar ratio) | Weight-average molecular weight |
|---|---|---|---|
| AP1 | 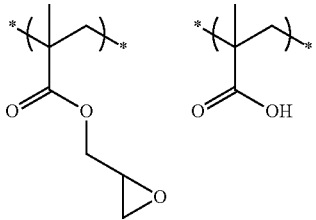 | 15/85 | 15000 |
| AP2 | 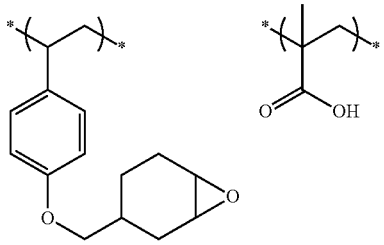 | 15/85 | 18000 |
| AP3 | 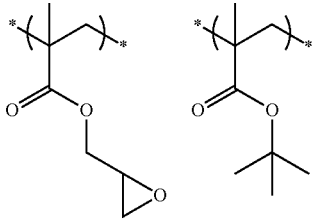 | 15/85 | 14000 |
| AP4 | 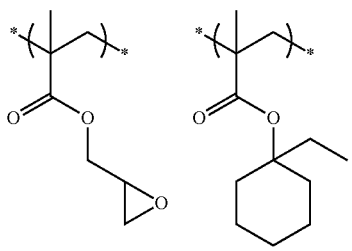 | 15/85 | 16000 |

-continued
| | | | | |
|---|---|---|---|---|
| AP 5 | | | 5/95 | 12000 |
| AP 6 | | | 15/85 | 12000 |
| AP 7 | 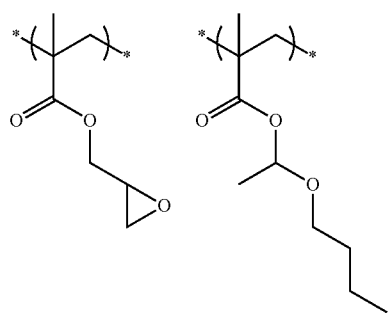 | | 25/75 | 12000 |
| AP8 | 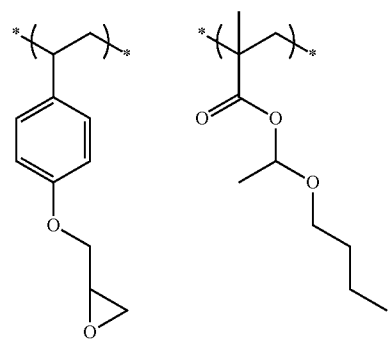 | | 15/85 | 15000 |
| AP9 | 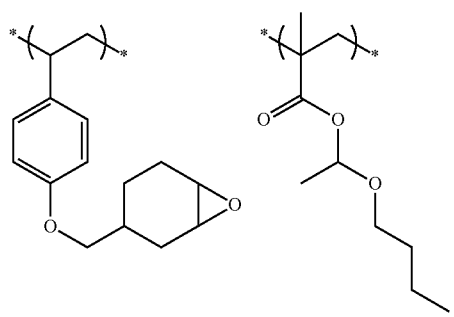 | | 15/85 | 14000 |
| AP10 | 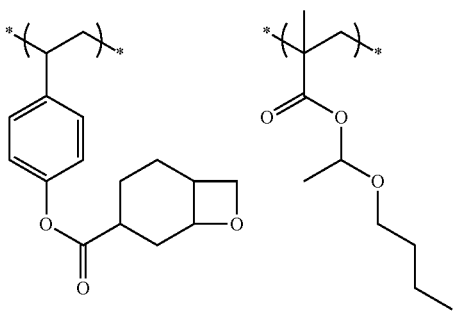 | | 15/85 | 16000 |

| | | | | |
|---|---|---|---|---|
| AP11 | 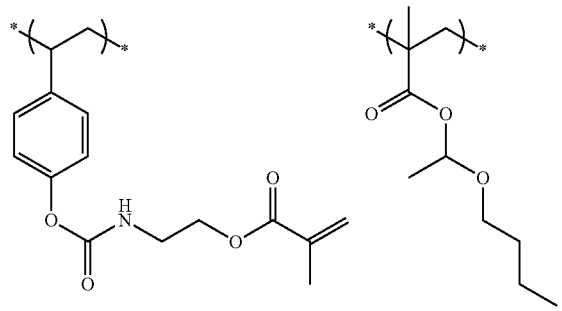 | | 15/85 | 20000 |
| AP12 | 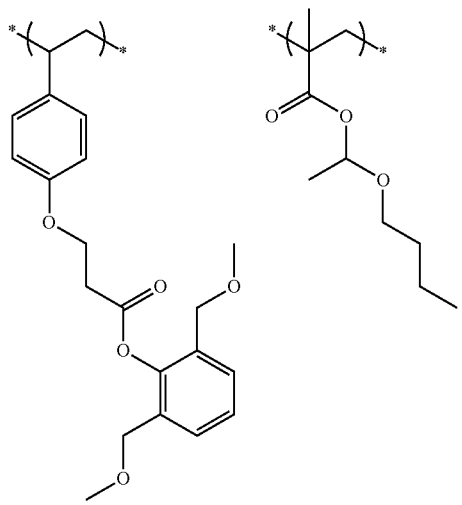 | | 15/85 | 18500 |
| AP13 | 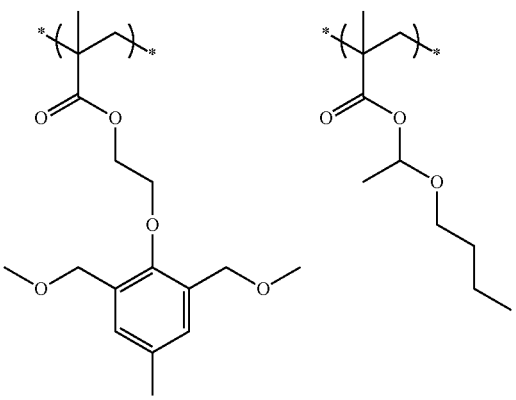 | | 15/85 | 30000 |
| AP14 | 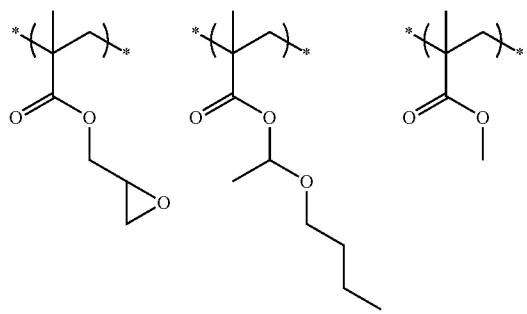 | | 15/60/25 | 18000 |

| | | | |
|---|---|---|---|
| AP15 | 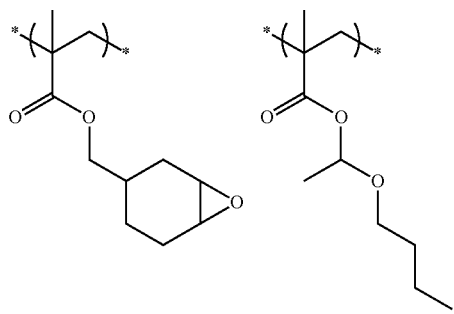 | 15/85 | 20000 |
| AP16 | 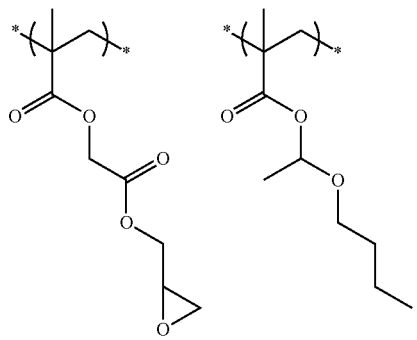 | 15/85 | 15000 |
| AP17 | 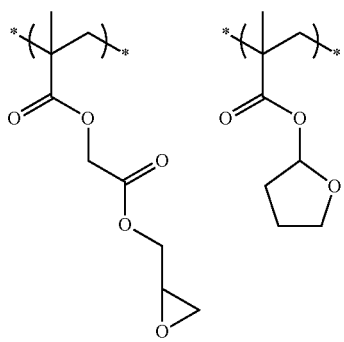 | 15/85 | 25000 |
| AP18 | 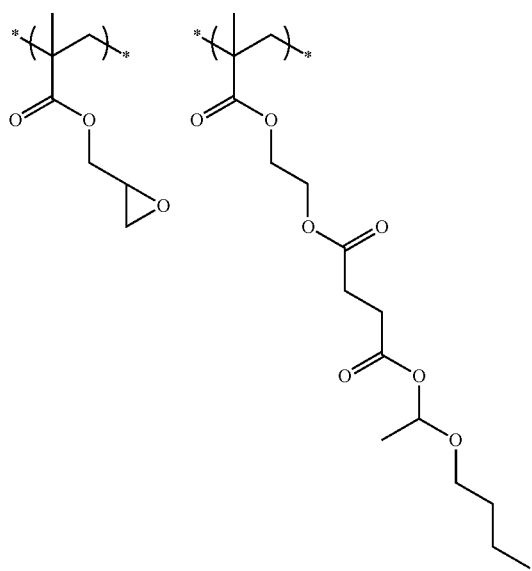 | 15/85 | 19000 |

| | | | |
|---|---|---|---|
| AP19 | 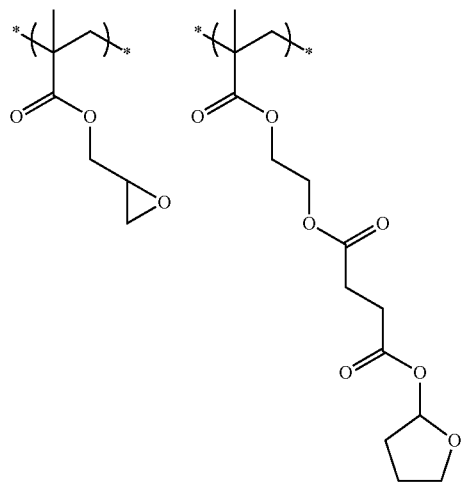 | 15/85 | 14000 |
| AP20 | 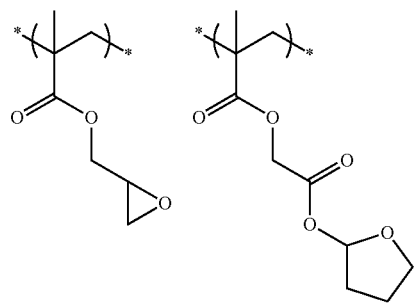 | 15/85 | 26000 |
| AP21 | 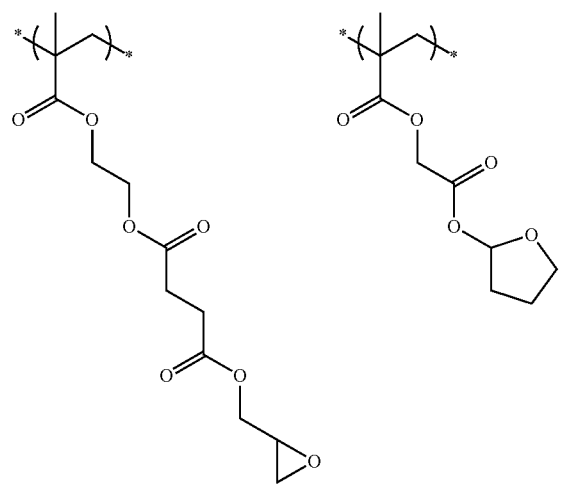 | 15/85 | 22000 |
| AP22 | 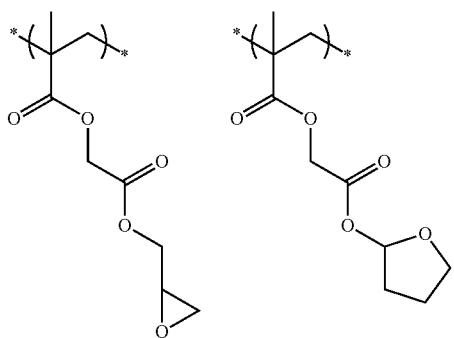 | 15/85 | 19000 |

-continued
| | | | | |
|---|---|---|---|---|
| AP23 | 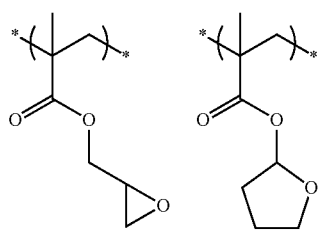 | | 15/85 | 17000 |
| AP24 | 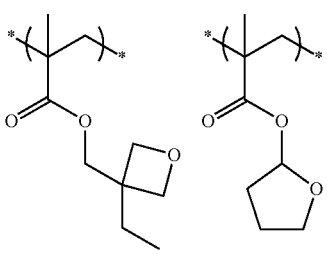 | | 15/85 | 15000 |
| AP25 | 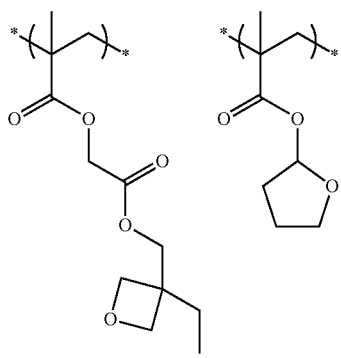 | | 15/85 | 20000 |
| AP26 | 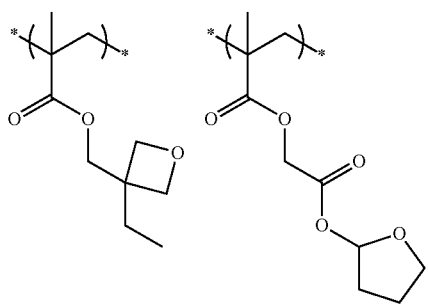 | | 15/85 | 17000 |

-continued
| Polymer compound | Repeating unit | Compositional ratio (molar ratio) | Weight-average molecular weight |
|---|---|---|---|
| AP27 | 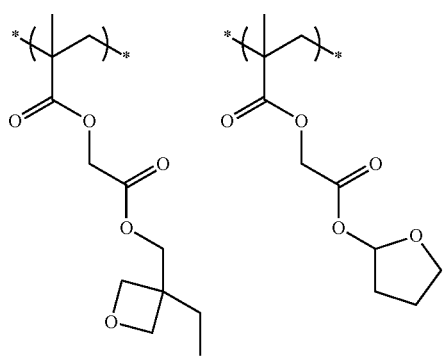 | 15/85 | 18000 |
| Polymer compound | Repeating unit | Compositional ratio (molar ratio) | Weight-average molecular weight |
|---|---|---|---|
| cAP1 | 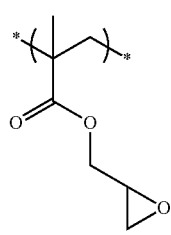 | 100 | 16000 |
| cAP2 | 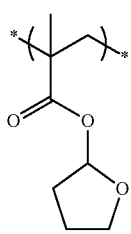 | 100 | 17000 |
| cAP3 | 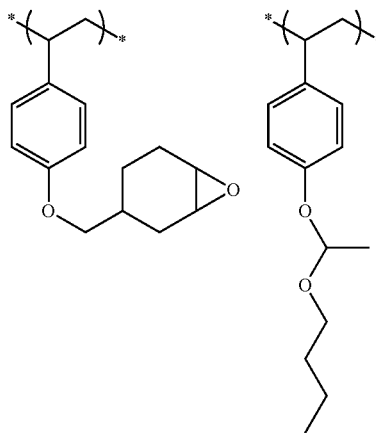 | 15/85 | 18500 |

-continued
| | | | |
|---|---|---|---|
| cAP4 | 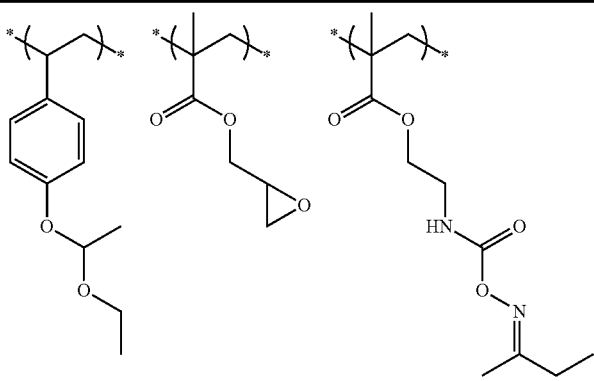 | 50/30/20 | 25500 |
| cAP5 | 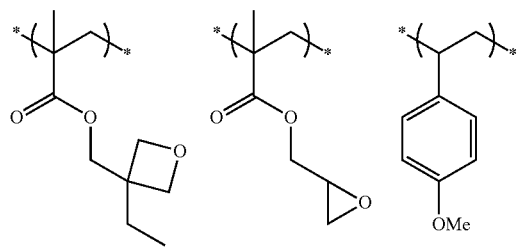<br />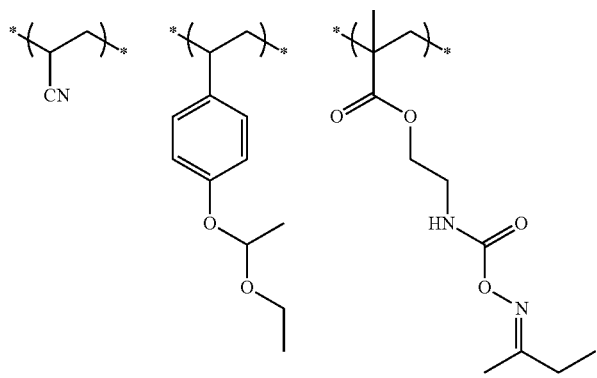 | 25/5/25/<br />20/15/10 | 95000 |
In each example, a compound A6, a compound C16, a compound M3, a compound F2, and poly(3-hexylthiophene) (PHT) were used as organic semiconductors.
In the PHT described below, the symbol "*" represents a bonding position of 3-hexylthiophene.

Compound A6
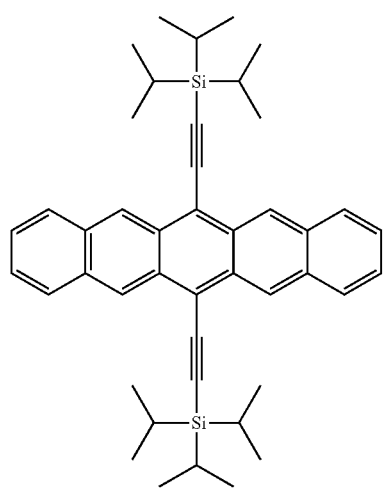
Compound C16
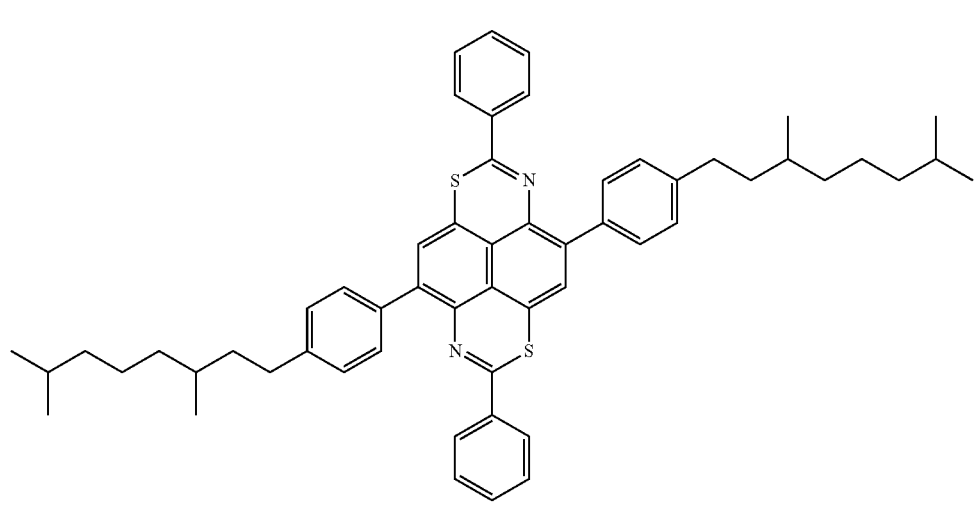
M3
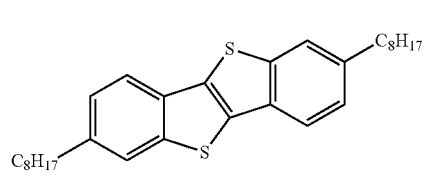
PHT
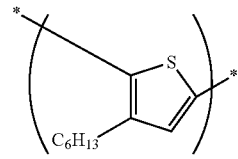
F2
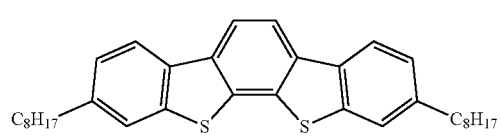

The compounds A6, M3, PHT, and F2 were synthesized in conformity with a known method.

The compound C16 is a compound represented by Formula (C) and was synthesized according to the following method of synthesizing the following compound C1.

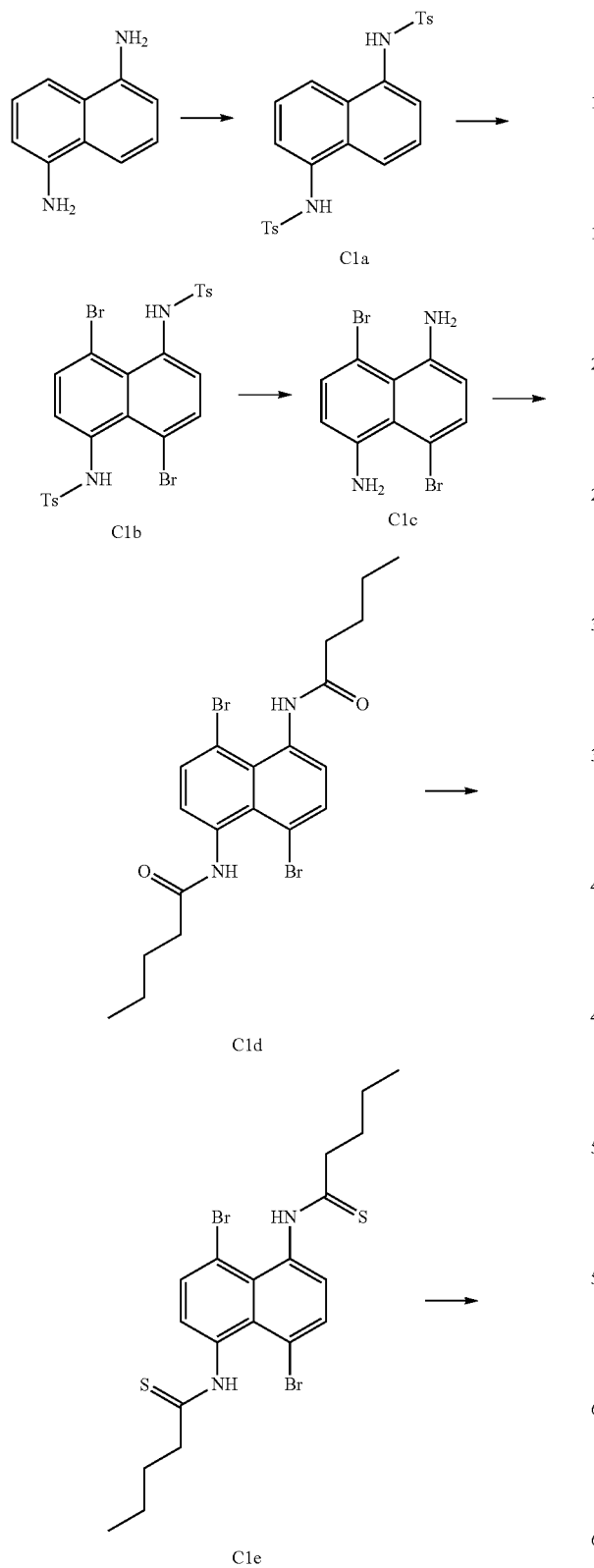

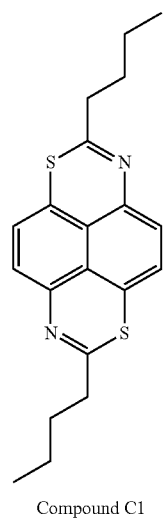

Compound C1

(Synthesis of Compound C1a)

p-toluenesulfonyl chloride (34 g) was slowly added to a pyridine solution (125 mL) of 1,5-diaminonaphthalene (10 g), and the solution was stirred at room temperature for 2 hours. The reaction solution was poured into ice water, and the precipitate was filtered under reduced pressure. The obtained crude crystals were washed with methanol, thereby obtaining a compound C1a (29 g).

(Synthesis of Compound C1b)

A glacial acetic acid solution of the compound C1a (10 g) was heated and stirred at 95° C., and bromine (2 mL) diluted with 10 mL of glacial acetic acid was slowly added dropwise to the solution. The solution was reacted for 10 minutes and filtered after the solution was left to be cooled, thereby obtaining crude crystals in the form of a gray solid. The crude crystals were re-crystallized in nitrobenzene, thereby obtaining a compound C1b (6.8 g).

(Synthesis of Compound C1c)

A concentrated sulfuric acid solution of the compound C1b (5 g) was stirred at room temperature for 24 hours. The reaction solution was poured into ice water, and the precipitated solid was filtered and collected. The solid was dispersed in ice water again, and neutralized in ammonia water, thereby obtaining a compound C1c (0.5 g).

(Synthesis of Compound C1d)

Pentanoyl chloride (valeric acid chloride) (2.6 mL) was added dropwise to a pyridine solution of the compound C1c (2 g) at room temperature, and the solution was stirred for 2 hours. The reaction solution was poured into ice water, and a solid was filtered under reduced pressure. The solid was dispersed in methanol and the solution was stirred for 1 hour, and the solid was filtered, thereby obtaining a compound C1d (1.39 g).

(Synthesis of Compound C1e)

The compound C1d (1.2 g) and a Lawesson's reagent (1.48 g) were added to a mixed solution of THF (360 mL) and toluene (72 mL), and then the solution was stirred for 3 hours while being heated and refluxed. Only THF was removed through evaporation to obtain a toluene solution, and then the solution was stirred at 60° C. for 1 hour. Thereafter, insoluble matters were filtered, thereby obtaining a compound C1e (0.5 g).

(Synthesis of Compound C1)

The compound C1e (0.4 g) and cesium carbonate (1.33 g) were allowed to react with each other in dimethylacetamide at 120° C. for 2 hours. The reaction solution was poured into water, and the precipitate was filtered. The filtered solid was repeatedly re-crystallized in THF, and a target compound C1 (0.12 g) was synthesized. The obtained compound C1 was identified by $^1$H-NMR and a mass spectrum.

Example 1

[Preparation of Bottom-Gate Type OTFT]

A bottom-gate top-contact type OTFT illustrated in FIG. 1B was prepared.

A glass substrate provided with an indium tin oxide (ITO) electrode obtained by forming an ITO film having a film thickness of 100 nm on a glass substrate having a thickness of 0.7 mm was washed with acetone and isopropyl alcohol and then dried. This glass substrate was used as a substrate 6.

An insulating layer-forming composition was prepared when the gate insulating layer 2 was formed. In other words, 5 g of a polymer compound and 0.1 g of an additive (p-toluenesulfonic acid) listed in the following Table 1 or 2 were respectively dissolved in a mixed solvent in which 1-butanol and ethanol were mixed at a volume ratio of 1:1. The solution was filtered through a polytetrafluoroethylene (PTFE) membrane filter having a diameter ($\phi$) of 0.2 µm, thereby preparing an insulating layer-forming composition.

The ITO electrode (gate electrode 5) of the glass substrate 6 was coated with the insulating layer-forming composition according to a spin coating method, the composition was heated at 180° C. for 30 minutes using a blast drier, and then a gate insulating layer 2 having a layer thickness of 300 nm was provided.

Each organic semiconductor listed in Table 1 or 2 was dissolved in 1 mL of toluene as a coating solution forming an organic semiconductor layer, and then a coating solution having a compound concentration of 1% by mass was prepared. The gate insulating layer 2 was coated with the prepared coating solution at 25° C. using a spin coating method (rotation speed: 500 rpm) such that the layer thickness after being dried became 150 nm. Next, the layer was heated at 150° C. for 30 minutes on a hot plate, thereby forming an organic semiconductor layer 1.

Subsequently, as the source electrode 3 and the drain electrode 4 illustrated in FIG. 1B, electrodes (gate width W=100 mm and gate length L=100 µm) formed of chromium and gold arranged in a comb shape were formed using a metal vapor deposition mask according to a vacuum vapor deposition method.

In this manner, OTFTs (sample Nos. 1-1 to 1-31 and c1-1 to c1-5 for comparison) illustrated in FIG. 1B were respectively manufactured.

[Evaluation of Gate Insulating Layer]

The characteristics of gate insulating layers formed using the same method as that of the above-described samples or insulating layers formed using the following method were evaluated. The results thereof are listed in Table 1 or 2.

(Measurement of Volume Resistivity)

A gold electrode having a thickness of 100 nm was formed on each gate insulating layer, formed using the same method as that of the above-described samples, using vacuum vapor deposition. With these samples, the volume resistivity ($\Omega \cdot$cm) was measured using a SOURCE MEASURE UNIT 237 (manufactured by Keithley Instruments).

(Evaluation of Surface Smoothness)

After silicon wafers were spin-coated with insulating layer-forming compositions used for each of the above-described samples, the compositions were pre-baked at 90° C. for 2 minutes using a hot plate and then films having a thickness of 300 nm were formed. Next, the resultants were heated at 130° C. for 1 hour in air, thereby obtaining each sample formed of a silicon wafer on which an insulating layer was formed.

The surface of the insulating layer of each of the obtained sample was observed using an atomic force microscope (AFM) and the surface roughness (arithmetic average roughness Ra) was measured. The measured Ra was evaluated based on the following evaluation standard. The evaluation results of the above-described samples were used as the evaluation results of the gate insulating layer of an OTFT. In the present test, the evaluation result is required to be A, A$^-$, B, or B$^-$. Among these, A or A$^-$ is preferable and A is more preferable.

A: 0.5 nm or less
A$^-$: greater than 0.5 nm and 0.75 nm or less
B: greater than 0.75 nm and 1.0 nm or less
B$^-$: greater than 1.0 nm and 1.25 nm or less
C: greater than 1.25 nm and 1.5 nm or less
D: greater than 1.5 nm (Evaluation of Solvent Resistance)

Glass substrates on which gate insulating layers were formed were immersed in toluene for 12 hours and the layer thicknesses of gate insulating layers before and after the immersion were measured using the same method as that for the above-described samples. The film thickness change rate before and after the immersion was calculated according to the following equation and evaluated based on the following evaluation standard. In the present test, the evaluation result is required to be A, A$^-$, B, or B$^-$. Among these, A or A$^-$ is preferable and A is more preferable.

Film thickness change rate (%) before and after immersion=film thickness (µm) after immersion/film thickness (µm) before immersion×100

A: greater than 90% and 100% or less
A$^-$: greater than 85% and 90% or less
B: greater than 80% and 85% or less
B$^-$: greater than 75% and 80% or less
C: greater than 70% and 75% or less
C$-$: greater than 60% and 70% or less
D: 60% or less

[Evaluation of OTFT]

The characteristics of each of the prepared OTFTs were evaluated as follows. The results thereof are listed in Table 1 or 2.

(Evaluation of Carrier Mobility µ)

A voltage of −40 V was applied to a space between the source electrode 3 and the drain electrode 4 of each OTFT so that a gate voltage Vg was changed within a range of 40 V to −40 V, and a carrier mobility µ (cm$^2$/Vs) was calculated using the following equation representing a drain current Id. The evaluation was performed (noted as "mobility" in Table 1) based on the following evaluation standard. In the present test, the evaluation result is required to be A, A$^-$, B, or B$^-$. Among these, A or A$^-$ is preferable and A is more preferable.

$$Id=(w/2L)\mu Ci(Vg-Vth)^2$$

In the equation, L represents the gate length, w represents the gate width, Ci represents the capacity per unit area of the gate insulating layer 2, Vg represents the gate voltage, and Vth represents the threshold voltage.

A: greater than 0.7 cm$^2$/Vs and 0.8 cm$^2$/Vs or less
A$^-$: greater than 0.5 cm$^2$/Vs and 0.7 cm$^2$/Vs or less
B: greater than 0.3 cm$^2$/Vs and 0.5 cm$^2$/Vs or less
B$^-$: greater than 0.1 cm$^2$/Vs and 0.3 cm$^2$/Vs or less C: greater than 0.05 cm$^2$/Vs and 0.1 cm$^2$/Vs or less
C$^-$: greater than 0.01 cm$^2$/Vs and 0.05 cm$^2$/Vs or less
D: greater than 0.001 cm$^2$/Vs and 0.01 cm$^2$/Vs or less (Measurement of On/Off Ratio)

The expression (maximum value of |Id|)/(minimum value of |Id|) was set as the on/off ratio when the voltage applied to the space between the source electrode 3 and the drain electrode 4 of each OTFT was fixed to −40 V and the gate voltage Vg was changed from 40 V to −40 V. In the present test, the evaluation result is required to be A, A$^-$, B, or B$^-$. Among these, A or A$^-$ is preferable and A is more preferable.

A: $1 \times 10^7$ or greater
A$^-$: $5 \times 10^6$ or greater and less than $1 \times 10^7$
B: $1 \times 10^6$ or greater and less than $5 \times 10^6$
B$^-$: $5 \times 10^5$ or greater and less than $1 \times 10^6$
C: $1 \times 10^5$ or greater and less than $5 \times 10^5$
C$^-$: $1 \times 10^4$ or greater and less than $1 \times 10^5$
D: less than $1 \times 10^4$

TABLE 1

| Sample No. | Polymer compound | Organic semiconductor | Volume resistivity (Ω·cm) | Surface smoothness | Solvent resistance | Mobility | on/off ratio | Remark |
|---|---|---|---|---|---|---|---|---|
| 1-1 | AP1 | A6 | $1 \times 10^{16}$ | B$^-$ | B$^-$ | B$^-$ | B$^-$ | Present invention |
| 1-2 | AP2 | A6 | $1 \times 10^{16}$ | B$^-$ | B$^-$ | B$^-$ | B$^-$ | Present invention |
| 1-3 | AP3 | A6 | $2 \times 10^{16}$ | B | B | B$^-$ | B$^-$ | Present invention |
| 1-4 | AP4 | A6 | $2 \times 10^{16}$ | B | B | B$^-$ | B$^-$ | Present invention |
| 1-5 | AP5 | A6 | $3 \times 10^{16}$ | B | B | B | B | Present invention |
| 1-6 | AP6 | A6 | $5 \times 10^{16}$ | A$^-$ | A$^-$ | A$^-$ | A$^-$ | Present invention |
| 1-7 | AP7 | A6 | $3 \times 10^{16}$ | B | B | B | B | Present invention |
| 1-8 | AP8 | A6 | $3 \times 10^{16}$ | A$^-$ | A$^-$ | A$^-$ | A$^-$ | Present invention |
| 1-9 | AP9 | A6 | $3 \times 10^{16}$ | B | B | B | B | Present invention |
| 1-10 | AP10 | A6 | $3 \times 10^{16}$ | B | B | B | B | Present invention |
| 1-11 | AP11 | A6 | $1 \times 10^{16}$ | B | B$^-$ | B$^-$ | B$^-$ | Present invention |
| 1-12 | AP12 | A6 | $1 \times 10^{16}$ | B | B$^-$ | B$^-$ | B$^-$ | Present invention |
| 1-13 | AP13 | A6 | $1 \times 10^{16}$ | B | B$^-$ | B$^-$ | B$^-$ | Present invention |
| 1-14 | AP14 | A6 | $6 \times 10^{16}$ | A$^-$ | A$^-$ | A$^-$ | A$^-$ | Present invention |
| 1-15 | AP15 | A6 | $3 \times 10^{16}$ | B | B | B | B | Present invention |
| 1-16 | AP16 | A6 | $3 \times 10^{16}$ | B | B | B | B | Present invention |
| 1-17 | AP17 | A6 | $6 \times 10^{16}$ | A$^-$ | A$^-$ | A$^-$ | A$^-$ | Present invention |
| 1-18 | AP18 | A6 | $6 \times 10^{16}$ | A$^-$ | A$^-$ | A$^-$ | A$^-$ | Present invention |

TABLE 2

| Sample No. | Polymer compound | Organic semiconductor | Volume resistivity (Ω·cm) | Surface smoothness | Solvent resistance | Mobility | on/off ratio | Remark |
|---|---|---|---|---|---|---|---|---|
| 1-19 | AP19 | A6 | $6 \times 10^{16}$ | A$^-$ | A$^-$ | A$^-$ | A$^-$ | Present invention |
| 1-20 | AP20 | A6 | $6 \times 10^{16}$ | A$^-$ | A$^-$ | A$^-$ | A$^-$ | Present invention |
| 1-21 | AP21 | A6 | $3 \times 10^{16}$ | B | B | B | B | Present invention |
| 1-22 | AP22 | A6 | $3 \times 10^{16}$ | B | B | B | B | Present invention |
| 1-23 | AP23 | A6 | $8 \times 10^{16}$ | A | A | A$^-$ | A$^-$ | Present invention |
| 1-24 | AP24 | A6 | $6 \times 10^{16}$ | B | A$^-$ | A$^-$ | A$^-$ | Present invention |

TABLE 2-continued

|  |  |  | Evaluation of gate insulating layer | | | Evaluation of OTFT | | |
|---|---|---|---|---|---|---|---|---|
| Sample No. | Polymer compound | Organic semiconductor | Volume resistivity (Ω · cm) | Surface smoothness | Solvent resistance | Mobility | on/off ratio | Remark |
| 1-25 | AP25 | A6 | $3 \times 10^{16}$ | B | B | B | B | Present invention |
| 1-26 | AP26 | A6 | $3 \times 10^{16}$ | B | B | B | B | Present invention |
| 1-27 | AP27 | A6 | $3 \times 10^{16}$ | B | B | B | B | Present invention |
| 1-28 | AP23 | C16 | $8 \times 10^{16}$ | A | A | A | A | Present invention |
| 1-29 | AP23 | M3 | $8 \times 10^{16}$ | A | A | $A^-$ | $A^-$ | Present invention |
| 1-30 | AP23 | PHT | $8 \times 10^{16}$ | A | A | $A^-$ | $A^-$ | Present invention |
| 1-31 | AP23 | F2 | $8 \times 10^{16}$ | A | A | $A^-$ | $A^-$ | Present invention |
| c1-1 | cAP1 | A6 | $1 \times 10^{15}$ | C | D | D | D | Comparative example |
| c1-2 | cAP2 | A6 | $1 \times 10^{15}$ | C | D | D | D | Comparative example |
| c1-3 | cAP3 | A6 | $2 \times 10^{15}$ | C | $C^-$ | C | $C^-$ | Comparative example |
| c1-4 | cAP4 | A6 | $3 \times 10^{15}$ | C | $C^-$ | C | $C^-$ | Comparative example |
| c1-5 | cAP5 | A6 | $2 \times 10^{15}$ | C | $C^-$ | C | $C^-$ | Comparative example |

As listed in Tables 1 and 2, when polymer compounds AP1 to AP27 are crosslinked using insulating layer-forming compositions containing the polymer compounds having the repeating unit (IA) represented by Formula (IA) and the repeating unit (IB) represented by Formula (IB), gate insulating layers 2 with excellent surface smoothness were able to be formed. Further, the gate insulating layers 2 had high volume resistivity and exhibited excellent insulating properties and solvent resistance.

The gate insulating layers 2 formed using the insulating layer-forming compositions of the present invention as described above contained hardened products of the above-described polymer compounds and had surface smoothness, volume resistivity (insulating properties), and solvent resistance. Therefore, all OTFTs of the present invention provided by making the gate insulating layers 2 and the semiconductor layers adjacent to each other had high carrier mobilities μ and on/off ratios and excellent performance.

Meanwhile, in all cases of sample Nos. c1-1 and c1-2 for which polymer compounds having only the repeating unit (IA) were used and sample Nos. c1-3 to c1-5 for which polymer compounds having repeating units that generate a phenolic hydroxyl group were used in place of the repeating unit (IB), efficiency of the crosslinking reaction was low and the surface smoothness of the gate insulating layers, the insulating properties, and solvent resistance were all inferior. Therefore, all these OTFTs had insufficient carrier mobilities and TFT characteristics of on/off ratios.

Moreover, it was understood that polymer compounds having the repeating unit (IA) and the repeating unit (IB) were effective in improving the performance of OTFTs without using a crosslinking agent because the repeating units were able to be crosslinked to form a crosslinked product.

In regard to the linking group $L^{1a}$ of the repeating unit (IA), there was a tendency that a —C(=O)—O-group (repeating unit (IA-1)) was more effective in improving the performance of an OTFT than an aromatic ring group (repeating unit (IA-2)).

Further, in regard to the crosslinkable group X of the repeating unit (IA), there was a tendency of the effect of improving the performance of an OTFT was increased in the descending order of a vinyl group, a methylol group, an oxetanyl group, and an epoxy group. In addition, it was understood that the crosslinkable group X was particularly excellent when glycidyl group was used together with the linking group $L^{2a}$ among epoxy groups.

In regard to $Y^B$ of the repeating unit (IB), in a case where $Y^B$ represents a decomposable group, heat stability of a polymer composition was further improved and the surface smoothness of a gate insulating layer to be formed was also improved. As a result, the effect of increasing the mobility μ of an OTFT was high. It was understood that the effect of improving the surface smoothness of the gate insulating layer and the effect of increasing the mobility μ of an OTFT were excellent when the decomposable group $Y^B$ represents carboxylic acid acetal other than a tertiary alkyl group and a tertiary cycloalkyl group.

Further, as the decomposable group $Y^B$, it was understood that a tetrahydrofuranyl group (repeating unit (IB-2)) was particularly excellent among carboxylic acid acetals, compared to an alkoxymethyl group (repeating unit (IB-1)).

Example 2

[Manufacture and Evaluation of Bottom-Gate Type OTFT in which Organic Semiconductor was Changed]

In Example 2, a bottom-gate type OTFT was manufactured using an organic semiconductor other than the above-described organic semiconductors, and the characteristics thereof were evaluated.

In other words, OTFTs were respectively manufactured in the same manner as in Example 1 except that A26, A27, C1, C4, C7, D1, E2, F5, F10, G12, G14, H10, H11, J2, J3, K2, K3, L2, L5, L6, L8, L9, L15, M8, N4, P3, Q3, R1, S1, or T1 described above was used as the organic semiconductor in Example 1.

In each of the manufactured OTFTs, the volume resistivity, the surface smoothness, the solvent resistance, the carrier mobility μ, and the on/off ratio were evaluated in the same manner as those in Example 1. As a result, all OTFTs had excellent characteristics similar to Example 1.

The present invention has been described with reference to the embodiments, but the detailed description of the invention is not limited unless otherwise noted and the present invention should be broadly interpreted without departing from the spirit and the scope described in the aspects of the invention.

The present application claims priority based on JP2014-097186 filed in Japan on May 8, 2014 and the contents of which are incorporated herein by reference.

EXPLANATION OF REFERENCES

1: semiconductor layer (organic semiconductor layer)
2: gate insulating layer
3: source electrode
4: drain electrode
5: gate electrode
6: substrate

What is claimed is:

1. A thin-film transistor comprising, on a substrate:
a gate electrode;
a semiconductor layer;
a gate insulating layer provided between the gate electrode and the semiconductor layer; and
a source electrode and a drain electrode provided in contact with the semiconductor layer and connected to each other through the semiconductor layer,
wherein the gate insulating layer is formed of a cross-linked product of a polymer compound that has a repeating unit (IA) represented by the following Formula (IA) and a repeating unit (IB) represented by the following Formula (IB), and the content of the repeating unit (IA) is in a range of 10 to 20% by mole with respect to all repeating units of the polymer compound,

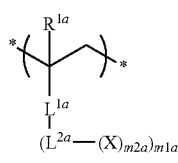

Formula (IA)

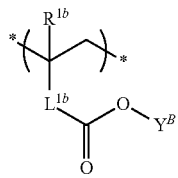

Formula (IB)

in Formula (IA), $R^{1a}$ represents a hydrogen atom, a halogen atom, or an alkyl group; $L^{1a}$ and $L^{2a}$ each independently represent a single bond or a linking group; X represents an epoxy group, an oxetanyl group, a hydroxymethyl group, an alkoxymethyl group, a (meth)acryloyl group, a styryl group, or a vinyl group; m2a represents an integer of 1 to 5 and m2a X's may be the same as or different from each other in a case where m2a represents 2 or greater; and m1a represents an integer of 1 to 5 and m1a (-$L^{2a}$-(X)m2a)'s may be the same as or different from each other in a case where m1a represents 2 or greater, and in Formula (IB), $R^{1b}$ represents a hydrogen atom, a halogen atom, or an alkyl group; $L^{1b}$ represents a single bond or a linking group; $Y^B$ represents a group which is capable of forming a carboxylic acid acetal group together with a carboxy group, a group which is capable of forming tertiary alkyl ester together with a carboxy group, or a group which is capable of forming a tertiary alkyl carbonate group together with a carboxy group; and the symbol "*" represents a bonding position of the repeating units.

2. The thin-film transistor according to claim 1,
wherein the repeating unit (IA) is a repeating unit (IA-1) represented by the following Formula (IA-1),

Formula (IA-1)

in Formula (IA-1), $R^{1a}$ represents a hydrogen atom, a halogen atom, or an alkyl group; $L^{3a}$ represents a single bond or a linking group; X represents an epoxy group, an oxetanyl group, a hydroxymethyl group, an alkoxymethyl group, a (meth)acryloyl group, a styryl group, or a vinyl group; m3a represents an integer of 1 to 5 and m3a X's may be the same as or different from each other in a case where m3a represents 2 or greater; and the symbol "*" represents a bonding position of the repeating units.

3. The thin-film transistor according to claim 1,
wherein the repeating unit (IA) is a repeating unit (IA-2) represented by the following Formula (IA-2),

Formula (IA-2)

in Formula (IA-2), $R^{1a}$ represents a hydrogen atom, a halogen atom, or an alkyl group; $L^{4a}$ represents a single bond or a linking group; X represents an epoxy group, an oxetanyl group, a hydroxymethyl group, an alkoxymethyl group, a (meth)acryloyl group, a styryl group, or a vinyl group; m5a represents an integer of 1 to 5 and m5a X's may be the same as or different from each other in a case where m5a represents 2 or greater; and m4a represents an integer of 1 to 5 and m4a (—O-$L^{4a}$-(X)m5a)'s may be the same as or different from each other in a case where m4a represents 2 or greater; and the symbol "*" represents a bonding position of the repeating units.

4. The thin-film transistor according to claim 1,
wherein X represents an epoxy group or an oxetanyl group.

5. The thin-film transistor according to claim 1, wherein the repeating unit (IB) is a repeating unit (IB-1) represented by the following Formula (IB-1), Formula (IB-1)

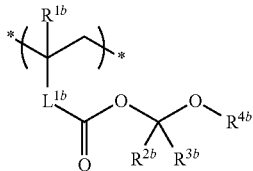

in Formula (IB-1), $R^{1b}$ represents a hydrogen atom, a halogen atom, or an alkyl group; $L^{1b}$ represents a single bond or a linking group; $R^{2b}$ and $R^{4b}$ each independently represent a monovalent organic group; $R^{3b}$ represents a hydrogen atom or a monovalent organic group; and the symbol "*" represents a bonding position of the repeating units.

6. The thin-film transistor according to claim 1, wherein the repeating unit (IB) is a repeating unit (IB-2) represented by the following Formula (IB-2);

Formula (IB-2)

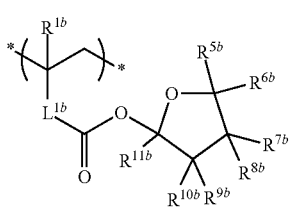

in Formula (IB-2), $R^{1b}$ represents a hydrogen atom, a halogen atom, or an alkyl group; $L^{1b}$ represents a single bond or a linking group; $R^{5b}$ to $R^{11b}$ each independently represent a hydrogen atom or a monovalent organic group; and the symbol "*" represents a bonding position of the repeating units.

7. The thin-film transistor according to claim 1, wherein $L^{1b}$ represents a single bond.

8. The thin-film transistor according to claim 1, wherein the semiconductor layer contains an organic semiconductor.

9. An insulating layer-forming composition which is used for forming a gate insulating layer of a thin-film transistor, the composition comprising:

a polymer compound that has a repeating unit (IA) represented by the following Formula (IA) and a repeating unit (IB) represented by the following Formula (IB), wherein the content of the repeating unit (IA) is in a range of 10 to 20% by mole with respect to all repeating units of the polymer compound, Formula (IA)

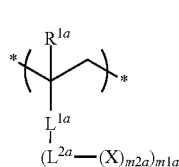

Formula (IB)

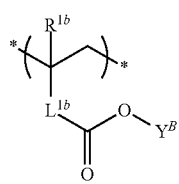

in Formula (IA), $R^{1a}$ represents a hydrogen atom, a halogen atom, or an alkyl group; $L^{1a}$ and $L^{2a}$ each independently represent a single bond or a linking group; X represents an epoxy group, an oxetanyl group, a hydroxymethyl group, an alkoxymethyl group, a (meth)acryloyl group, a styryl group, or a vinyl group; m2a represents an integer of 1 to 5 and m2a X's may be the same as or different from each other in a case where m2a represents 2 or greater; and m1a represents an integer of 1 to 5 and m1a (-$L^{2a}$-(X)m2a)'s may be the same as or different from each other in a case where m1a represents 2 or greater, and in Formula (IB), $R^{1b}$ represents a hydrogen atom, a halogen atom, or an alkyl group; $L^{1b}$ represents a single bond or a linking group; $Y^B$ represents a group which is capable of forming a carboxylic acid acetal group together with a carboxy group, a group which is capable of forming tertiary alkyl ester together with a carboxy group, or a group which is capable of forming a tertiary alkyl carbonate group together with a carboxy group; and the symbol "*" represents a bonding position of the repeating units.

* * * * *